(12) United States Patent
Kurokawa

(10) Patent No.: US 9,785,566 B2
(45) Date of Patent: Oct. 10, 2017

(54) SEMICONDUCTOR DEVICE, COMPUTER, AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/354,135

(22) Filed: Nov. 17, 2016

(65) Prior Publication Data

US 2017/0139835 A1    May 18, 2017

(30) Foreign Application Priority Data

Nov. 18, 2015    (JP) ................................. 2015-225814

(51) Int. Cl.
*G11C 16/04* (2006.01)
*G06F 12/0875* (2016.01)
(Continued)

(52) U.S. Cl.
CPC .......... *G06F 12/0875* (2013.01); *H01L 21/82* (2013.01); *H01L 24/85* (2013.01);
(Continued)

(58) Field of Classification Search
CPC ................................. G11C 16/04; H01L 21/82
(Continued)

(56) References Cited

U.S. PATENT DOCUMENTS

| 5,705,807 A | 1/1998 | Throngnumchai |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Harry W Byrne
(74) *Attorney, Agent, or Firm* — Fish & Richardson P.C.

(57) ABSTRACT

A novel semiconductor device, a semiconductor device capable of operating at high speed, or a semiconductor device with low power consumption is provided. The semiconductor device includes a memory cell, a first circuit, a second circuit, and a wiring. The memory cell has a function of storing first data and has a function of supplying a first current corresponding to the first data to the wiring. The first circuit has a function of supplying a second current corresponding to second data to the wiring input from the outside. The second circuit has a function of performing correction of a current flowing in the wiring in the case where a value of the first current and a value of the second current are different from each other. The second circuit has a function of generating a signal including information on whether the correction is performed or not.

8 Claims, 37 Drawing Sheets

(51) Int. Cl.
  *H01L 29/786* (2006.01)
  *H01L 27/12* (2006.01)
  *H01L 21/82* (2006.01)
  *H01L 23/00* (2006.01)

(52) U.S. Cl.
  CPC ...... *H01L 27/1225* (2013.01); *H01L 27/1255* (2013.01); *H01L 29/7869* (2013.01); *G06F 2212/452* (2013.01)

(58) Field of Classification Search
  USPC ........................................ 365/185.01–185.33
  See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,046,282 B1 | 5/2006 | Zhang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,573,742 B2* | 8/2009 | Ajika .................. G11C 11/5671 365/185.05 |
| 7,674,650 B2 | 3/2010 | Akimoto et al. |
| 7,732,819 B2 | 6/2010 | Akimoto et al. |
| 8,391,060 B2* | 3/2013 | Kato .................. G11C 16/0441 365/185.01 |
| 8,482,974 B2 | 7/2013 | Saito et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0230251 A1* | 10/2007 | Ajika .................. G11C 11/5671 365/185.23 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0133706 A1 | 6/2011 | Takahashi et al. |
| 2011/0176038 A1 | 7/2011 | Kurokawa et al. |
| 2011/0198483 A1 | 8/2011 | Kurokawa |
| 2012/0014181 A1* | 1/2012 | Ajika .................. G11C 11/5671 365/185.11 |
| 2013/0016035 A1 | 1/2013 | Ikeda |
| 2013/0222584 A1 | 8/2013 | Aoki et al. |
| 2015/0332568 A1 | 11/2015 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-032668 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2011-187950 A | 9/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.
Chern.H et al., "An Analytical Model for the Above-Threshold Characteristics of Polusilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back. Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advance Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalling Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in The In2O3 and Sc2O3-A2O3-Bo Systems [A; Fe, Ga, or Al; B; Mg; Mn; Fe; Ni; Cu;or Zn] at Temperatures Over 1000° C.", Journal of Solid States Chemistry, 1995, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical REview. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers. May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide Tfts and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007. vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papaers, May 20, 2008. vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

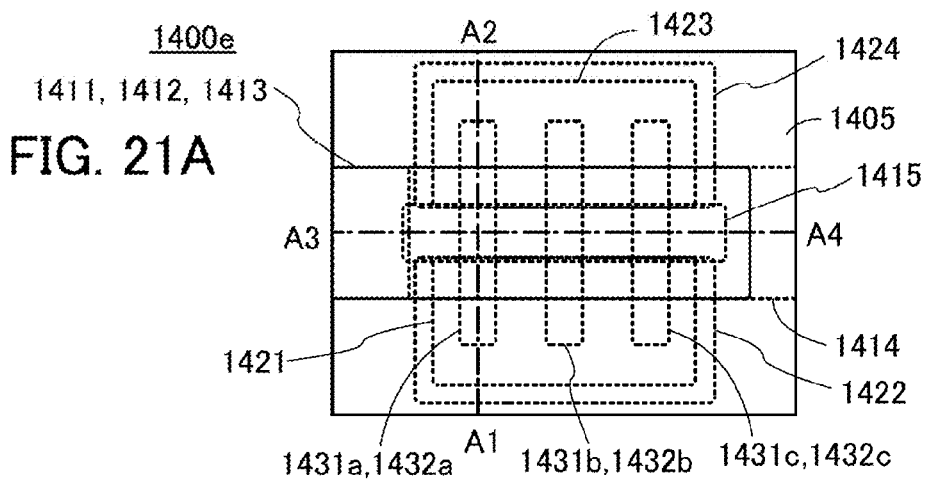
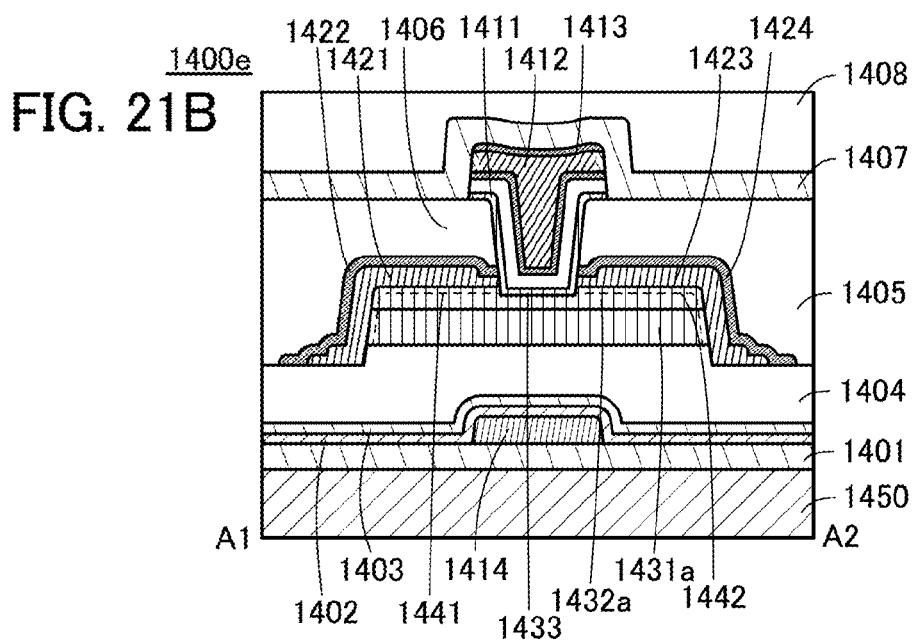
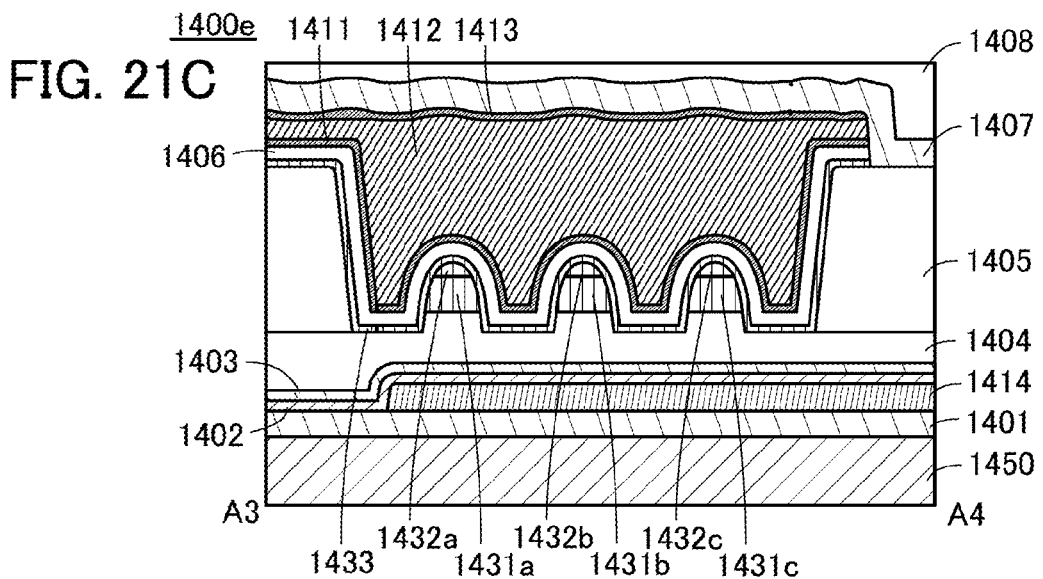

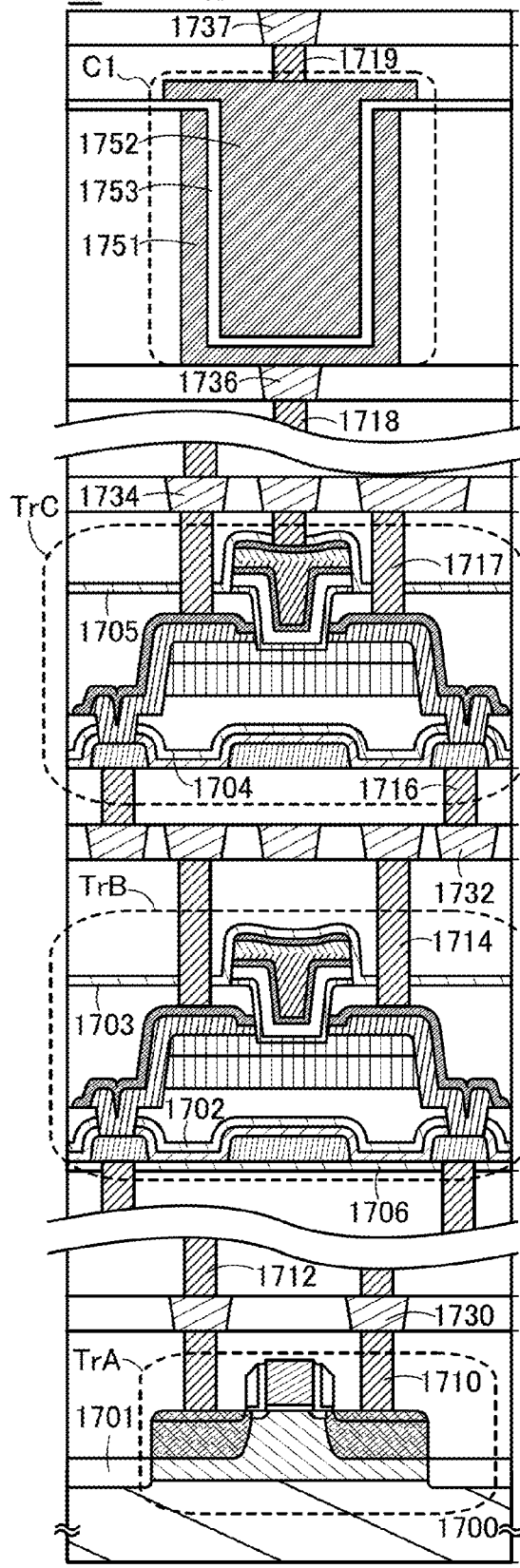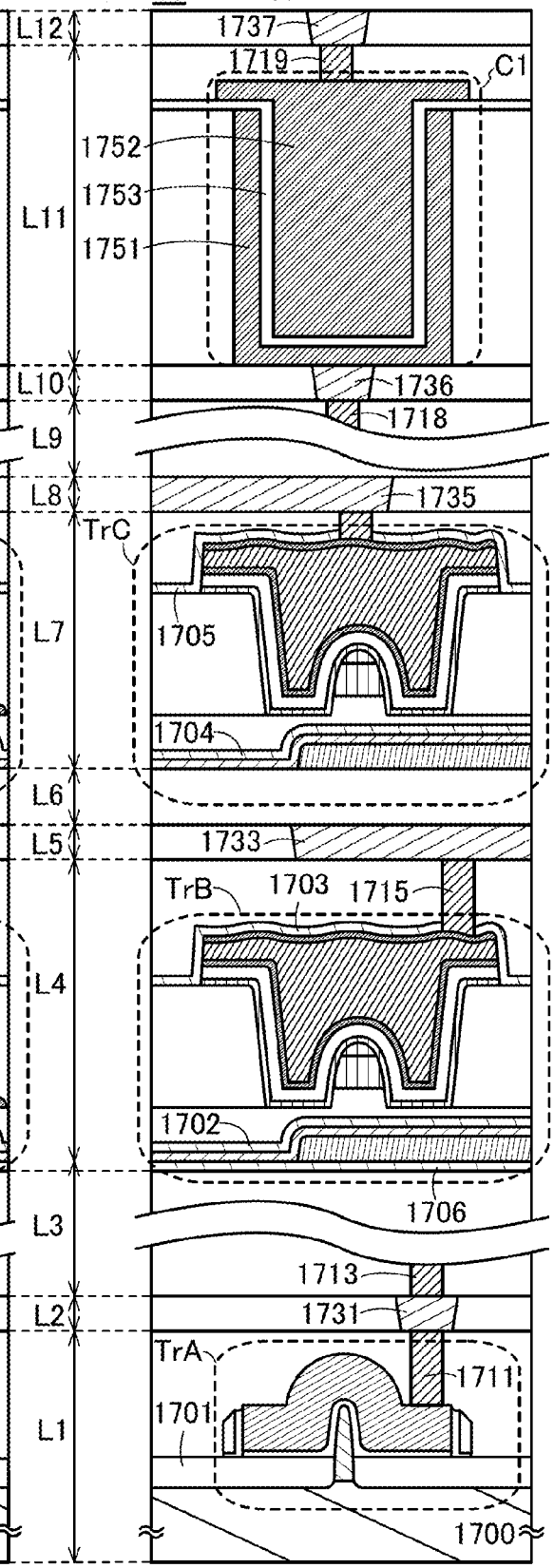

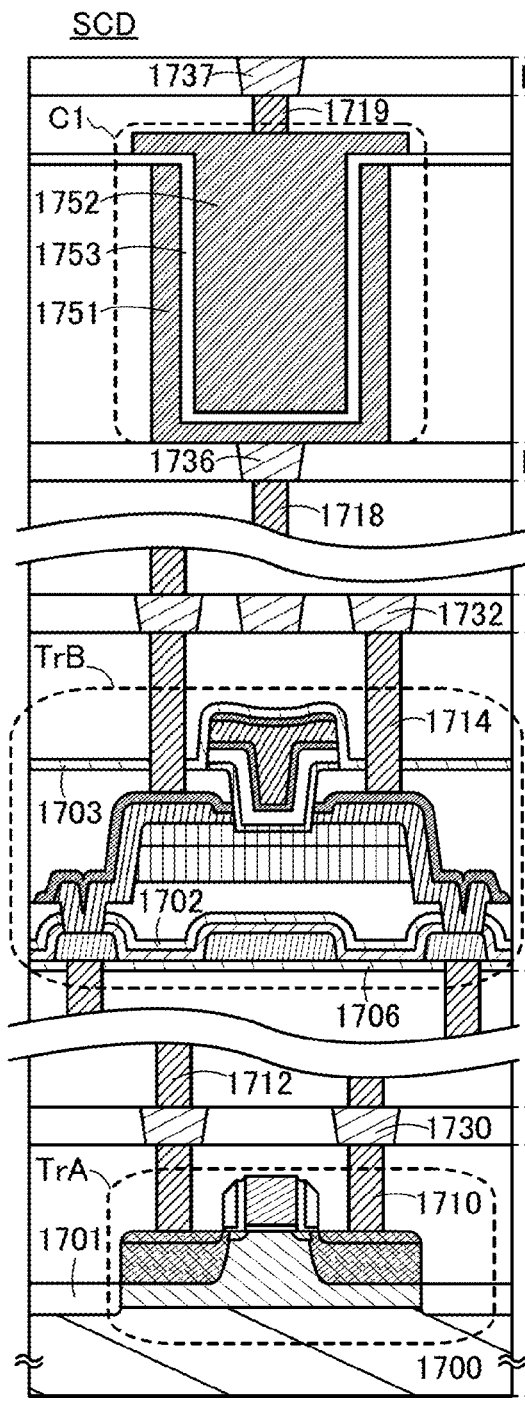
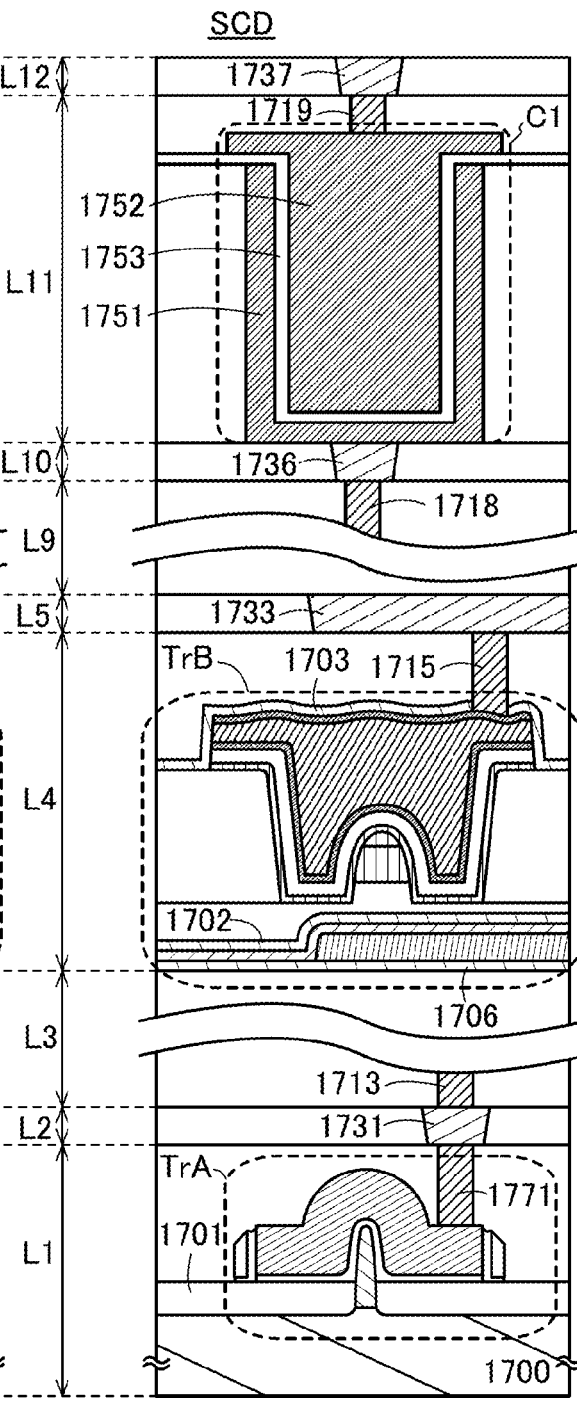

TrA

TrA

SEMICONDUCTOR DEVICE, COMPUTER, AND ELECTRONIC DEVICE

BACKGROUND OF THE INVENTION

1. Field of the Invention

One embodiment of the present invention relates to a semiconductor device, a computer, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. One embodiment of the present invention relates to a semiconductor device, a display device, a light-emitting device, a power storage device, a memory device, an imaging device, a driving method thereof, or a manufacturing method thereof.

2. Description of the Related Art

For memory devices, an increase in speed and capacity, a reduction in manufacturing cost and power consumption, and the like are required, and thus memory devices having a variety of structures have been proposed. For example, in Patent Document 1, an extremely low off-state current, which is a characteristic of a transistor including an oxide semiconductor, is focused on, and a technique with which the transistor is used for a memory device is disclosed.

As one of memory devices included in a computer, a cache memory is widely known. A cache memory operates at a higher speed than a main memory device. A copy of part of data in the main memory device is stored in the cache memory. When a computer includes a cache memory, the time for access to data is shortened, and thus the computer can operate at a higher speed.

REFERENCE

Patent Document

[Patent Document 1] Japanese Published Patent Application No. 2011-187950

SUMMARY OF THE INVENTION

An object of one embodiment of the present invention is to provide a novel semiconductor device. Another object of one embodiment of the present invention is to provide a semiconductor device capable of operating at a high speed. Another object of one embodiment of the present invention is to provide a semiconductor device with low power consumption. Another object of one embodiment of the present invention is to provide a semiconductor device with a small area. Another object of one embodiment of the present invention is to provide a highly reliable semiconductor device.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

A semiconductor device of one embodiment of the present invention includes a memory cell, a first circuit, a second circuit, and a wiring. The memory cell has a function of storing first data. The memory cell has a function of supplying a first current corresponding to the first data to the wiring. The first circuit has a function of supplying a second current corresponding to second data to the wiring input from the outside. The second circuit has a function of performing correction of a current flowing in the wiring in the case where a value of the first current and a value of the second current are different from each other. The second circuit has a function of generating a signal including information on whether the correction is performed or not.

In the semiconductor device of one embodiment of the present invention, the correction of the current may be performed by generation of a third current supplied from the second circuit to the wiring or a fourth current supplied from the wiring to the second circuit, and each of the third current and the fourth current may be a current corresponding to a difference between the first current and the second current.

The semiconductor device of one embodiment of the present invention may have a function of writing the second data to the memory cell by supply of the second current to the memory cell.

In the semiconductor device of one embodiment of the present invention, the memory cell may include a first transistor, a second transistor, a third transistor, and a capacitor. A gate of the first transistor may be electrically connected to a first electrode of the capacitor and one of a source and a drain of the second transistor. One of a source and a drain of the first transistor may be electrically connected to a second electrode of the capacitor and one of a source and a drain of the third transistor. The second transistor may include an oxide semiconductor in a channel formation region.

A computer of one embodiment of the present invention includes a cache memory including any of the above semiconductor devices and a control circuit. The cache memory includes a memory region including a plurality of memory cells. The memory region has a function of storing tag data. The control circuit has a function of outputting an address signal to the cache memory. The tag data corresponds to a collection of the first data stored in the memory region. The address signal corresponds to a collection of the second data.

An electronic device of one embodiment of the present invention includes any of the above semiconductor devices or the above computer.

According to one embodiment of the present invention, a novel semiconductor device can be provided. According to one embodiment of the present invention, a semiconductor device capable of operating at a high speed can be provided. According to one embodiment of the present invention, a semiconductor device with low power consumption can be provided. According to one embodiment of the present invention, a semiconductor device with a small area can be provided. According to one embodiment of the present invention, a highly reliable semiconductor device can be provided.

Note that the description of these effects does not preclude the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 21A to 21C illustrate a configuration example of a transistor.

FIGS. 24A and 24B are cross-sectional views illustrating a configuration example of a semiconductor device.

FIGS. 25A and 25B are cross-sectional views illustrating a configuration example of a semiconductor device.

DETAILED DESCRIPTION OF THE INVENTION

Figure 1:
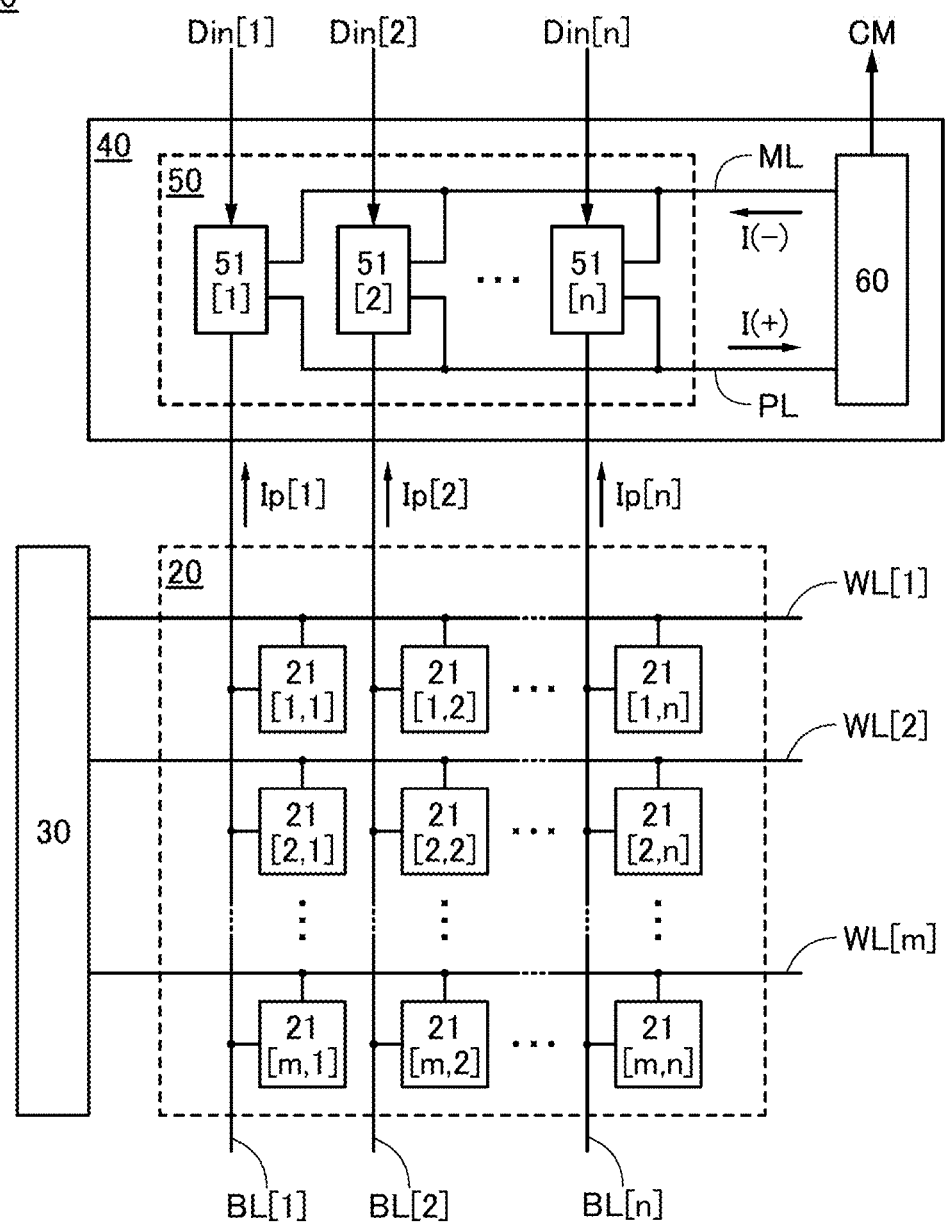
FIG. 1 illustrates a configuration example of a semiconductor device.

Embodiments of the present invention will be described below in detail with reference to the accompanying drawings. Note that the present invention is not limited to the description in the following embodiments, and it will be easily understood by those skilled in the art that various changes and modifications can be made without departing from the spirit and scope of the present invention. Therefore, the present invention should not be interpreted as being limited to the description of the embodiments below.

One embodiment of the present invention includes, in its category, devices such as a semiconductor device, a computer, an electronic device, a display device, a memory device, an imaging device, and a radio frequency (RF) tag. The display devices include, in its category, liquid crystal display devices, light-emitting devices having pixels each provided with a light-emitting element typified by an organic light-emitting element, electronic paper, digital micromirror devices (DMDs), plasma display panels (PDPs), field emission displays (FEDs), and the like.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether a current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

In the description of modes of the invention with reference to the drawings, the same components in different diagrams are commonly denoted by the same reference numeral.

Even when independent components are electrically connected to each other in the drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device of one embodiment of the present invention will be described.
<Configuration Example of Semiconductor Device>

FIG. 1 illustrates a configuration example of a semiconductor device 10. The semiconductor device 10 includes a cell array 20, a driver circuit 30, and an analog processing circuit 40. The semiconductor device 10 can be used as a memory device.

The cell array 20 includes a plurality of memory cells 21. In FIG. 1, the cell array 20 includes the memory cells 21 (memory cells 21[1,1] to 21[m,n]) arranged in m rows and n columns (m and n are natural numbers).

Each of the memory cells 21 is a circuit having a function of storing data. Data stored in the memory cell 21 may be binary data or data having three or more values. When more values are stored in the memory cell 21, the storage capacity per unit area of the semiconductor device 10 can be increased.

Each of the memory cells 21 is connected to a wiring WL and a wiring BL. The wiring WL has a function of transmitting a signal for selecting memory cells 21 in a predetermined row (this signal is hereinafter also referred to as a selection signal). The wiring BL has a function of transmitting a signal corresponding to data which is to be written to the memory cell 21 (this signal is hereinafter also referred to as a write signal) and a signal corresponding to data Dm stored in the memory cell 21 (this signal is hereinafter also referred to as a read signal).

The driver circuit 30 is a circuit having a function of selecting predetermined memory cells 21. Memory cells 21 in a specific row to which data is written or from which data is read are selected by the driver circuit 30. Specifically, the driver circuit 30 has a function of supplying a selection signal to a specific wiring WL selected from wirings WL[1] to WL[m]. The driver circuit 30 can be formed using a decoder or the like.

The analog processing circuit 40 has a function of processing input data. Specifically, the analog processing circuit 40 has a function of processing data Din input from the outside and data Dm stored in the memory cells 21. FIG. 1 illustrates a configuration in which n kinds of data Din (data Din[1] to data Din[n]) and a current Ip[1] to a current Ip[n] corresponding to n kinds of data Dm (data Dm[1] to data Dm[n]) are input to the analog processing circuit 40.

The analog processing circuit 40 includes a data processing circuit 50 and a current control circuit 60. The data processing circuit 50 has a function of writing the data Din to the memory cells 21 and a function of comparing the data Din and the data Dm. The data processing circuit 50 includes n circuits 51 (circuits 51[1] to 51[n]). The circuits 51 are connected to the memory cells 21 through the corresponding wirings BL. The data Din[1] to the data Din[n] and the current Ip[1] to the current Ip[n] corresponding to the data Dm[1] to the data Dm[n] are input to the circuits 51[1] to 51[n], respectively.

The circuits 51 each have a function of generating a current Ic corresponding to the data Din. The generated current Ic is supplied to the memory cells 21 through the wiring BL. When the current Ic corresponding to the data Din is supplied to the memory cells 21 as a write signal in this manner, data is written to the memory cells 21.

The memory cells 21 each have a function of generating the current Ip corresponding to the data Dm stored in the memory cell 21. The generated current Ip is supplied to the circuit 51 through the wiring BL. When the current Ip corresponding to the data Dm is supplied to the circuit 51 as a read signal in this manner, data can be read from the memory cells 21.

When both the data Din and the data Dm are input to the circuits 51, the current Ic corresponding to the data Din and the current Ip corresponding to the data Dm are generated in the circuits 51. In the case where the data Din and the data Dm match here, the current Ic and the current Ip have the same value. In contrast, in the case where the data Din and the data Dm do not match, the current Ic and the current Ip have different values. Accordingly, by comparing the current Ic with the current Ip, whether the data Din and the data Dm match or not can be determined.

As described above, the circuits 51 can compare the data by comparing the current values which are analog values. Accordingly, in comparison of the data, the current values which are analog values do not need to be converted into digital values, and thus the data can be compared at high speed. Thus, the operation speed of the semiconductor device 10 can be improved. Furthermore, it is not necessary to provide an A/D converter circuit, and thus the area of the semiconductor device 10 can be reduced.

The current control circuit 60 has a function of controlling a current flowing in the data processing circuit 50. Specifically, the current control circuit 60 has a function of controlling a current flowing in the circuits 51 in the case where the data Din input to the circuits 51 and the data Dm stored in the memory cells 21 are different.

In the case where the amount of the current Ip is smaller than that of the current Ic, a current corresponding to a difference (Ic−Ip) between the current Ip and the current Ic (hereinafter, the current is also referred to as a first differential current) is supplied from the current control circuit 60 to the circuit 51 through a wiring ML. In the case where the amount of the current Ip is larger than that of the current Ic, a current corresponding to a difference (Ip−Ic) between the current Ic and the current Ip (hereinafter, the current is also referred to as a second differential current) is supplied from the circuit 51 to the current control circuit 60 through a wiring PL. Thus, correction of a current flowing in the circuit 51 is performed (hereinafter, this correction is also referred to as "correction of a differential current"). In the case where the data Din and the data Dm are different, the correction of a differential current is performed by the current control circuit 60. Note that a current I(−) flowing from the current control circuit 60 to the data processing circuit 50 corresponds to the sum of first differential currents generated in the n circuits 51. Furthermore, a current I(+) flowing from the data processing circuit 50 to the current control circuit 60 corresponds to the sum of second differential currents generated in the n circuits 51. The operation of the current control circuit 60 when the correction of a differential current is performed is described in detail later.

The current control circuit 60 has a function of outputting a signal CM corresponding to whether correction of a differential current is performed or not. For example, the current control circuit 60 outputs a high-level signal as the signal CM when correction of a differential current is performed and outputs a low-level signal as the signal CM when correction of a differential current has not been performed. Thus, information on whether the data Din and the data Dm match or not can be output to the outside.

As described above, the semiconductor device 10 can compare data input from the outside and data stored in the memory cells 21 by comparing currents.

Next, a configuration example of each circuit included in the semiconductor device 10 is described.

<Configuration Example of Memory Cell>

Figure 2:
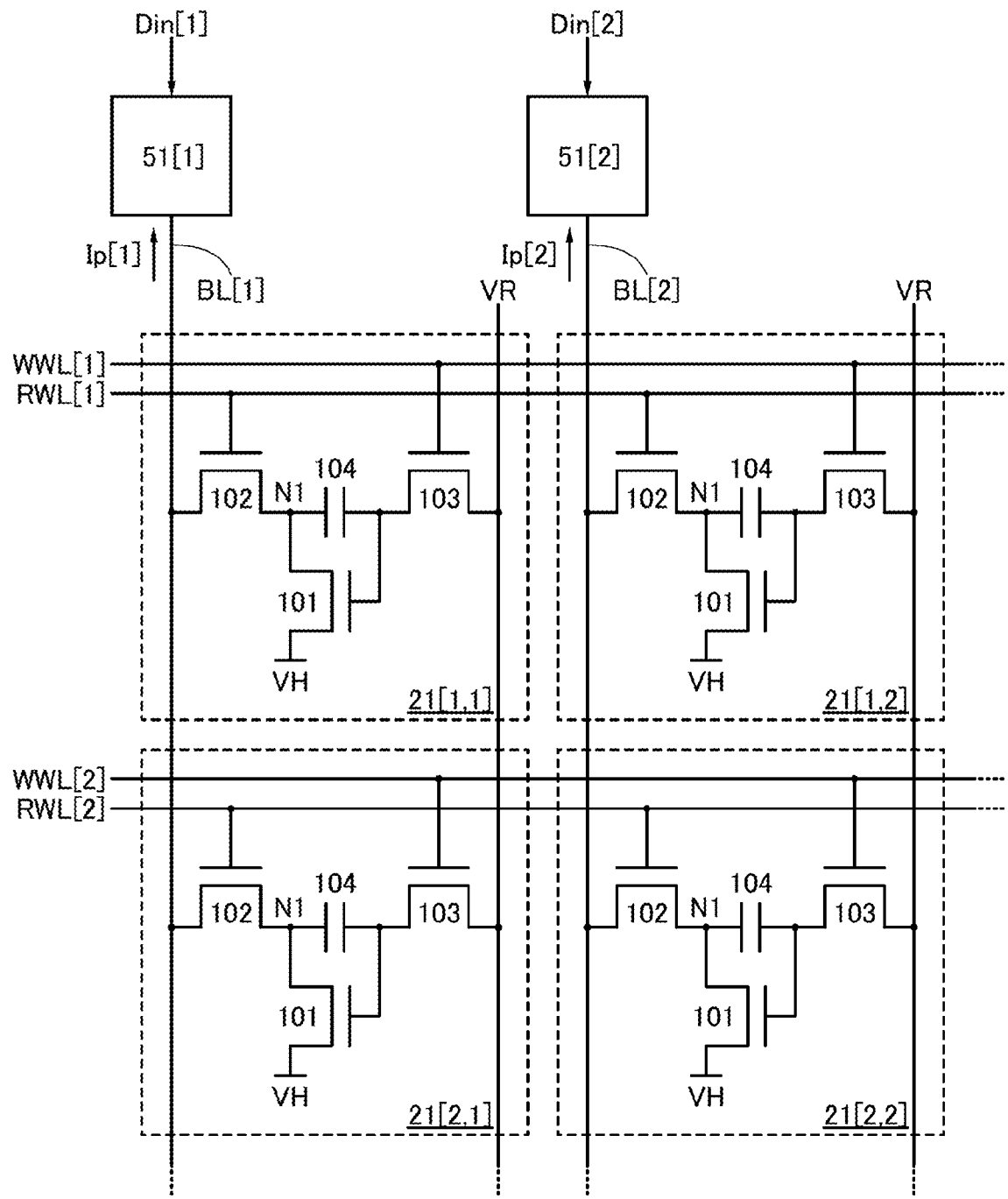
FIG. 2 illustrates a configuration example of a memory cell.

FIG. 2 illustrates a configuration example of the memory cell 21. Although an example where the memory cells 21[1,1], 21[1,2], 21[2,1], and 21[2,2] are provided is described as a typical example here, a similar configuration can also be applied to the other memory cells 21.

Each of the memory cells 21 includes a transistor 101, a transistor 102, a transistor 103, and a capacitor 104. A gate of the transistor 101 is connected to one of a source and a drain of the transistor 103, one of a source and a drain of the transistor 101 is connected to one of a source and a drain of the transistor 102, and the other of the source and the drain of the transistor 101 is connected to a wiring VH. A gate and the other of the source and the drain of the transistor 102 are connected to a wiring RWL and the wiring BL, respectively. A gate and the other of the source and the drain of the transistor 103 are connected to a wiring WWL and a wiring VR, respectively. A first electrode of the capacitor 104 is connected to the gate of the transistor 101, and a second electrode thereof is connected to the one of the source and the drain of the transistor 101. A node connected to the first electrode of the capacitor 104 is referred to as a node N1.

Although the transistors 101 to 103 are n-channel transistors here, the polarity of the transistors can be changed as appropriate. The wiring WWL and the wiring RWL correspond to the wiring WL in FIG. 1 and are connected to the driver circuit 30.

Note that a source of a transistor in this specification and the like means a source region that is part of a semiconductor layer functioning as an active layer, a source electrode connected to the semiconductor layer, or the like. Similarly, a "drain" of a transistor means a drain region that is part of the semiconductor layer, a drain electrode connected to the semiconductor layer, or the like. A gate of a transistor means a gate electrode or the like.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although the connection relationship of the transistor is described assuming that the source and the drain are fixed in some cases for convenience, actually, the names of the source and the drain interchange with each other depending on the relationship of the potentials.

Hereinafter, an operation example of the memory cell 21[1,1] is described. Note that the memory cells 21[1,2], 21[2,1], 21[2,2], and the other memory cells 21 can also operate in a manner similar to the memory cell 21[1,1]. Hereinafter, a wiring WWL[1], a wiring RWL[1], and a wiring BL[1] are referred to as the wiring WWL, the wiring RWL, and the wiring BL, respectively, for description. Here, a case where high-level potentials are supplied to the wiring VH and the wiring VR is described.

[Data Writing]

In data writing, the data Din which is to be written to the memory cell 21 is input in the circuit 51. The current Ic corresponding to the data Din is generated in the circuit 51 and supplied to the wiring BL.

First, the potentials of the wiring RWL and the wiring WWL are set at a high level, and thus the transistors 102 and 103 are turned on. Thus, a potential of the wiring BL is supplied to the node N1, and a potential of the wiring VR is supplied to the gate of the transistor 101.

In the case where the amount of current flowing in the transistor 101 is larger than that of the current Ic generated in the circuit 51 here, the potential of the node N1 is increased. When the amount of the current flowing in the transistor 101 becomes equal to that of the current Ic, the potential of the node N1 becomes constant. In contrast, in the case where the amount of the current flowing in the transistor 101 is smaller than that of the current Ic generated in the circuit 51, the potential of the node N1 is decreased. When the amount of the current flowing in the transistor 101 becomes equal to that of the current Ic, the potential of the node N1 becomes constant.

The potential of the node N1 at this time has a value corresponding to the data Din input to the circuit 51. Specifically, the potential of the node N1 is set at a potential capable of supplying a current equal to a current which corresponds to the data Din and is generated by the circuit 51, to the wiring BL. Accordingly, the data Din can be written to the memory cell 21 through the above operation.

[Data Holding]

Next, the potential of the wiring WWL is set at a low level, and thus the transistor 103 is turned off Thus, a voltage between the first electrode and the second electrode of the capacitor 104 is held, so that the data written to the memory cell 21 is held.

[Data Reading]

In a state where the data Dm is stored in the memory cell 21, the potential of the wiring RWL is set at a high level, and thus the transistor 102 is turned on. At this time, the current Ip flows in the transistor 101. Then, the current Ip is supplied to the circuit 51 through the wiring BL.

Here, the current Ip is a current corresponding to the voltage between the first electrode and the second electrode of the capacitor 104, that is, a current corresponding to the data Dm stored in the memory cell 21. Therefore, the data Dm stored in the memory cell 21 can be determined from a value of the current Ip.

Through the above operation, data writing, data holding, and data reading in the memory cell 21 can be performed.

Here, data writing in the memory cell 21 is performed in such a manner that the potential of the node N1 is changed until the current flowing in the transistor 101 becomes equal to the current Ic. This corresponds to operation in which characteristics of the transistors 101 are corrected for data writing in the memory cells 21 in the case where there is a variation in characteristics among the transistors 101 in the memory cells 21. Accordingly, the reliability of the semiconductor device 10 can be improved. Furthermore, in data writing, verify operation which is necessary for a flash memory can be omitted, and thus data can be written at high speed, leading to an improvement in operation speed of the semiconductor device 10.

A potential corresponding to multivalued data having three or more values can be written to the node N1, so that the storage capacity can be increased as compared to the case where binary digital data is written to the memory cell 21.

Note that a transistor whose channel formation region includes an oxide semiconductor (hereinafter also referred to as an OS transistor) can be used as each of the transistors 101 to 103. An oxide semiconductor has a wider band gap and a lower carrier density than other semiconductors such as silicon, and thus the off-state current of an OS transistor is extremely low. Accordingly, when an OS transistor is used as the transistor 103 or each of the transistors 101 and 102, the voltage between the first electrode and the second electrode of the capacitor 104 can be held for a long period. Consequently, refresh operation in which writing is performed again at predetermined intervals becomes unnecessary or the frequency of the refresh operation can be extremely low. Moreover, even in a period in which the power supply to the memory cell 21 is stopped, data can be held for a long period. Accordingly, power consumption of the semiconductor device 10 can be reduced.

In the case where multivalued data is stored in the memory cell 21, even slight leakage of charge in the memory cell 21 might cause a change in the data Dm stored in the memory cell 21. However, when an OS transistor with an extremely low off-state current is used in the memory cell 21, leakage of charge can be significantly suppressed. Accordingly, the multivalued data stored in the memory cell 21 can be held accurately, leading to higher reliability of the semiconductor device 10.

In addition, the OS transistor has a higher withstand voltage than a transistor whose channel formation region includes silicon (the transistor is hereinafter also referred to as a Si transistor). Therefore, when the OS transistor is used in the memory cell 21, the range of potentials to be held in the memory cell 21 can be widened. Accordingly, the amount of data stored in the memory cell 21 can be increased.

A transistor whose channel formation region is formed in part of a substrate including a single crystal semiconductor (the transistor is hereinafter also referred to as a single crystal transistor) can also be used as the transistor included in the memory cell 21. As the substrate including a single crystal semiconductor, a single crystal silicon substrate, a single crystal germanium substrate, or the like can be given. The single crystal transistor can perform high-speed operation. The use of the single crystal transistor in the memory cell 21 allows the memory cell 21 to operate at higher speed.

A transistor whose channel formation region is formed in a film including a semiconductor other than an oxide semiconductor can also be used in the memory cell 21. Examples of a semiconductor other than an oxide semiconductor include silicon, germanium, silicon germanium, silicon carbide, gallium arsenide, aluminum gallium arsenide, indium phosphide, gallium nitride, and an organic semiconductor. Each of the above semiconductors other than an oxide semiconductor may be a single crystal semiconductor or a non-single-crystal semiconductor such as an amorphous semiconductor, a microcrystalline semiconductor, or a polycrystalline semiconductor.

Note that the memory cell 21 may include a plurality of transistors formed using different semiconductor materials. For example, the OS transistor with a low off-state current is used as the transistor 103, and a transistor capable of operating at high speed (e.g. a transistor whose channel formation region is formed in single crystal silicon or polycrystalline silicon) is used as each of the transistors 101 and 102. In this case, writing and reading of data can be performed at high speed with use of the transistors 101 and 102 while the off-state current of the transistor 103 is reduced and the voltage between the first electrode and the second electrode of the capacitor 104 is held accurately.

<Configuration Example of Input Circuit>

Figure 3:
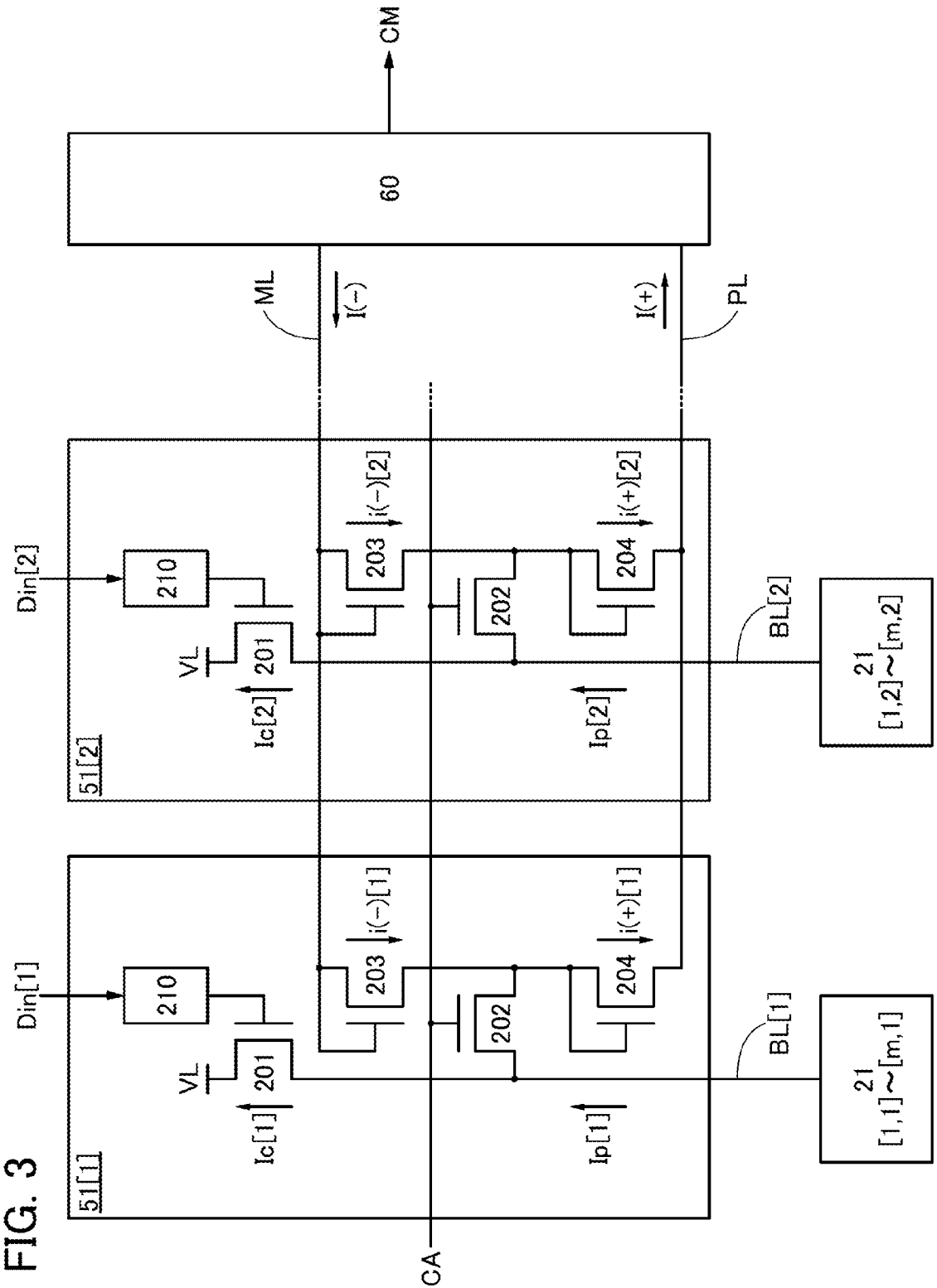
FIG. 3 illustrates a configuration example of an input circuit.

FIG. 3 illustrates a configuration example of the circuits 51 included in the data processing circuit 50. Note that although the circuits 51[1] and 51[2] are illustrated as typical examples here, the other circuits 51 can also have the same configuration.

The circuit 51 includes a transistor 201, a transistor 202, a transistor 203, a transistor 204, and a circuit 210. Although the transistors 201 to 204 are n-channel transistors here, the polarity of the transistors can be changed as appropriate.

A gate of the transistor 201 is connected to the circuit 210, one of a source and a drain of the transistor 201 is connected to the memory cells 21 and one of a source and a drain of the transistor 202, and the other of the source and the drain of the transistor 201 is connected to a wiring VL. A gate of the transistor 202 is connected to a wiring CA, and the other of the source and the drain of the transistor 202 is connected to one of a source and a drain of the transistor 203 and one of a source and a drain of the transistor 204. A gate of the transistor 203 is connected to the other of the source and the drain of the transistor 203 and the wiring ML. A gate of the transistor 204 is connected to the one of the source and the drain of the transistor 204, and the other of the source and the drain of the transistor 204 is connected to the wiring PL.

The wirings ML and PL are shared among the circuits 51[1] to 51[n] and connected to the current control circuit 60.

Next, operation of the circuit 51 is described. Hereinafter, an operation example of the circuit 51[1] is described. Note that the circuit 51[2] and the other circuits 51 can also operate in a manner similar to the circuit 51[1]. Hereinafter, the data Din[1] and the wiring BL[1] are referred to as the data Din and the wiring BL, respectively, for description. Here, a case where a low-level potential is supplied to the wiring VL is described.

[Data Writing]

First, operation of the circuit 51 in writing the data Din input from the outside to the memory cell 21 is described. In operation of writing, in a state where the potential of the wiring CA is set at a low level to turn off the transistor 202, the data Din is input to the circuit 210.

The circuit 210 has a function of converting a digital signal into an analog signal. That is, the circuit 210 has a function as a D/A converter circuit. In the case where the data Din is a digital signal, the data Din is converted into an analog signal by the circuit 210 and supplied to the gate of the transistor 201. Note that in the case where the data Din is an analog signal, the circuit 210 can be omitted.

Figure 4:
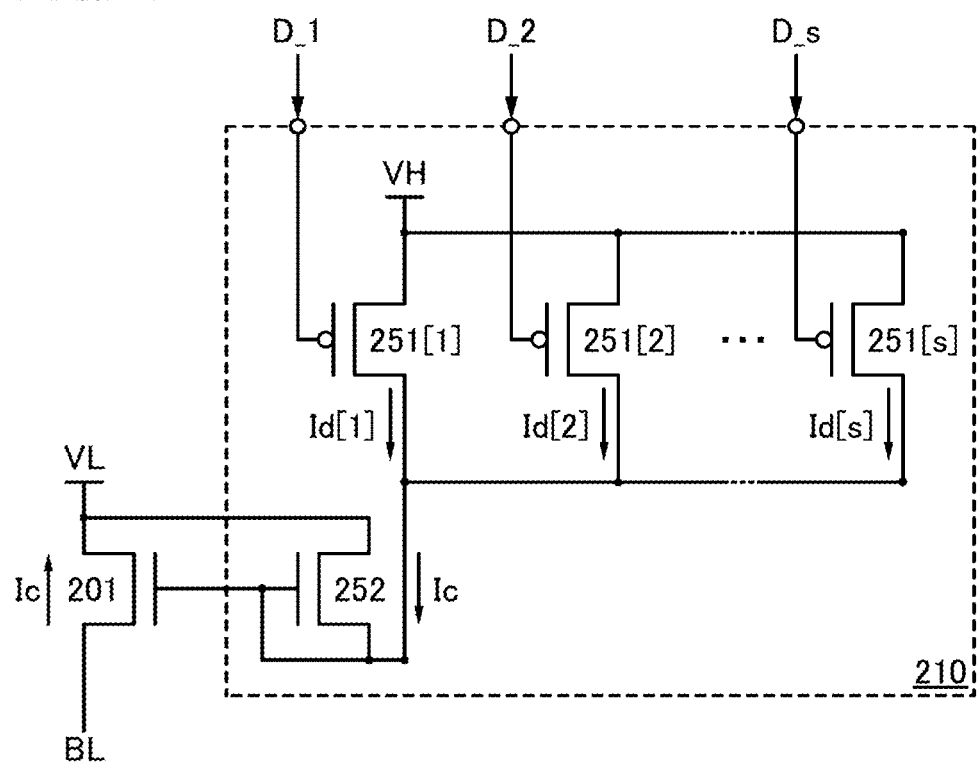
FIG. 4 illustrates a configuration example of a circuit.

FIG. 4 illustrates a specific example of the circuit 210. The circuit 210 can be formed using transistors 251 and a transistor 252. FIG. 4 illustrates a configuration example of the circuit 210 in which digital signals D (D_1 to D_s) with s bits (s is a natural number) are input and s transistors 251 (transistors 251[1] to 251[s]) are provided. Note that although the transistors 251 are p-channel transistors and the transistor 252 is an n-channel transistor here, the polarity of the transistors can be changed as appropriate.

The s transistors 251 are connected in parallel, and the data D_1 to D_s are input to respective gates of the s transistors 251. One of a source and a drain of each of the transistors 251 is connected to a gate of the transistor 252, one of a source and a drain of the transistor 252, and a gate of the transistor 201. The other of the source and the drain of each of the transistors 251 is connected to the wiring VH. The other of the source and the drain of the transistor 252 is connected to the wiring VL. Here, a case where a high-level potential is supplied to the wiring VH and a low-level potential is supplied to the wiring VL is described.

The transistors 251 have a function of supplying currents corresponding to the data D_1 to D_s input to the respective gates of them. For example, the transistor 251[1] has a function of supplying a current Id[1] corresponding to the data D_1 between the source and the drain. Note that the s transistors 251 each preferably operate in a saturation region.

Here, the transistors 251[1] to 251[s] are designed so that a current Id flowing between the source and the drain varies among the transistors 251[1] to 251[s] when the same potential is supplied to the gates. Specifically, when the same potential is supplied to the gates of the transistors 251[1] to 251[s], the design is performed so that Id[1]:Id[2]:Id[s] is $2^0:2^1:\ldots 2^{S-1}$. For example, the ratio of the channel widths of the transistors 251[1] to 251[s] may be $2^0:2^1:\ldots 2^{S-1}$. Alternatively, a $2^0$ transistor, $2^1$ transistors, . . . and $2^{S-1}$ transistors, which have the same size, may be connected in parallel as the transistors 251[1] to 251[s], respectively. With such a configuration, the current Ic flowing in the circuit 210 (the current Ic corresponds to the sum of the currents Id[1] to Id[s]) is uniquely determined in accordance with the data D_1 to D_s.

The current Ic obtained by the transistors 251[1] to 251[s] is supplied to the wiring BL by a current mirror circuit including the transistors 252 and 201. Thus, the data D_1 to the data D_s each of which is a digital signal can be converted into the current Ic which is an analog signal and supplied to the wiring BL.

When the data Din is input to the circuit 210 in FIG. 3, a potential corresponding to the data Din is supplied to the gate of the transistor 201. At this time, the current Ic corresponding to the potential of the gate flows in the transistor 201. Note that in data writing, the transistor 201 preferably operates in the saturation region.

The current Ic is supplied to the memory cell 21 through the wiring BL. The current Ic corresponds to a write signal. Then, as described above, a potential corresponding to the current Ic is supplied to the node N1 in the memory cell 21 and held. Through the above operation, writing the data Din to the memory cell 21 is performed.

[Comparison of Data]

The data Din and the data Dm stored in the memory cell 21 are input to the circuit 51. When both of the data Din and the data Dm are input to the circuit 51, the current Ic and the current Ip flow in the wiring BL. Note that the current Ip is generated by reading operation from the memory cell 21 as described above.

When the current Ic and the current Ip are compared here, the data Din and the data Dm can be compared. Specifically, in the case where the data Din and the data Dm match, the current Ic and the current Ip become equal to each other. In contrast, in the case where the data Din and the data Dm do not match, the current Ic and the current Ip have different values. Accordingly, whether the current Ic and the current Ip are equal to each other or not is determined, whereby whether the data Din and the data Dm match or not can be determined.

Hereinafter, operation of the circuit 51 in comparison of the data Din and the data Dm is described.

First, the wiring CA is set at a high level to turn on the transistor 202. Then, the data Din is input to the circuit 210, and reading operation is performed in the memory cell 21 connected to the circuit 51.

When the data Din is input to the circuit 210, the current Ic corresponding to the data Din flows in the transistor 201 and the wiring BL. When reading operation is performed in the memory cell 21 connected to the circuit 51, the current Ip corresponding to the data Dm stored in the memory cell 21 is generated, flows in the wiring BL, and is supplied to the circuit 51.

In the case where the current Ic and the current Ip are equal to each other, no current flows in the wiring ML and the wiring PL, and thus correction of a differential current is not performed, which means that the data Din and the data Dm match.

In the case where the current Ip<the current Ic, the current i(−) flows in the circuit 51 from the current control circuit 60 through the wiring ML and the transistor 203 and is supplied to the transistor 201 to compensate for a current supplied to the transistor 201. The current i(−) at this time corresponds to a difference between the current Ic and the current Ip. Then, the current I(−) corresponding to the sum of the currents i(−) (the currents i(−)[1] to i(−)[n]) generated in the circuits 51[1] to 51[n], respectively, flows in the wiring ML.

In the case where the current Ip>the current Ic, the current i(+) flows in the current control circuit 60 from the circuit 51 through the wiring PL and the transistor 204 to limit a current supplied to the transistor 201. The current i(+) at this time corresponds to a difference between the current Ip and the current Ic. Then, the current I(+) corresponding to the sum of the currents i(+) (the currents i(+)[1] to i(+)[n]) generated in the circuits 51[1] to 51[n], respectively, flows in the wiring PL.

In the case where the current Ip and the current Ic are different from each other as described above, the current i(−) or the current i(+) is generated, and thus correction of a differential current is performed. Accordingly, whether the data Din and the data Dm match or not can be determined by whether correction of a differential current is performed or not. Note that information on whether correction of a differential current is performed or not can be output from the current control circuit 60 as the signal CM.

After comparison of the data Din and the data Dm is completed, a low-level potential is supplied to the wiring CA to turn off the transistor 202. Thus, the comparison operation of the data is terminated.

As described above, in the circuit 51, the data can be compared by comparison of the current Ic which is an analog value and the current Ip. Note that as described above, the data Dm stored in the memory cell 21 is data written while the characteristics of the transistor 101 are corrected. Therefore, the circuit 51 can compare the data Din and the data Dm accurately, leading to higher reliability of the semiconductor device 10. Furthermore, the data Din and the data Dm can be compared without conversion of the current Ip into a digital value. Accordingly, the data can be compared at high speed, so that the operation speed of the semiconductor device 10 can be improved. In addition, the area of the semiconductor device 10 can be reduced by omission of an A/D converter circuit.

Note that in FIG. 3, comparison of the data is performed at the same time in the circuits 51, and when at least one column in which the data Din and the data Dm do not match exists, the current I(−) or the current I(+) is generated, and thus correction of a differential current is performed. Accordingly, when the data Din[1] to Din[n] and the data Dm[1] to Dm[n] are each s-bit data, for example, the (s×n)-bit data Din input from the outside and the (s×n)-bit data Dm stored in the n memory cells 21 in one row in the cell array 20 can be compared collectively.

<Configuration Example of Current Control Circuit>

Figure 5:
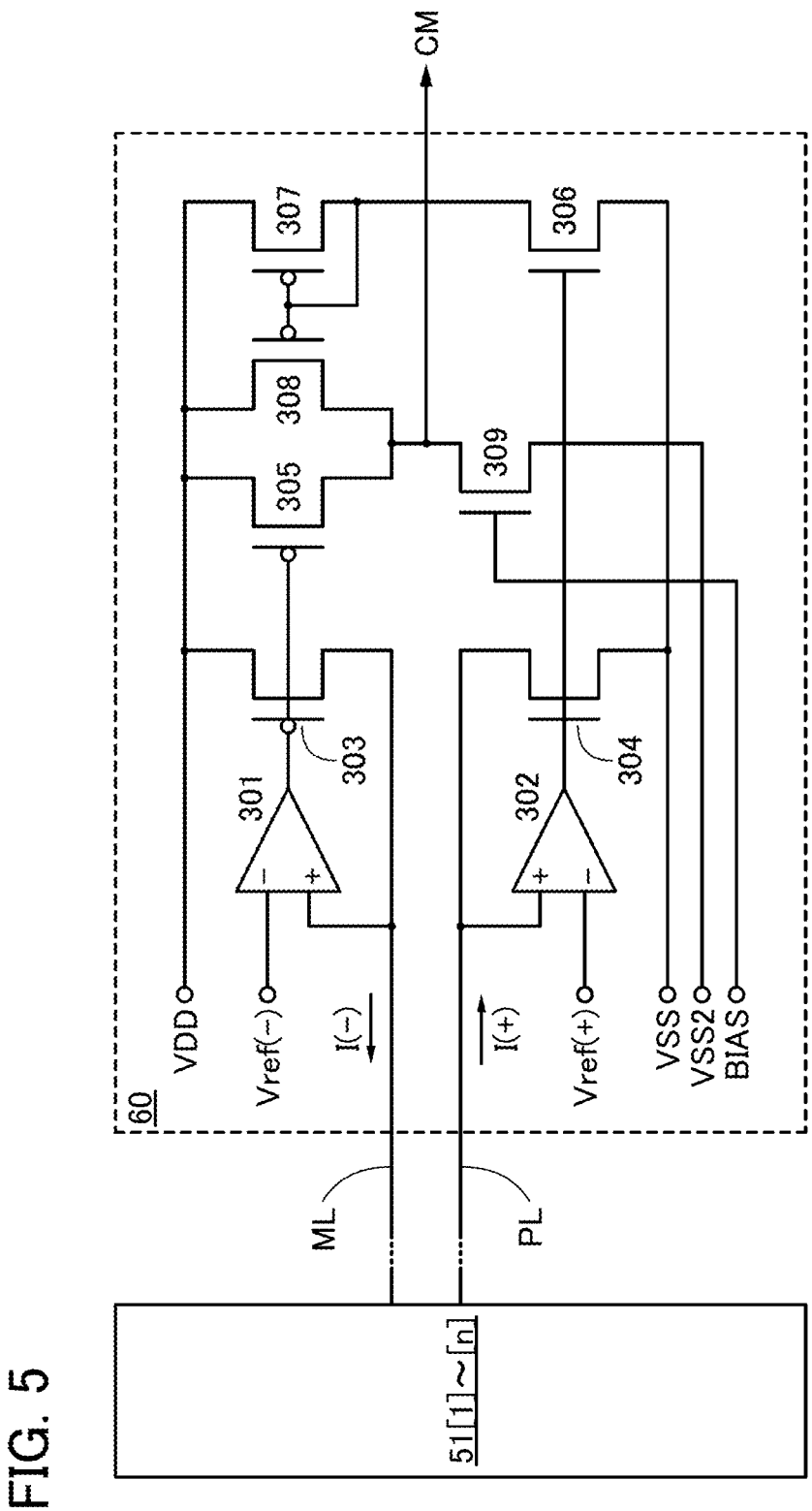
FIG. 5 illustrates a configuration example of a current control circuit.

FIG. 5 illustrates a configuration example of the current control circuit 60. The current control circuit 60 includes a comparator 301, a comparator 302, a transistor 303, a transistor 304, a transistor 305, a transistor 306, a transistor 307, a transistor 308, and a transistor 309. Although the transistors 303, 305, 307, and 308 are p-channel transistors and the transistors 304, 306, and 309 are n-channel transistors here, the polarity of the transistors can be changed as appropriate.

A non-inverting input terminal of the comparator 301 is connected to the wiring ML, an inverting input terminal of the comparator 301 is connected to a terminal to which a potential Vref(−) is input, an output terminal of the comparator 301 is connected to a gate of the transistor 303 and a gate of the transistor 305. A non-inverting input terminal of the comparator 302 is connected to the wiring PL, an inverting input terminal of the comparator 302 is connected to a terminal to which a potential Vref(+) is input, an output terminal of the comparator 302 is connected to a gate of the transistor 304 and a gate of the transistor 306. One of a source and a drain of the transistor 303 is connected to the wiring ML, and the other of the source and the drain of the transistor 303 is connected to a terminal supplied with a high power supply potential VDD. One of a source and a drain of the transistor 304 is connected to the wiring PL, and the other of the source and the drain of the transistor 304 is connected to a terminal supplied with a low power supply potential VSS. One of a source and a drain of the transistor 305 is connected to one of a source and a drain of the transistor 308 and one of a source and a drain of the transistor 309, and the other of the source and the drain of the transistor 305 is connected to the terminal supplied with the high power supply potential VDD. One of a source and a drain of the transistor 306 is connected to a gate of the transistor 307, a gate of the transistor 308, and one of a source and a drain of the transistor 307, and the other of the source and the drain of the transistor 306 is connected to the terminal supplied with the low power supply potential VSS.

The other of the source and the drain of the transistor 307 is connected to the terminal supplied with the high power supply potential VDD. The other of the source and the drain of the transistor 308 is connected to the terminal supplied with the high power supply potential VDD. A gate of the transistor 309 is connected to a terminal supplied with a predetermined potential BIAS, and the other of the source and the drain of the transistor 309 is connected to a terminal supplied with a low power supply potential VSS2.

The potential of the node connected to the one of the source and the drain of the transistor 305, the one of the source and the drain of the transistor 308, and the one of the source and the drain of the transistor 309 is output as the signal CM to the outside. Note that the signal CM may be output to the outside through a buffer. The transistors 307 and 308 form a current mirror circuit.

Next, an example of operation of the current control circuit 60 is described.

As described above, when the current Ic and the current Ip are different from each other in comparison of the data Din and the data Dm, the current I(−) flowing in the wiring ML or the current I(+) flowing in the wiring PL is generated, and thus correction of differential current is performed. The current control circuit 60 has a function of generating the current I(−) and the current I(+) and a function of generating the signal CM corresponding to whether correction of a differential current is performed or not and outputting the signal CM to the outside.

First, operation in the case where the current Ip<the current Ic and the current I(−) flows in the wiring ML is described.

In the case where the current Ip<the current Ic, the comparator 301 and the transistor 303 operate to compensate for a current flowing in the transistor 201 included in the circuit 51, and thus the current I(−) flows in the wiring ML. In the case where the amount of current flowing in the wiring ML through the transistor 303 is smaller than the amount of current required as the current I(−), the potential of the non-inverting input terminal of the comparator 301 is decreased, and thus the output of the comparator 301 is also decreased. Thus, the potential of the gate of the transistor 303 is decreased, and the amount of current flowing in the wiring ML through the transistor 303 is increased, and thus the amount of current required as the current I(−) can be supplied to the wiring ML. In contrast, in the case where the amount of current flowing in the wiring ML through the transistor 303 is larger than the amount of current required as the current I(−), the potential of the non-inverting input terminal of the comparator 301 is increased, and thus the output of the comparator 301 is also increased. Thus, the potential of the gate of the transistor 303 is increased, and the amount of current flowing in the wiring ML through the transistor 303 is decreased, so that the amount of current required as the current I(−) can be supplied to the wiring ML.

The output of the comparator 301 is also supplied to the gate of the transistor 305. In the case where the current I(−) flows in the wiring ML, the potential of the gate of the transistor 305 is decreased, and current flows in the transistor 305. Thus, the signal CM becomes high.

Next, operation in the case where the current Ip>the current Ic and the current I(+) flows in the wiring PL is described.

In the case where the current Ip>the current Ic, the comparator 302 and the transistor 304 operate to limit a current flowing in the transistor 201 included in the circuit 51, and thus the current I(+) flows in the wiring PL. In the case where the amount of current flowing in the wiring PL through the transistor 304 is smaller than the amount of current required as the current I(+), the potential of the non-inverting input terminal of the comparator 302 is increased, and thus the output of the comparator 302 is also increased. Thus, the potential of the gate of the transistor 304 is increased, and the amount of current flowing in the wiring PL through the transistor 304 is increased, and thus the amount of current required as the current I(+) can be supplied to the wiring PL. In contrast, in the case where the amount of current flowing in the wiring PL through the transistor 304 is larger than the amount of current required as the current I(+), the potential of the non-inverting input terminal of the comparator 302 is decreased, and thus the output of the comparator 302 is also decreased. Thus, the potential of the gate of the transistor 304 is decreased, and the amount of current flowing in the wiring PL through the transistor 304 is decreased, so that the amount of current required as the current I(+) can be supplied to the wiring PL.

The output of the comparator 302 is also supplied to the gate of the transistor 306. In the case where the current I(+) flows in the wiring PL, the potential of the gate of the transistor 306 is increased, and a current flows in the transistor 306. The current flowing in the transistor 306 also flows in the transistor 307, and the current flowing in the transistor 307 also flows in the transistor 308 by operation of the current mirror circuit. Thus, the signal CM becomes high.

Note that in the case where the current Ic and the current Ip are equal to each other, the current I(−) and the current I(+) are not generated, and thus the signal CM becomes low.

As described above, in comparison of the data Din and the data Dm, the current control circuit 60 can generate the current I(−) and the current I(+) in accordance with the magnitude relationship between the current Ic and the current Ip. Then, the current control circuit 60 can generate the signal CM including information on whether the data match or not and output the signal CM to the outside.

Figure 6:
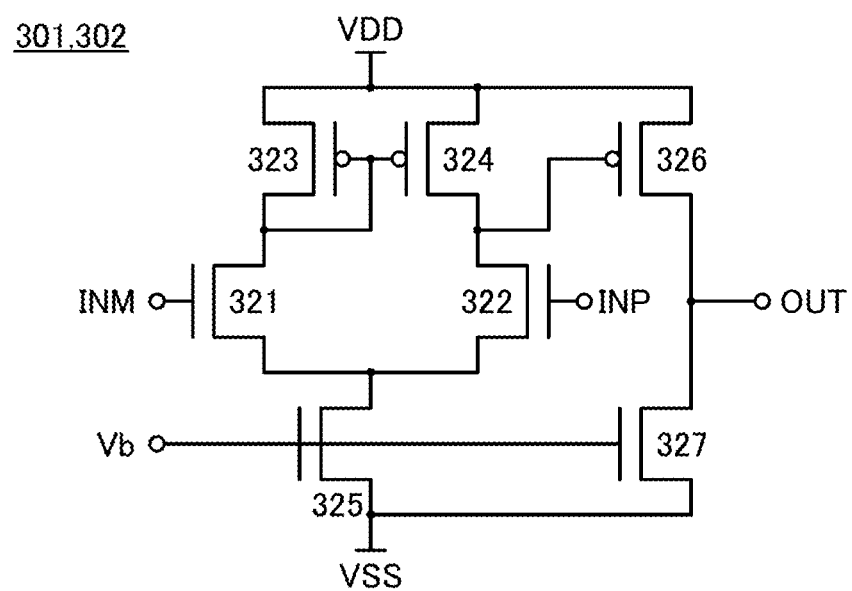
FIG. 6 illustrates a configuration example of a comparator.

Note that the comparators 301 and 302 can each be formed using a circuit illustrated in FIG. 6, for example. The comparator illustrated in FIG. 6 includes transistors 321 to 327. Note that a terminal INP corresponds to a non-inverting input terminal of the comparator, a terminal INM corresponds to an inverting input terminal of the comparator, and a terminal OUT corresponds to an output terminal of the comparator. An appropriate bias voltage Vb is supplied to a gate of the transistor 327.

<Operation Example of Semiconductor Device>

Figure 7:
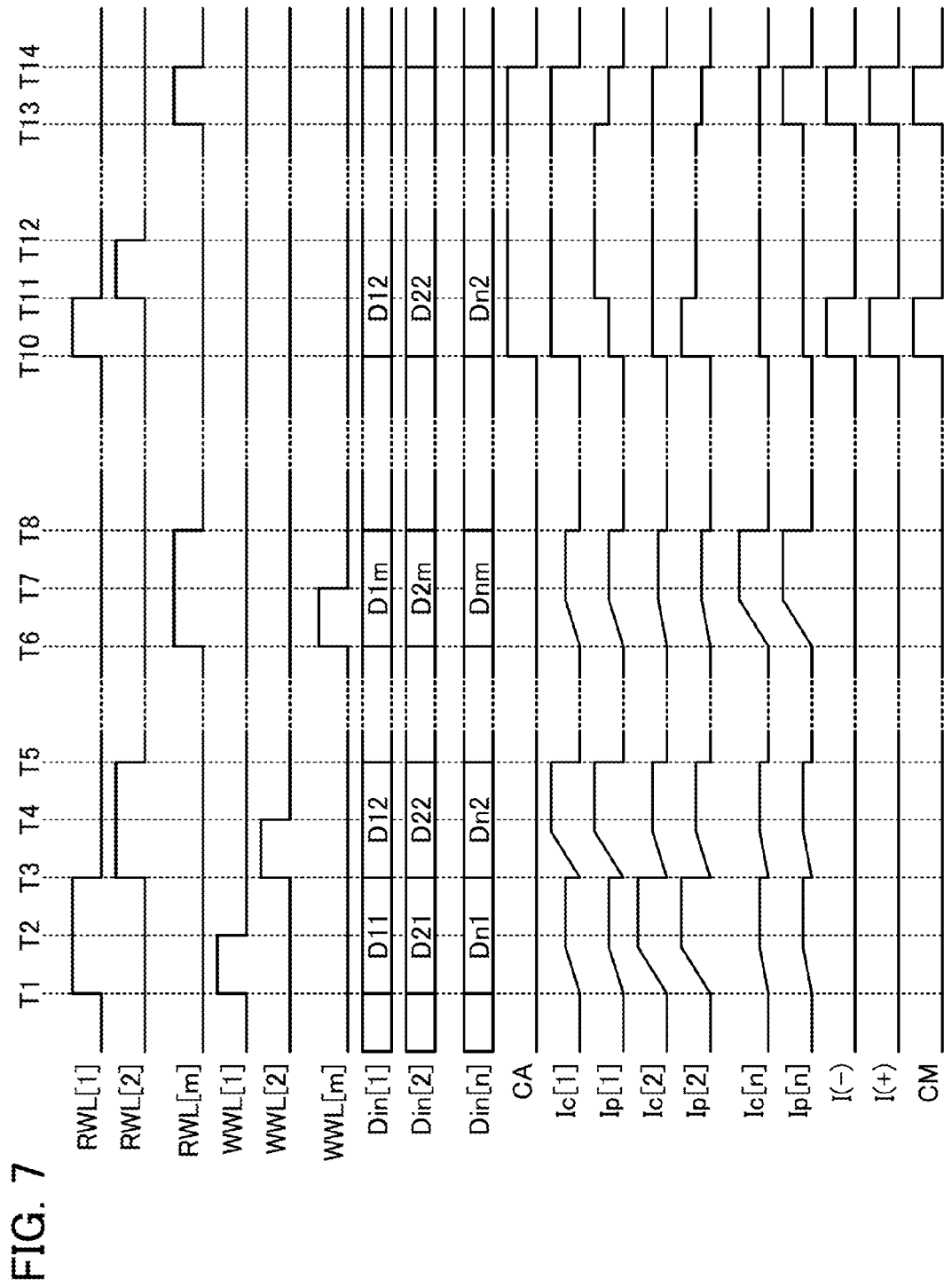
FIG. 7 is a timing chart.

Next, a specific operation example of the semiconductor device 10 is described with reference to a timing chart shown in FIG. 7. Here, in particular, operation examples of the memory cell 21 illustrated in FIG. 2, the circuit 51 illustrated in FIG. 3, and the current control circuit 60 illustrated in FIG. 5 are described in detail. Note that in FIG. 7, Time T1 to Time T8 correspond to a period during which the data Din is written to the memory cell 21, and Time T10 to Time T14 correspond to a period during which the data Din and the data Dm are compared.

First, from Time T1 to Time T2, the potentials of the wiring RWL[1] and the wiring WWL[1] are set at a high level, and the potentials of the wiring RWL[2], the wiring WWL[2], the wiring RWL[m], and the wiring WWL[m] are set at a low level. Thus, the transistors 102 and the transistors 103 in the memory cells 21[1,1] to 21[1,$n$] are turned on. Signals D11 to Dn1 are input to the circuits 51[1] to 51[$n$] as the data Din[1] to Din[$n$], respectively. In addition, the potential of the wiring CA is set at a low level.

Here, the signals D11 to Dn1 are converted into analog signals by the circuits 210 included in the circuits 51[1] to 51[$n$], respectively. Then, in the circuits 51[1] to 51[$n$], currents Ic[1] to Ic[$n$] corresponding to the signals D11 to Dn1 flow in the respective transistors 201. Note that from Time T1 to Time T2, the transistors 20 each preferably operate in the saturation region.

In each of the memory cells 21[1,1] to 21[1,$n$], the potential of the wiring VR (high-level potential) is supplied to the gate of the transistor 101 through the transistor 103, and the potential of the wiring BL is supplied to the node N1 through the transistor 102.

Here, in the case where the amount of current flowing in the transistor 101 is larger than that of current which the circuit 51 in the same column can supply, the potential of the node N1 is increased, and thus the amount of current flowing in the transistor 101 is decreased. In contrast, in the case where the amount of current flowing in the transistor 101 is smaller than that of current which the circuit 51 in the same column can supply, the potential of the node N1 is decreased, and thus the amount of current flowing in the transistor 101 is increased. Then, when the amount of the current flowing in the transistor 101 becomes equal to that of the current (Ic) which the circuit 51 in the same column can supply, the potential of the node N1 becomes constant.

The potentials of the nodes N1 in the memory cells 21[1,1] to 21[1,$n$] at this time correspond to the signals D11 to Dn1, respectively. Accordingly, the data corresponding to the signals D11 to Dn1 can be written to the memory cells 21[1,1] to 21[1,$n$], respectively, through the above operation.

Next, from Time T2 to Time T3, the potential of the wiring WWL[1] is set at a low level. Thus, the transistors 103 in the memory cells 21[1,1] to 21[1,$n$] are turned off. Thus, the voltage between the first electrode and the second electrode of the capacitor 104 is maintained at a voltage which makes the amount of the current which the circuit 51 in the same column can supply and the amount of the current flowing in the transistor 101 equal to each other. Accordingly, the data corresponding to the signals D11 to Dn1 can be held in the memory cells 21[1,1] to 21[1,$n$].

Next, from Time T3 to Time T5, through operation similar to that in Time T1 to Time T3, data corresponding to signals D12 to Dn2 is written to the memory cells 21[2,1] to 21[2,$n$] and held. Furthermore, from Time T6 to Time T8, data corresponding to signals D1$m$ to Dn$m$ are written to the memory cells 21[$m$,1] to 21[$m$,$n$] and held.

Through the above operation, the data Din can be written to the memory cells 21.

Next, the data Din input from the outside and the data Dm stored in the memory cells 21 are compared. From Time T10 to Time T14, the signals D12 to Dn2 is input in the circuits 51[1] to 51[$n$], respectively.

First, from Time T10 to Time T11, the potential of the wiring RWL[1] is set at a high level, and the potentials of the wiring WWL[1], the wiring RWL[2], the wiring WWL[2], the wiring RWL[$m$], and the wiring WWL[$m$] are set at a low level. Thus, the transistors 102 in the memory cells 21[1,1] to 21[1,$n$] are turned on. Furthermore, the potential of the wiring CA is set at a high level.

Here, the currents Ip[1] to Ip[$n$] corresponding to the signals D11 to Dn1 flow in the transistors 101 in the memory cells 21[1,1] to 21[1,$n$], respectively. Then, the currents Ip[1] to Ip[$n$] are supplied to the circuits 51[1] to 51[$n$] through the wirings BL[1] to BL[$n$], respectively.

The signals D12 to Dn2 are input to the circuits 51[1] to 51[$n$], respectively, and the current Ic[1] to the current Ic[$n$]

corresponding to the signals D12 to Dn2 flow in the circuits 51[1] to 51[n], respectively. Note that from Time T10 to Time T11, the transistors 201 each preferably operate in the saturation region.

Here, from Time T10 to Time T11, the current Ip[1]<the current Ic[1], the current Ip[2]>the current Ic[2], and the current Ip[n]=the current Ic[n]. At this time, in the circuit 51[1], a current corresponding to a difference between the current Ip[1] and the current Ic[1] flows in the transistor 203. In the circuit 51[2], a current corresponding to a difference between the current Ip[2] and the current Ic[2] flows in the transistor 204. Then, the comparator 301 in the current control circuit 60 controls the potential of the gate of the transistor 303 such that the current I(−) corresponding to the sum of currents flowing in the transistors 203 in the circuits 51[1] to 51[n] is supplied to the wiring ML. The comparator 302 in the current control circuit 60 controls the potential of the gate of the transistor 304 such that the current I(+) corresponding to the sum of currents flowing in the transistors 204 in the circuits 51[1] to 51[n] is supplied to the wiring PL.

A current corresponding to the current I(−) also flows in the transistor 305, and a current corresponding to the current I(+) also flows in the transistors 306, 307, and 308. As a result, the signal CM output from the current control circuit 60 becomes high, which means that the data Din and the data Dm are different from each other.

Next, from Time T11 to Time T12, the potential of the wiring RWL[2] is set at a high level, and the potentials of the wiring RWL[1], the wiring WWL[1], the wiring WWL[2], the wiring RWL[m], and the wiring WWL[m] are set at a low level. Thus, the transistors 102 in the memory cells 21[2,1] to 21[2,n] are turned on.

Here, the currents Ip[1] to Ip[n] corresponding to the signals D12 to Dn2 flow in the transistors 101 in the memory cells 21[2,1] to 21[2,n], respectively. Then, the currents Ip[1] to Ip[n] are supplied to the circuits 51[1] to 51[n] through the wirings BL[1] to BL[n], respectively.

The signals D12 to Dn2 are input to the circuits 51[1] to 51[n], respectively, and the currents Ic[1] to Ic[n] corresponding to the signals D12 to Dn2 flow in the circuits 51[1] to 51[n], respectively. Note that from Time T11 to Time T12, the transistors 201 each preferably operate in the saturation region.

Here, from Time T11 to Time T12, the current Ip[1]=the current Ic[1], the current Ip[2]=the current Ic[2], and the current Ip[n]=the current Ic[n]. At this time, in the circuits 51[1] to 51[n], a current flowing in the transistors 203 and 204 is not generated, and thus the current I(−) and the current I(+) are not generated, either. Accordingly, the transistors 305 and 306 in the current control circuit 60 are turned off, and thus the signal CM output from the current control circuit 60 becomes low, which means that the data Din and the data Dm match.

Next, from Time T13 to Time T14, the potential of the wiring RWL[m] is set at a high level, and the potentials of the wiring RWL[1], the wiring WWL[1], the wiring RWL[2], the wiring WWL[2], and the wiring WWL[m] are set at a low level. Thus, the transistors 102 in the memory cells 21[m,1] to 21[m,n] are turned on.

Here, the currents Ip[1] to Ip[n] corresponding to the signals D1m to Dnm flow in the transistors 101 in the memory cells 21[m,1] to 21[m,n], respectively. Then, the currents Ip[1] to Ip[n] are supplied to the circuits 51[1] to 51[n] through the wirings BL[1] to BL[n], respectively.

The signals D12 to Dn2 are input to the circuits 51[1] to 51[n], respectively, and the currents Ic[1] to Ic[n] corresponding to the signals D12 to Dn2 flow in the circuits 51[1] to 51[n], respectively. Note that from Time T13 to Time T14, the transistors 201 each preferably operate in the saturation region.

Here, from Time T13 to Time T14, the current Ip[1]<the current Ic[1], the current Ip[2]<the current Ic[2], and the current Ip[n]>the current Ic[n]. At this time, in the circuit 51[1], a current corresponding to a difference between the current Ip[1] and the current Ic[1] flows in the transistor 203. In the circuit 51[2], a current corresponding to a difference between the current Ip[2] and the current Ic[2] flows in the transistor 203. In the circuit 51[n], a current corresponding to a difference between the currents Ip[n] and Ic[n] flows in the transistor 204. Then, the comparator 301 in the current control circuit 60 controls the potential of the gate of the transistor 303 such that the current I(−) corresponding to the sum of currents flowing in the transistors 203 in the circuits 51[1] to 51[n] is supplied to the wiring ML. The comparator 302 in the current control circuit 60 controls the potential of the gate of the transistor 304 such that the current I(+) corresponding to the sum of currents flowing in the transistors 204 in the circuits 51[1] to 51[n] is supplied to the wiring PL.

The current corresponding to the current I(−) also flows in the transistor 305, and the current corresponding to the current I(+) also flows in the transistors 306, 307, and 308. As a result, the signal CM output from the current control circuit 60 becomes high, which means that the data Din and the data Dm are different from each other.

Through the above operation, the data Din can be written to the memory cells 21, and the data Din and the data Dm can be compared with each other.

In one embodiment of the present invention, with the above configuration, data can be written and compared accurately at high speed.

This embodiment can be combined with any of the other embodiments as appropriate.

Embodiment 2

In this embodiment, other configuration examples of the semiconductor device 10 are described.

<Modification Examples of Memory Cell>

Figure 8:
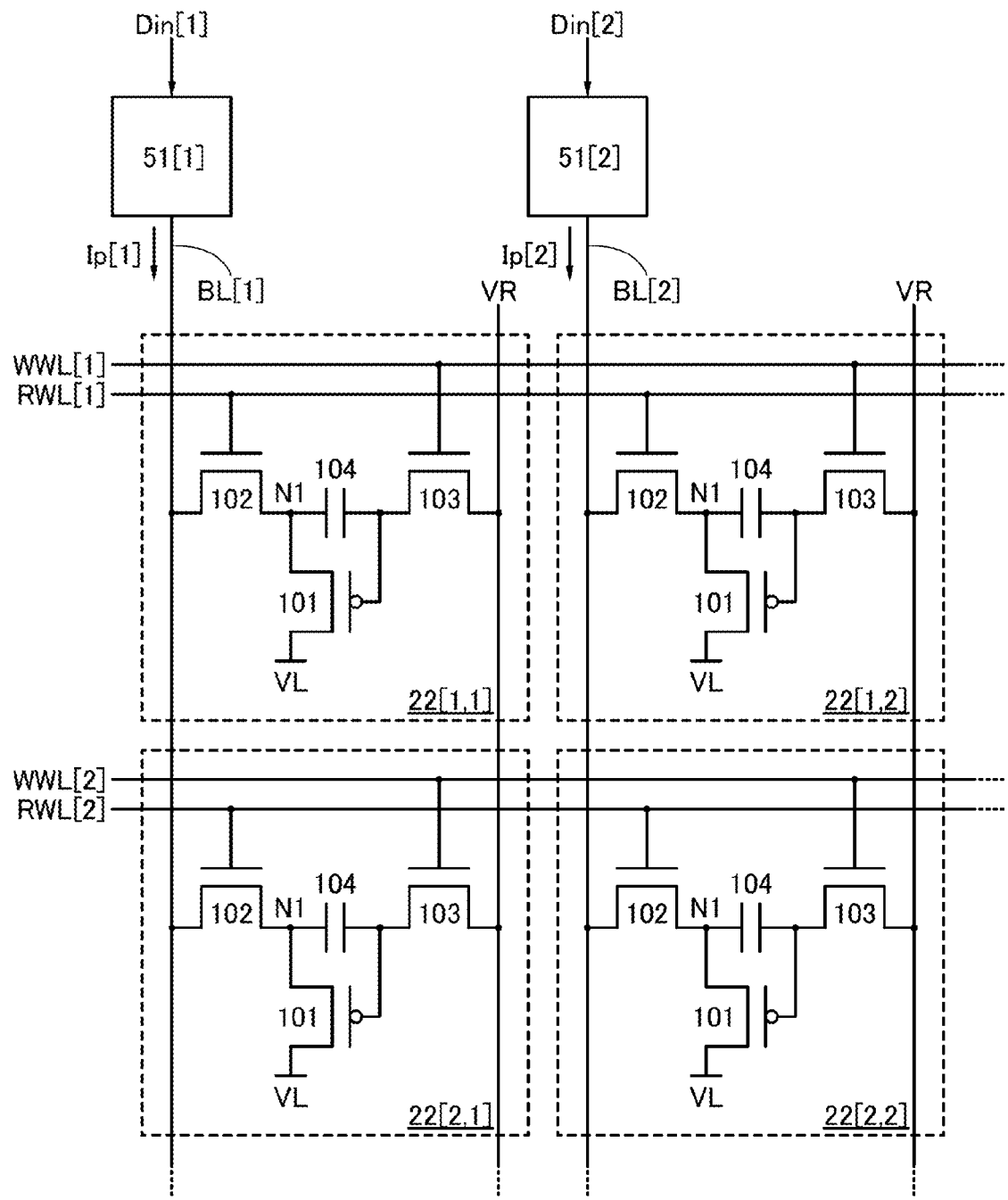
FIG. 8 illustrates a configuration example of a memory cell.
Figure 9:
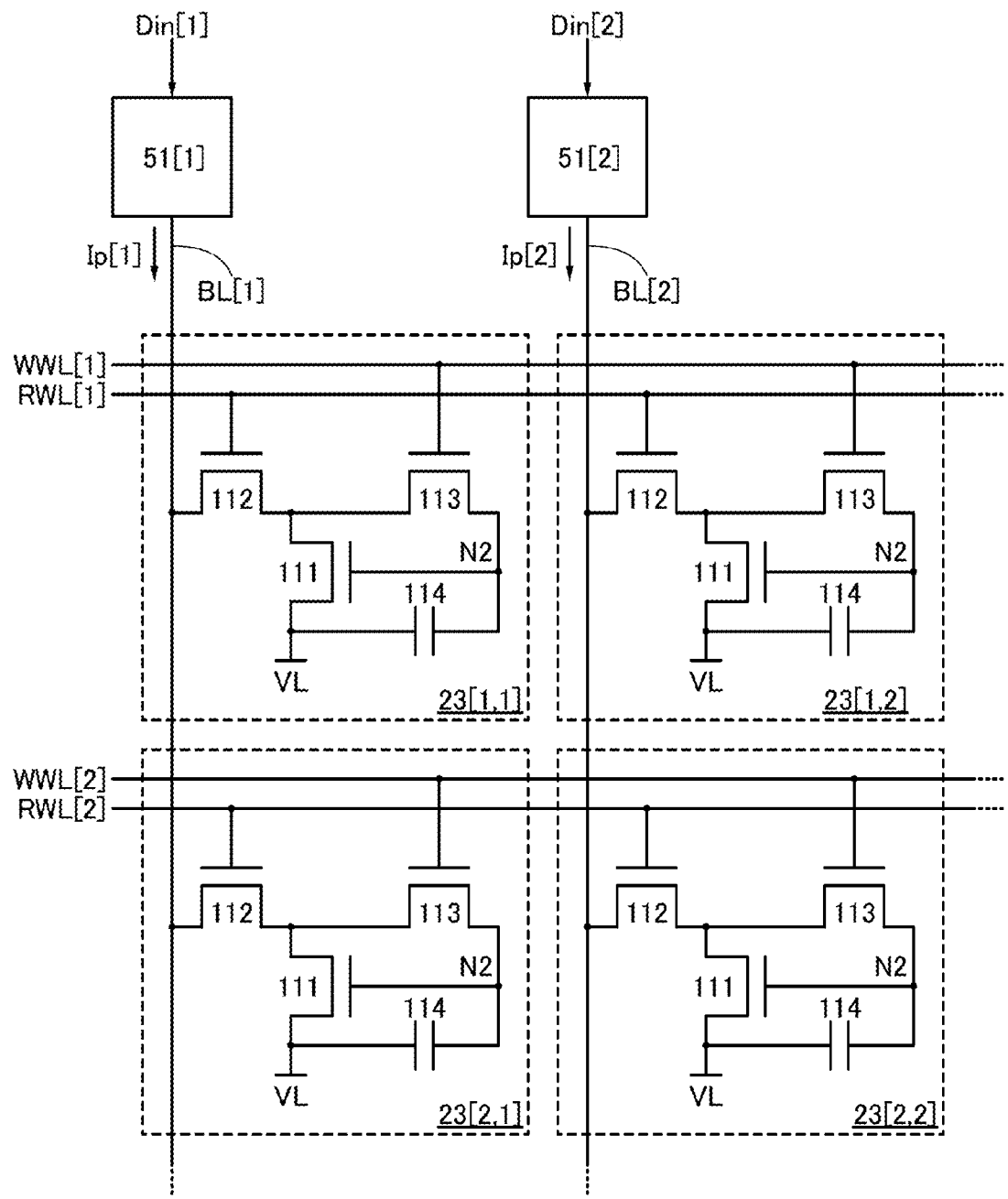
FIG. 9 illustrates a configuration example of a memory cell.
Figure 10:
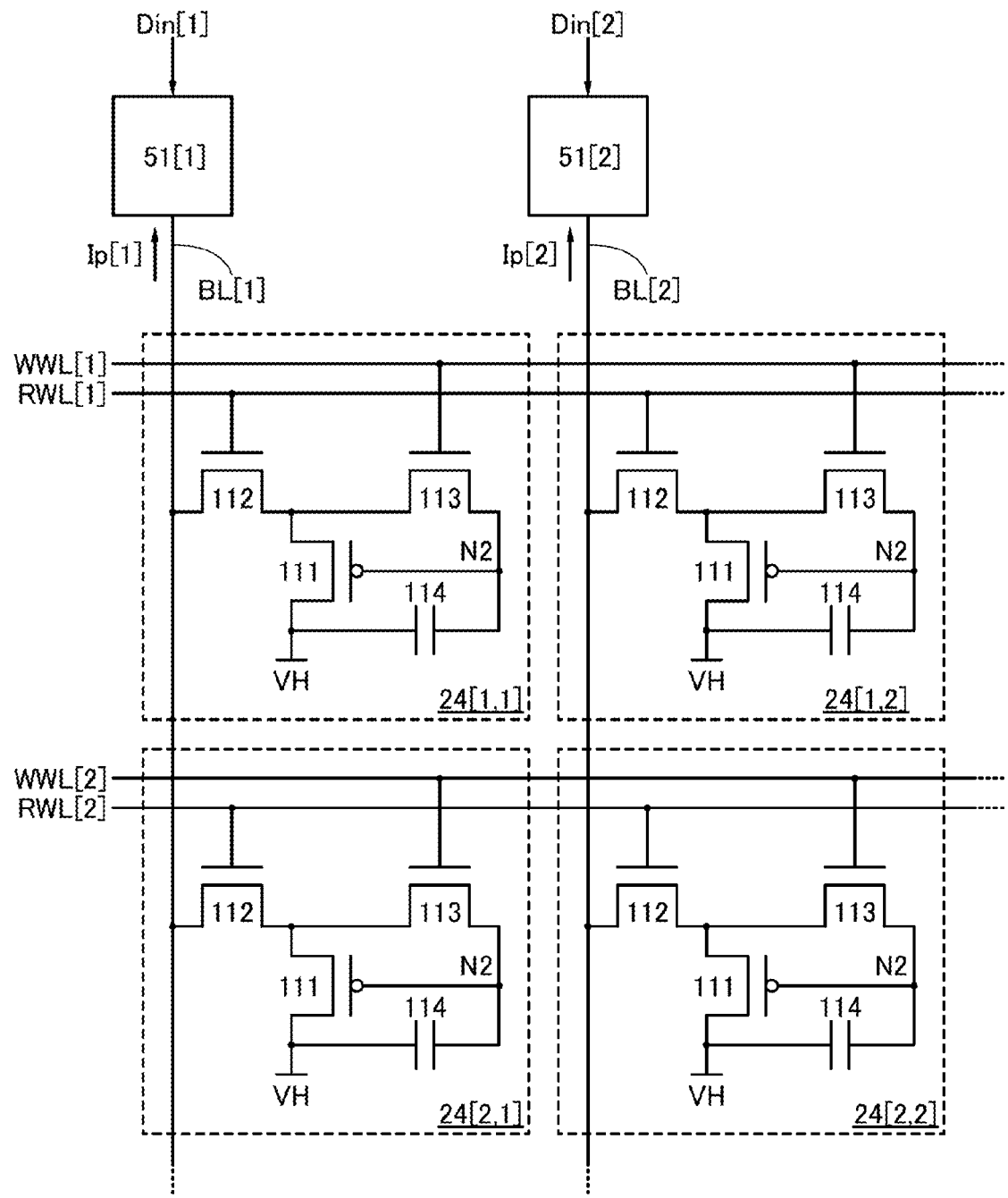
FIG. 10 illustrates a configuration example of a memory cell.

FIG. 8, FIG. 9, and FIG. 10 each illustrate a modification example of a memory cell which can be used for the semiconductor device 10. Note that the memory cells illustrated in FIG. 8, FIG. 9, and FIG. 10 can each have the same configuration as the memory cell 21 and can each operate in the same manner as the memory cell 21 except for the following points.

FIG. 8 illustrates a configuration of a memory cell 22. The memory cell 22 differs from the memory cell 21 illustrated in FIG. 2 in that the transistor 101 is a p-channel transistor and connected to the wiring VL supplied with a low power supply potential and in that a low-level potential is supplied to the wiring VR.

Writing, holding, and reading of data in the memory cell 22 is performed in the same manner as that in the memory cell 21. Note that a current flows in the transistor 101 in a direction from the node N1 to the wiring VL.

FIG. 9 illustrates a memory cell 23 which is a modification example of the memory cell 21. In the memory cell 23, the wiring VR is not provided, and the connection relation between elements is different from that in the memory cell 21.

The memory cell 23 includes a transistor 111, a transistor 112, a transistor 113, and a capacitor 114. A gate of the transistor 111 is connected to one of a source and a drain of the transistor 113; one of a source and a drain of the transistor 111 is connected to one of a source and a drain of the transistor 112 and the other of the source and the drain of the transistor 113; and the other of the source and the drain of the transistor 111 is connected to the wiring VL supplied with a low power supply potential. A gate and the other of the source and drain of the transistor 112 are connected to the wiring RWL and the wiring BL, respectively. A gate of the transistor 113 is connected to the wiring WWL. A first electrode of the capacitor 114 is connected to the other of the source and the drain of the transistor 111, and a second electrode of the capacitor 114 is connected to the gate of the transistor 111. A node connected to the second electrode of the capacitor 114 is referred to as a node N2.

A potential corresponding to data to be written to the memory cell 23 is held in the node N2. A current flows in the transistor 111 in a direction from the one of the source and the drain of the transistor 112 to the wiring VL.

FIG. 10 illustrates a configuration of a memory cell 24. The memory cell 24 differs from the memory cell 23 illustrated in FIG. 9 in that the transistor 111 is a p-channel transistor and connected to the wiring VH supplied with a high power supply potential.

Writing, holding, and reading of data in the memory cell 24 is performed in the same manner as that in the memory cell 23. Note that a current flows in the transistor 111 in a direction from the wiring VH to the one of the source and the drain of the transistor 112.

Figure 36:
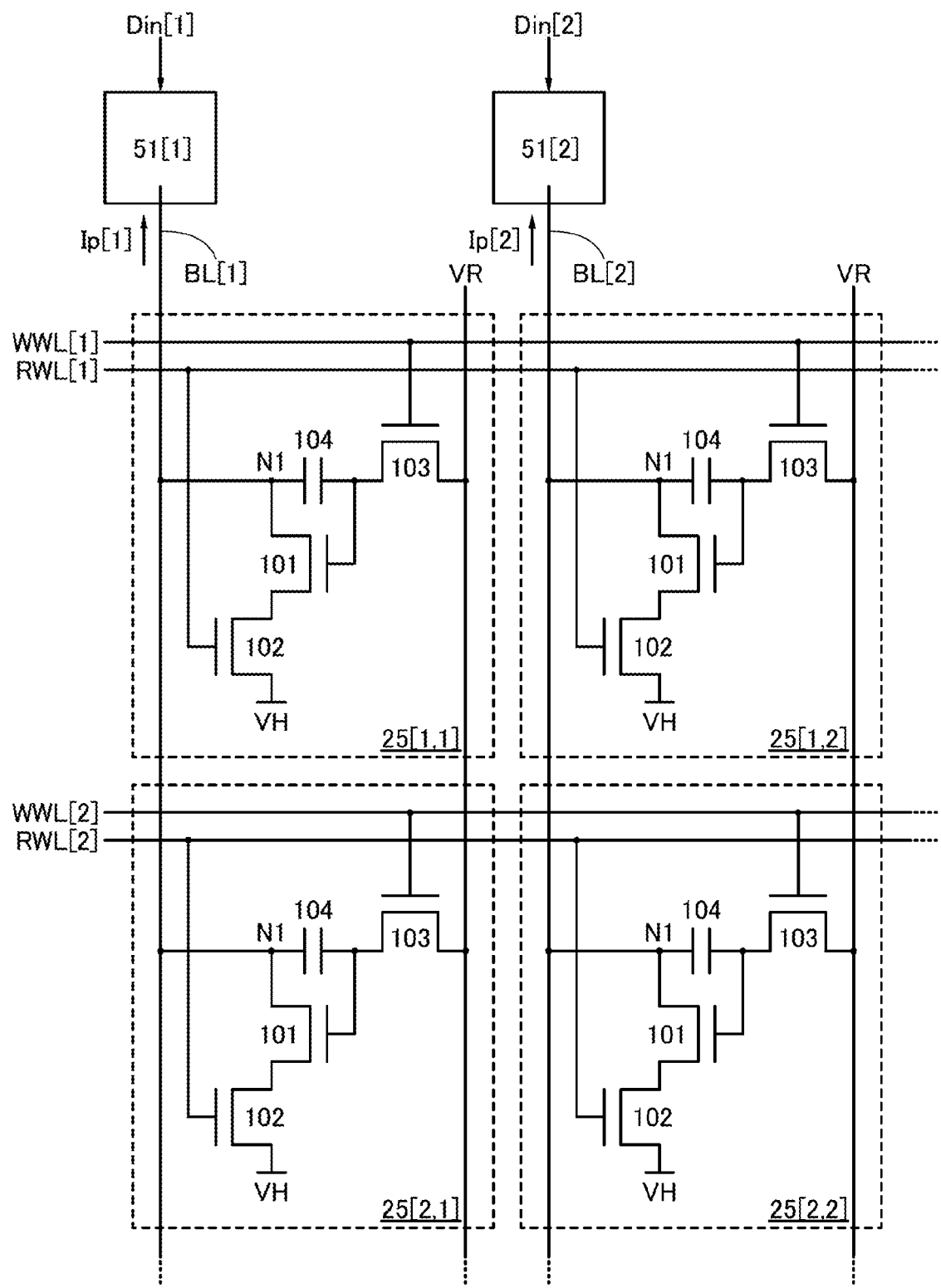
FIG. 36 illustrates a configuration example of a memory cell.

In the memory cell 21 illustrated in FIG. 2, the transistor 102 may be provided between the transistor 101 and the wiring VH. In the memory cell 22 illustrated in FIG. 8, the transistor 102 may be provided between the transistor 101 and the wiring VL. FIG. 36 illustrates a configuration of a memory cell 25 in which the transistor 102 is provided between the transistor 101 and the wiring VH.

Figure 37:
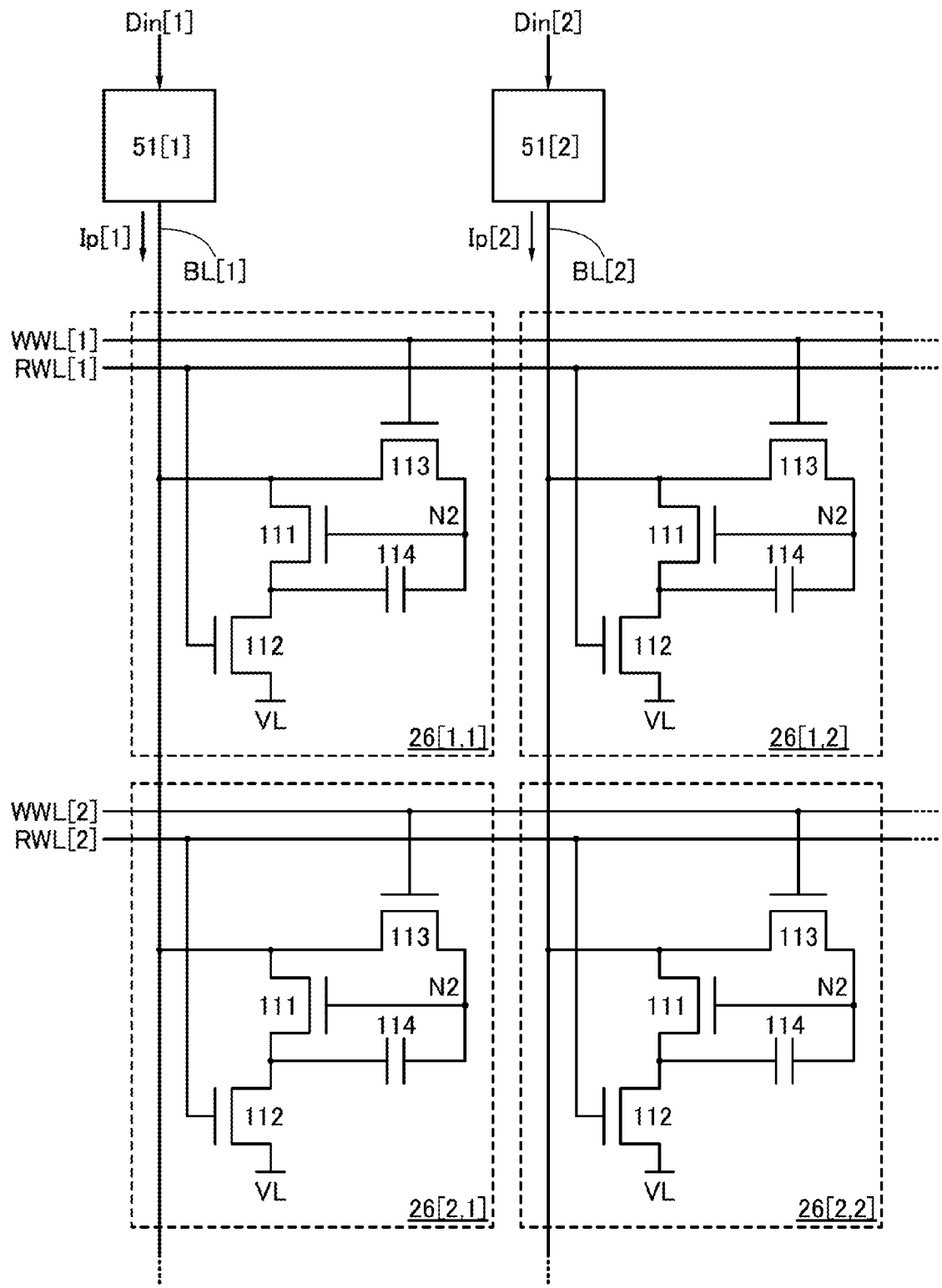
FIG. 37 illustrates a configuration example of a memory cell.

In the memory cell 23 illustrated in FIG. 9, the transistor 112 may be provided between the transistor 111 and the wiring VL. In the memory cell 24 illustrated in FIG. 10, the transistor 112 may be provided between the transistor 111 and the wiring VH. FIG. 37 illustrates a configuration of a memory cell 26 in which the transistor 112 is provided between the transistor 111 and the wiring VL.

<Modification Example of Data Processing Circuit>

Figure 11:
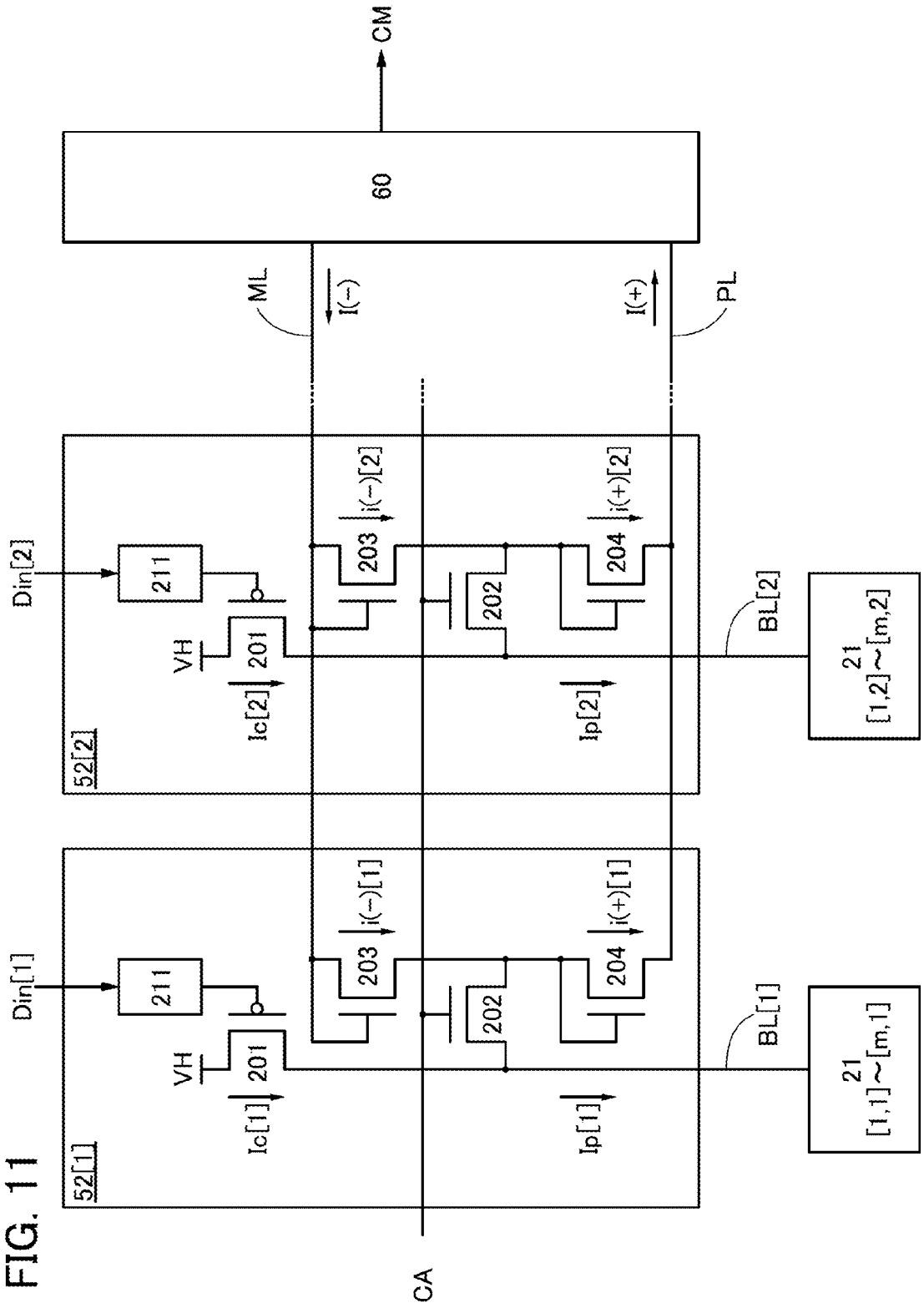
FIG. 11 illustrates a configuration example of an input circuit.

FIG. 11 illustrates a configuration of a circuit 52 which is a modification example of the circuit 51 provided in the data processing circuit 50. The circuit 52 differs from the circuit 51 illustrated in FIG. 3 in that the transistor 201 is a p-channel transistor and connected to the wiring VH supplied with a high power supply potential.

Writing and comparison of data in the circuit 52 is performed in the same manner as that in the circuit 51. Note that the current Ic and the current Ip flow in a direction from the wiring VH to the memory cell 21. In the case where the transistor in the memory cell is connected to the wiring VL supplied with a low power supply potential as illustrated in each of FIG. 8 and FIG. 9, the transistor 201 is preferably connected to the wiring VH supplied with a high power supply potential as illustrated in FIG. 11.

Figure 12:
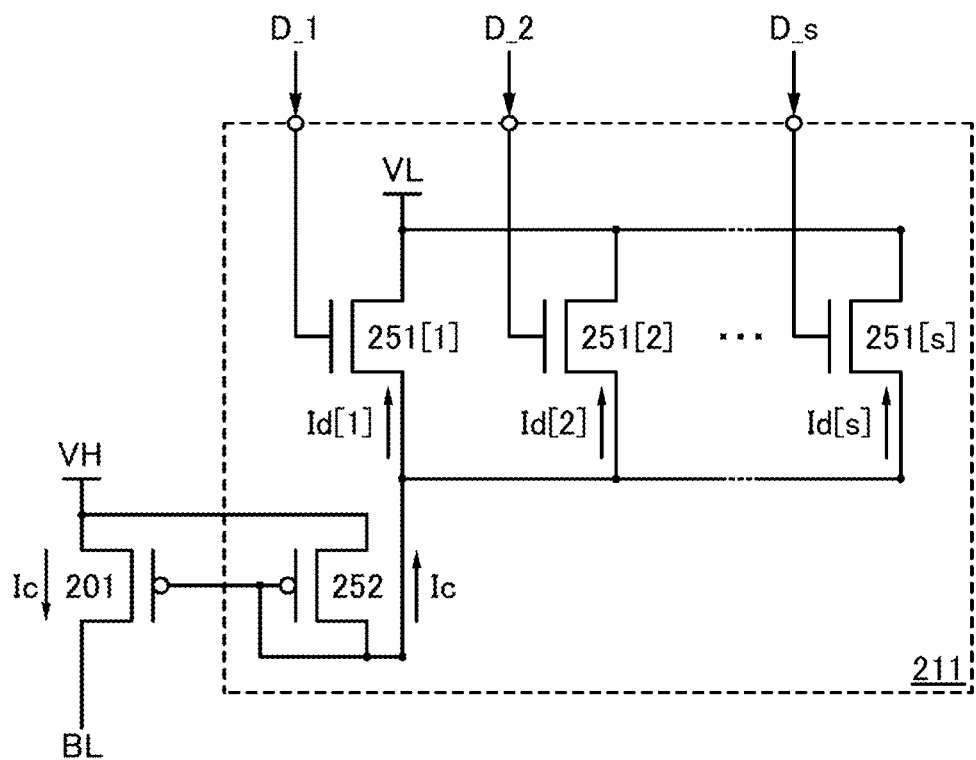
FIG. 12 illustrates a configuration example of a circuit.

FIG. 12 illustrates a configuration of a circuit 211 which is a modification example of the circuit 210 in FIG. 4. The circuit 211 differs from the circuit 210 illustrated in FIG. 4 in that the transistors 251[1] to 251[s] are n-channel transistors and connected to the wiring VL supplied with a low power supply potential and in that the transistor 252 is a p-channel transistor and connected to the wiring VH supplied with a high power supply potential.

The circuit 211 operates in the same manner as the circuit 210. Note that the direction in which the current Id[1] to the current Id[s] and the current Ic flow is opposite to that in the circuit 210. In the case where the transistor 201 is connected to the wiring VH supplied with a high power supply potential as illustrated in FIG. 11, the circuit 211 illustrated in FIG. 12 is preferably used.

This embodiment can be combined with any of the other embodiments as appropriate.

Embodiment 3

In this embodiment, a configuration example in which the semiconductor device described in the above embodiments is used as a memory device in a computer is described.

Figure 13A:
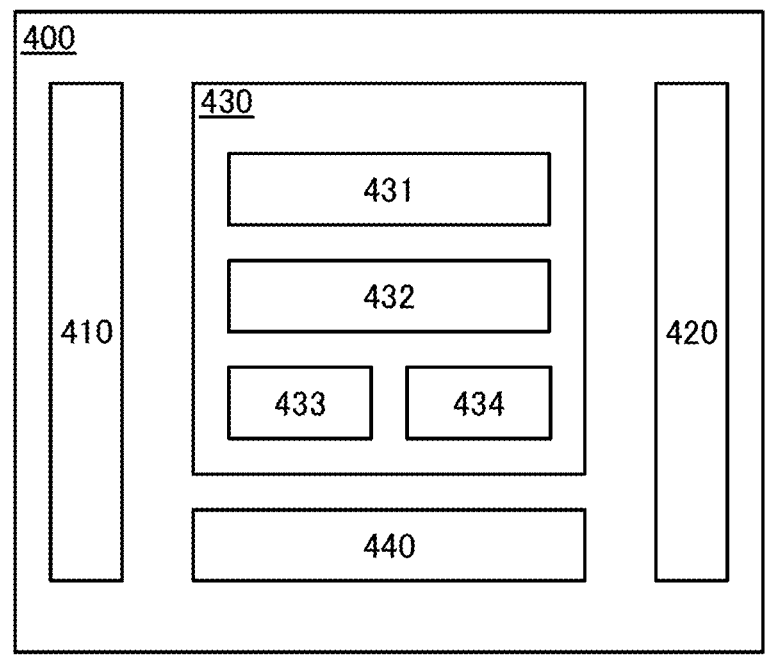
FIGS. 13A and 13B illustrate a configuration example of a computer and a configuration example of a cache memory.

FIG. 13A is a block diagram illustrating a configuration example of a computer.

A computer 400 includes an input device 410, an output device 420, a central processing unit 430, and a main memory device 440.

The central processing unit 430 includes a control circuit 431, an arithmetic circuit 432, a memory device 433, and a memory device 434.

The input device 410 has a function of receiving data from the outside of the computer 400. The output device 420 has a function of outputting data to the outside of the computer 400.

The control circuit 431 has a function of outputting control signals to the input device 410, the output device 420, the main memory device 440, the arithmetic circuit 432, the memory device 433, and the memory device 434. The arithmetic circuit 432 has a function of performing a calculation using input data. The memory device 433 can hold data used for a calculation in the arithmetic circuit 432 and thus serves as a register. The memory device 434 can store part of data in the main memory device 440 and serves as a cache memory.

The semiconductor device 10 in the above embodiments can be used as the memory device 433, the memory device 434, or the main memory device 440. Note that the memory device 434 is provided in the central processing unit 430 in FIG. 13A but may be provided outside the central processing unit 430 or both inside and outside the central processing unit 430. Alternatively, the plurality of memory devices 434 may be provided both inside and outside the central processing unit 430. In the case where the memory devices 434 are provided both inside and outside the central processing unit 430, the memory device 434 provided inside the central processing unit 430 can be used as a primary cache memory, and the memory device 434 provided outside the central processing unit 430 can be used as a secondary cache memory.

The memory devices 433 and 434 can operate at higher speed than the main memory device 440. The capacity of the main memory device 440 can be larger than that of the memory device 434, and the capacity of the memory device 434 can be larger than that of the memory device 433.

By provision of the memory device 434 serving as a cache memory, the processing speed of the central processing unit 430 can be improved.

Figure 13B:
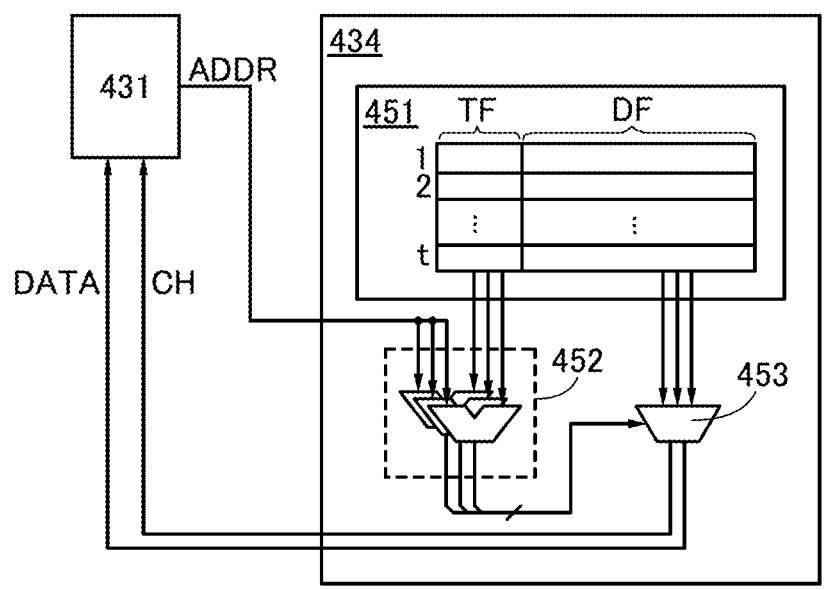

Next, the case where the memory device 434 is used as a cache memory is described in detail. FIG. 13B illustrates a configuration example of the memory device 434.

The memory device 434 includes a memory region 451, a comparator circuit 452, and a selection circuit 453. A copy of part of data stored in the main memory device 440 can be stored in the memory region 451. Specifically, the memory region 451 includes a plurality of memory regions (hereinafter also referred to as lines) capable of storing a predetermined amount of data. FIG. 13B illustrates an example in which the memory region 451 includes lines in t rows (t is a natural number). Each line includes a data field DF of a memory region where data is stored and a tag field TF of a memory region where an address corresponding to data stored in the data field DF is stored. Data stored in the tag field TF is referred to as tag data. A plurality of tag data can be stored in one line in the tag field TF.

The comparator circuit 452 has a function of comparing an address signal ADDR input from the control circuit 431 and tag data stored in the tag field TF and outputting the comparison result to the selection circuit 453. This comparison can determine whether a cache hit or a cache miss occurs.

The selection circuit 453 has a function of selecting data in a line where a cache hit occurs from data stored in the data field DF and outputting the data as a signal DATA to the control circuit 431. In addition, the selection circuit 453 has a function of outputting a signal CH including information on whether a cache hit or a cache miss occurs to the control circuit 431.

In the case where the comparison result of the address signal ADDR and the tag data in the comparator circuit 452 indicates that a cache hit occurs, data output from the selection circuit 453 to the control circuit 431 is used for processing in the central processing unit 430.

Next, a specific configuration example in which the semiconductor device 10 described in the above embodiments is used as a cache memory is described.

Figure 14A:
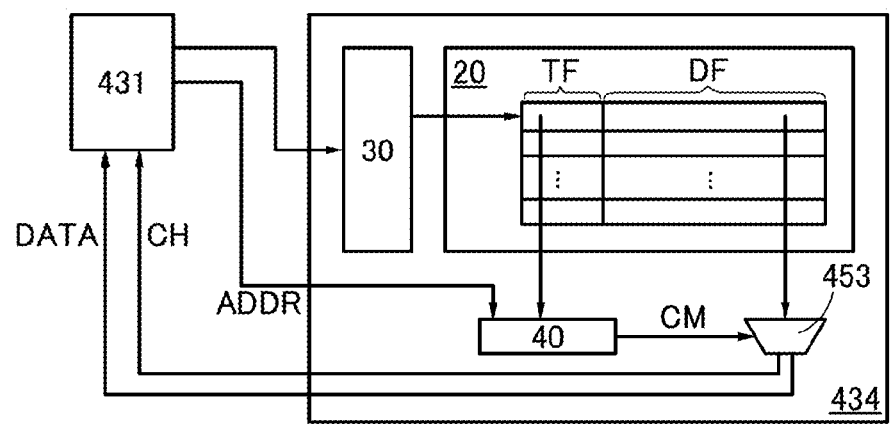
FIGS. 14A to 14C illustrate configuration examples of a cache memory.
Figure 14B:
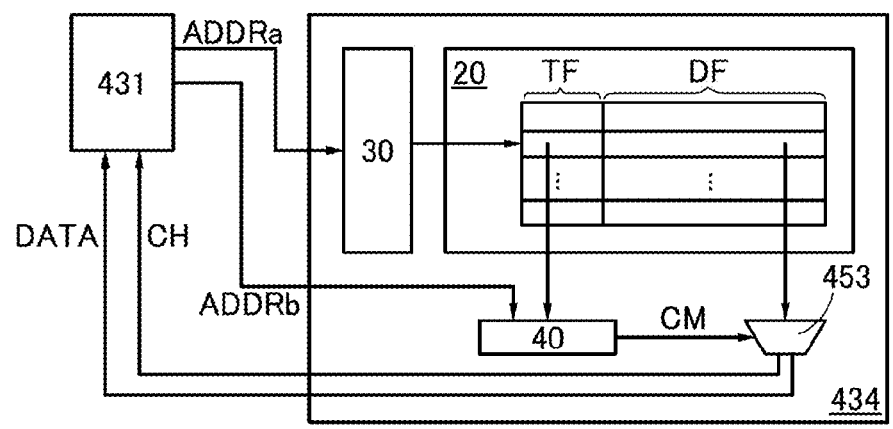
Figure 14C:
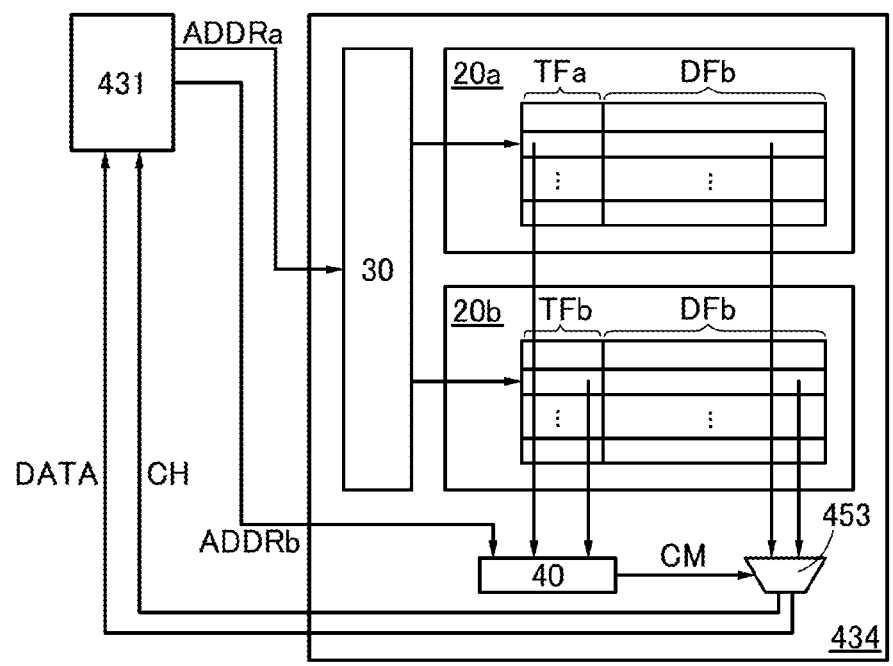

FIGS. 14A to 14C each illustrate a specific configuration example in which the semiconductor device 10 described in the above embodiments is used as the memory device 434. Here, the cell array 20 is used as the memory region 451, and the analog processing circuit 40 is used as the comparator circuit 452. The cell array 20 used as the memory region 451 includes the plurality of memory cells described in the above embodiments and has a function of storing a collection of the data Dm using the plurality of memory cells.

Tag data stored in the tag field TF corresponds to the collection of the data Dm stored in the cell array 20 used as the memory region 451. The address signal ADDR input from the control circuit 431 to the analog processing circuit 40 corresponds to a collection of the data Din in the above embodiment. The analog processing circuit 40 determines whether the tag data and the address signal ADDR match or not and outputs the determination result to the selection circuit 453 as the signal CM.

Note that although an example in which the tag field TF and the data field DF are provided in the same cell array 20 is shown here, the data field DF may be provided in a different cell array 20 or a different memory device. Alternatively, part of the tag field TF may be provided in a different cell array 20.

As a cache memory, a fully associative cache, a direct mapped cache, a set associative cache, and the like are given. The semiconductor device 10 can be used in any of the above structures. The structures are described below.

<Fully Associative Cache>

FIG. 14A illustrates a structure in which the semiconductor device 10 is used as a fully associative cache memory. In the fully associative cache, all bits of an address signal are stored in the tag field (in the case where a plurality of data are collectively stored in one line, a lower bit of an address signal is excluded, and the same applies hereinafter).

When there is access from the control circuit 431, an access signal is input to the driver circuit 30, and the driver circuit 30 sequentially selects the memory cells where tag data is stored. Thus, all tag data stored in the tag field TF is output to the analog processing circuit 40. Then, the analog processing circuit 40 sequentially compares the address signal ADDR input from the control circuit 431 and the tag data input from the tag field TF and outputs the comparison result to the selection circuit 453 as the signal CM.

Then, the signal DATA corresponding to data stored in the data field DF and the signal CH showing whether the data corresponds to the address signal ADDR or not (whether a cache hit occurs or not) are output from the selection circuit 453 to the control circuit 431. In the case where a cache hit occurs, the signal DATA output from the selection circuit 453 is used for processing in the central processing unit 430.

Note that in the fully associative cache, high storage capacity is required because all bits of an address signal need to be stored in the cell array 20. In the semiconductor device 10 of one embodiment of the present invention, an analog value can be stored accurately in the memory cell, and thus the storage capacity can be increased easily.

<Direct Mapped Cache>

FIG. 14B illustrates a structure in which the semiconductor device 10 is used as a direct mapped cache memory. In the direct mapped cache, a line where data is stored is uniquely determined by a signal ADDRa corresponding to one of an upper bit and a lower bit of an address signal, and a signal ADDRb corresponding to the other of the upper bit and the lower bit of the address signal is stored in the line.

When there is access from the control circuit 431, the signal ADDRa is input to the driver circuit 30. At this time, the driver circuit 30 selects memory cells corresponding to the line uniquely determined by the signal ADDRa. Then, tag data is read from the memory cells and output to the analog processing circuit 40. The signal ADDRb is output from the control circuit 431 to the analog processing circuit 40.

The analog processing circuit 40 compares the address signal ADDRb input from the control circuit 431 and the tag data read from the tag field TF in the line specified by the signal ADDRa, and outputs the comparison result to the selection circuit 453 as the signal CM.

Then, the signal DATA corresponding to the data stored in the data field DF in the line uniquely determined by the signal ADDRa and the signal CH showing whether the data corresponds to the address signal ADDRb or not (whether a cache hit occurs or not) are output from the selection circuit 453 to the control circuit 431. In the case where a cache hit occurs, the signal DATA output from the selection circuit 453 is used for processing in the central processing unit 430.

In the direct mapped cache, the operation speed of the central processing unit 430 may be decreased due to thrashing. However, the semiconductor device 10 of one embodiment of the present invention can compare data at high speed, and thus a decrease in the operation speed of the central processing unit 430 can be relieved.

<Set Associative Cache>

FIG. 14C illustrates a structure in which the semiconductor device 10 is used as a set associative cache memory. In the set associative cache, a line where data is stored is determined by the signal ADDRa corresponding to one of an upper bit and a lower bit of an address signal, and the signal ADDRb corresponding to the other of the upper bit and the lower bit of the address signal is stored in the line. Note that unlike the direct mapped cache, a plurality of lines are determined by the signal ADDRa. FIG. 14C illustrates a configuration example in which two sets of the cell arrays 20 (a cell array 20a and a cell array 20b) each including the tag field TF and the data field DF are provided and a line determined by the signal ADDRa exists in each of the cell array 20a and the cell array 20b.

When there is access from the control circuit 431, the signal ADDRa is input to the driver circuit 30. At this time, the driver circuit 30 selects memory cells in the cell array 20a, which correspond to the line determined by the signal ADDRa, and memory cells in the cell array 20b, which correspond to the line determined by the signal ADDRa. Then, tag data is read from each of the cell arrays 20a and 20b and output to the analog processing circuit 40. The signal ADDRb is output from the control circuit 431 to the analog processing circuit 40.

Note that the cell arrays 20a and 20b are driven by the same driver circuit 30 but may be driven by respective driver circuits.

The analog processing circuit 40 compares the address signal ADDRb input from the control circuit 431 and the two tag data read from the tag field TF in the line specified by the signal ADDRa and outputs the comparison result to the selection circuit 453 as the signal CM.

Then, the signal DATA corresponding to the data stored in the data field DF in the line determined by the signal ADDRa and the signal CH showing whether the data corresponds to the address signal ADDRb or not (whether a cache hit occurs or not) are output from the selection circuit 453 to the control circuit 431. In the case where a cache hit occurs, the signal DATA output from the selection circuit 453 is used for processing in the central processing unit 430.

Note that although two sets of the cell arrays 20 each including the tag field TF and the data field DF are provided in FIG. 14C, the number of sets is not particularly limited, and three or more sets can also be provided.

The set associative cache can be referred to as a cache in which both the fully associative cache and the direct mapped cache are employed. Accordingly, an effect obtained in the case where the semiconductor device 10 is used for a fully associative cache memory or a direct mapped cache memory can also be obtained in the case where the semiconductor device 10 is used for a set associative cache memory.

In each of FIGS. 14A to 14C, tag data is input to the analog processing circuit 40 as the data Din when the tag data is written to the tag field TF. By data writing described in the above embodiment, the tag data can be written to the memory cells included in the cell array 20.

When the semiconductor device 10 is used as the memory device 434, even in the case of using any of the above structures, an address signal and tag data can be compared accurately at high speed. Accordingly, the reliability and the operation speed of the computer 400 can be improved.

Note that although the semiconductor device 10 is used as a cache memory in this embodiment, an application example of the semiconductor device 10 is not limited to this example. For example, the semiconductor device 10 may be used as a translation look-aside buffer (TLB) or the like in a virtual memory.

This embodiment can be combined with any of the other embodiments as appropriate.

Embodiment 4

Described in this embodiment are transistors of one embodiment of the disclosed invention.

Note that the transistors of one embodiment of the present invention preferably include a c-axis aligned crystalline oxide semiconductor (CAAC-OS) film or a nanocrystalline oxide semiconductor (nc-OS) film described in Embodiment 6.

<Configuration Example 1 of Transistor>

Figure 15A:
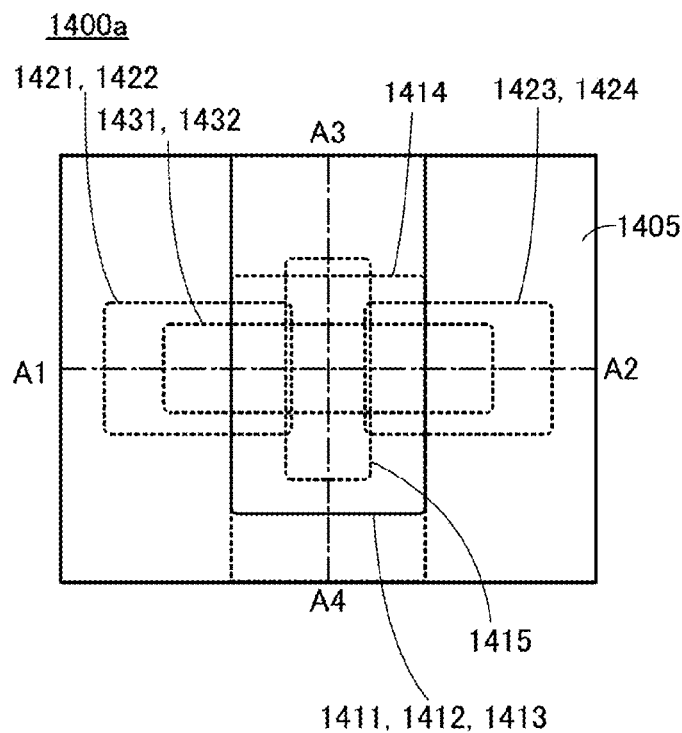
FIGS. 15A to 15C illustrate a configuration example of a transistor.
Figure 15B:
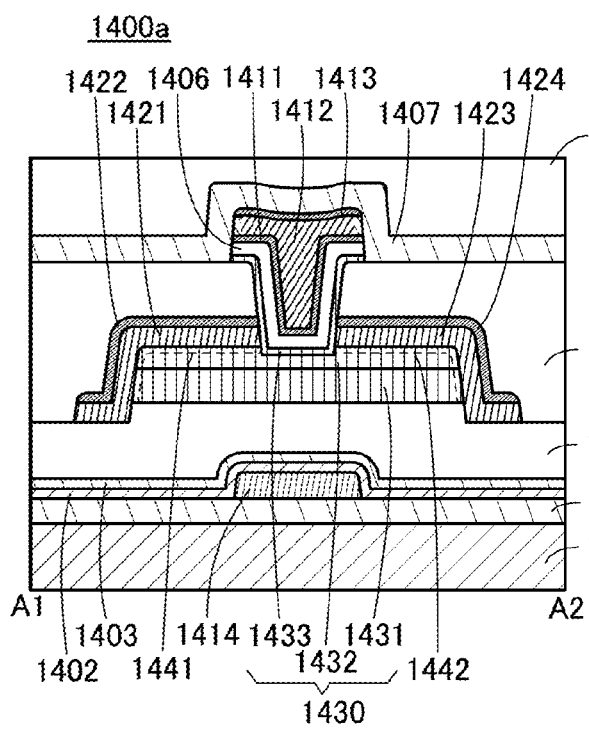
Figure 15C:
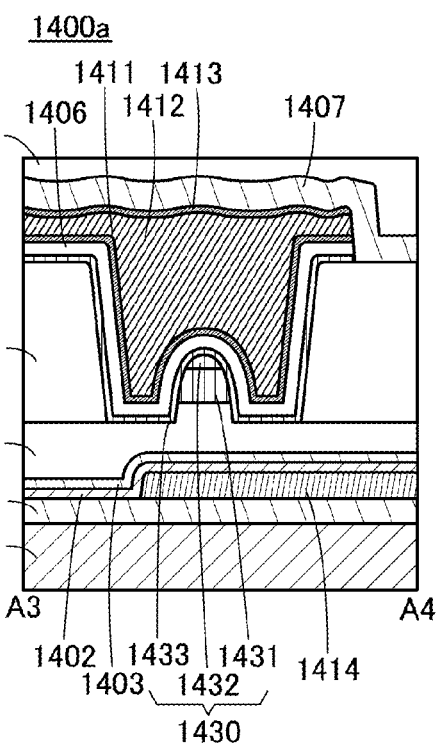

FIGS. 15A to 15C are a top view and cross-sectional views of a transistor 1400a. FIG. 15A is a top view. FIG. 15B is a cross-sectional view taken along dashed-dotted line A1-A2 in FIG. 15A, and FIG. 15C is a cross-sectional view taken along dashed-dotted line A3-A4 in FIG. 15A. Note that for simplification of the drawing, some components are not illustrated in the top view in FIG. 15A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 in contact with top and side surfaces of the metal oxide 1432, a conductive film 1423 also in contact with the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 in contact with the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405, 1407, and 1408 serve as a protective insulating film or an interlayer insulating film of the transistor 1400a.

As illustrated in FIG. 15C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Since a channel is formed in the entire metal oxide 1432 (bulk) in the s-channel structure, a large amount of current can flow between a source and a drain of a transistor, increasing the on-state current of the transistor.

The s-channel structure, because of its high on-state current, is suitable for a semiconductor device which requires a miniaturized transistor, such as a large-scale integrated (LSI) circuit. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As illustrated in FIG. 15B, the conductive films 1411 and 1422 have a region where they overlap with each other with the insulating film positioned therebetween. The conductive films 1411 and 1424 also have a region where they overlap with each other with the insulating film positioned therebetween. These regions serve as the parasitic capacitance caused between the gate electrode and the source or drain electrode and might decrease the operating speed of the transistor 1400a. This parasitic capacitance can be reduced by providing the insulating film 1405 in the transistor 1400a. The insulating film 1405 preferably contains a material with a low relative dielectric constant.

Figure 16A:
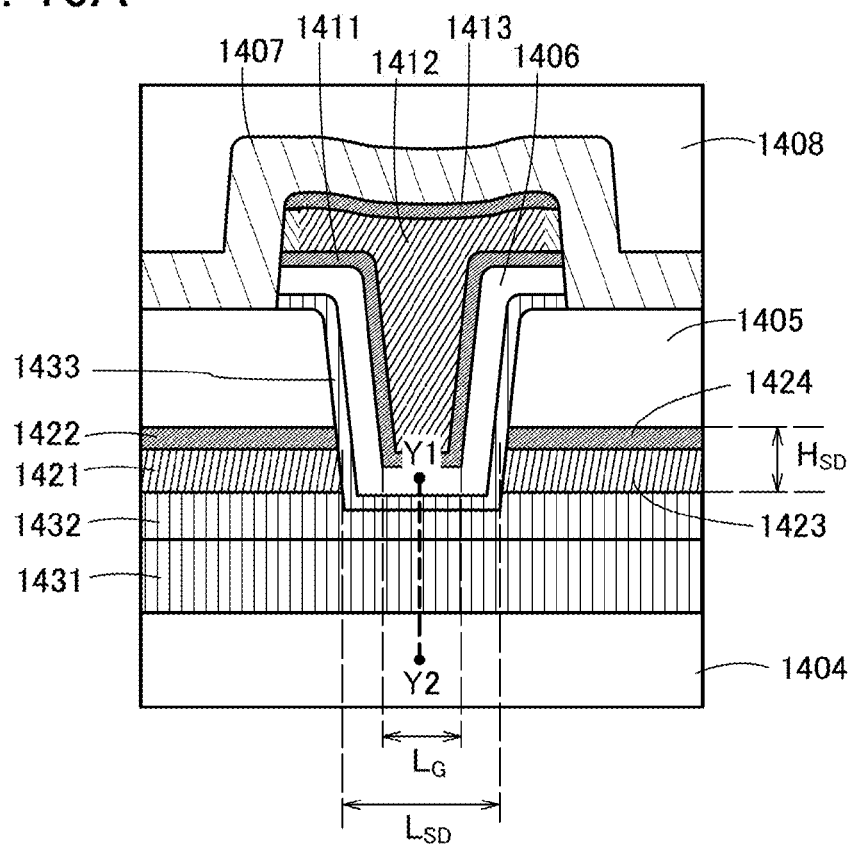
FIGS. 16A and 16B are a cross-sectional view and an energy band diagram showing a configuration example of a transistor.

FIG. 16A is an enlarged view of the center of the transistor 1400a. In FIG. 16A, a width $L_G$ denotes the length of the bottom surface of the conductive film 1411, which faces and lies parallel to the top surface of the metal oxide 1432 with the insulating film 1406 and the metal oxide 1433 positioned therebetween. The width $L_G$ is the line width of the gate electrode. In FIG. 16A, a width $L_{SD}$ denotes the length between the conductive films 1421 and 1423, i.e., the length between the source electrode and the drain electrode.

The width $L_{SD}$ is generally determined by the minimum feature size. As illustrated in FIG. 16A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal 5 nm and less than or equal 30 nm.

In FIG. 16A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal 30 nm, preferably less than or equal 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three or more times, and further preferably five or more times the thickness of the insulating film 1406, in which case the parasitic capacitance is negligibly small. As a result, the transistor 1400a can operate at high frequencies.

Components of the transistor 1400a will be described below.

[Metal Oxide]

First, a metal oxide that can be used as the metal oxides 1431 to 1433 will be described.

In the transistor 1400a, it is preferable that a current flowing between a source and a drain in an off state (off-state current) be low. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal 2.5 eV and less than or equal 4.2 eV, preferably greater than or equal to 2.8 eV and less than or equal 3.8 eV, more preferably greater than or equal 3 eV and less than or equal 3.5 eV.

The metal oxide 1432 is preferably a CAAC-OS film which is described later.

The metal oxides 1431 and 1433 include, for example, one or more, or two or more, elements other than oxygen included in the metal oxide 1432. Since the metal oxides 1431 and 1433 include one or more, or two or more, elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with an atomic ratio of In:M:Zn=1:3:2, 1:3:4, or the like can be used.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with an atomic ratio of In:M:Zn=1:1:1, 1:1:1.2, 2:1:3, 3:1:2, 4:2:4.1, or the like can be used. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 16B:
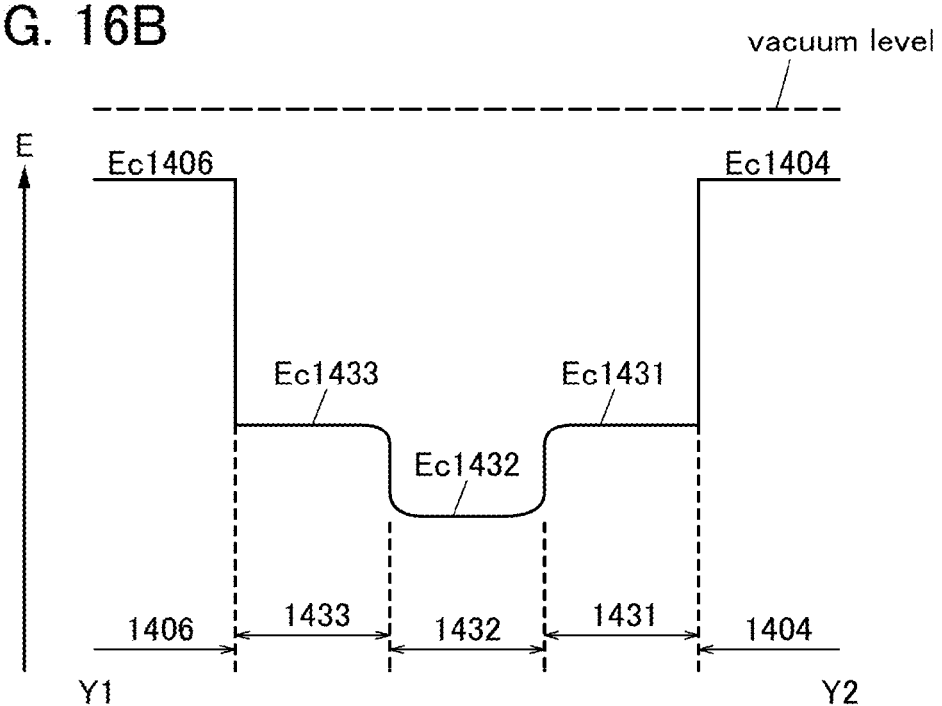

The function and effect of the metal oxide 1430, which includes a stack of the metal oxides 1431 to 1433, are described with reference to the energy band diagram of FIG. 16B. FIG. 16B shows an energy band structure of a portion taken along dashed line Y1-Y2 in FIG. 16A, that is, the energy band structure of a channel formation region of the transistor 1400a and the vicinity thereof.

In FIG. 16B, Ec1404, Ec1431, Ec1432, Ec1433, and Ec1406 indicate the energies at the bottoms of the conduction bands of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having an electron affinity higher than those of the metal oxides 1431 and 1433. For example, as the metal oxide 1432, a metal oxide having an electron affinity higher than those of the metal oxides 1431 and 1433 by greater than or equal 0.07 eV and less than or equal 1.3 eV, preferably greater than or equal 0.1 eV and less than or equal 0.7 eV, more preferably greater than or equal 0.15 eV and less than or equal 0.4 eV is used. Note that the electron affinity refers to an energy difference between the vacuum level and the bottom of the conduction band.

An indium gallium oxide has a small electron affinity and a high oxygen-blocking property. Therefore, the metal oxide 1433 preferably includes an indium gallium oxide. The gallium atomic ratio [Ga/(In+Ga)] is, for example, higher than or equal 70%, preferably higher than or equal 80%, more preferably higher than or equal 90%.

At this time, when gate voltage is applied, a channel is formed in the metal oxide 1432 having the highest electron affinity among the metal oxides 1431 to 1433.

At this time, electrons move mainly in the metal oxide 1432, not in the metal oxides 1431 and 1433. Hence, the on-state current of the transistor hardly varies even when the density of interface states, which inhibit electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. In some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical surface unevenness in a channel formation region is large. To increase the on-state current of the transistor, for example, the root mean square (RMS) roughness in a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) in the measurement area of 1 μm×1 μm is less than 1 nm, preferably less than 0.6 nm, more preferably less than 0.5 nm, still more preferably less than 0.4 nm. The maximum peak-to-valley height (P-V) in the measurement area of 1 μm×1 μm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies (also denoted by $V_O$), donor levels are formed by entry of hydrogen into sites of oxygen vacancies in some cases. A state in which hydrogen enters sites of oxygen vacancies is denoted by $V_O H$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal $1\times10^{16}$ atoms/cm$^3$ and lower than or equal $2\times10^{20}$ atoms/cm$^3$, preferably higher than or equal $1\times10^{16}$ atoms/cm$^3$ and lower than or equal $5\times10^{19}$ atoms/cm$^3$, more preferably higher than or equal $1\times10^{16}$ atoms/cm$^3$ and lower than or equal $1\times10^{19}$ atoms/cm$^3$, still more preferably higher than or equal $1\times10^{16}$ atoms/cm$^3$ and lower than or equal $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having oxygen permeability (a layer through which oxygen can pass or permeate).

Note that in the case where the transistor has an s-channel structure, a channel is formed in the entire metal oxide 1432. Therefore, as the metal oxide 1432 has a larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal 5 nm, more preferably less than or equal 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal 0.3 nm, preferably greater than or equal 1 nm and further preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal 10 nm, preferably greater than or equal 20 nm, more preferably greater than or equal 40 nm, still more preferably greater than or equal 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal 200 nm, preferably less than or equal 120 nm, more preferably less than or equal 80 nm, otherwise the productivity of the semiconductor device might be decreased.

For example, a region in which the concentration of silicon is higher than or equal $1\times10^{16}$ atoms/cm$^3$ and lower than $1\times10^{19}$ atoms/cm$^3$ is provided between the metal oxides 1432 and 1431. The concentration of silicon is preferably higher than or equal $1\times10^{16}$ atoms/cm$^3$ and lower than $5\times10^{18}$ atoms/cm$^3$, more preferably higher than or equal $1\times10^{16}$ atoms/cm$^3$ and lower than $2\times10^{18}$ atoms/cm$^3$. A region in which the concentration of silicon is higher than or equal $1\times10^{16}$ atoms/cm$^3$ and lower than $1\times10^{19}$ atoms/cm$^3$ is provided between the metal oxides 1432 and 1433. The concentration of silicon is preferably higher than or equal $1\times10^{16}$ atoms/cm$^3$ and lower than $5\times10^{18}$ atoms/cm$^3$, more preferably higher than or equal $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal $1\times10^{16}$ atoms/cm$^3$ and lower than or equal $2\times10^{20}$ atoms/cm$^3$. The concentration of hydrogen is preferably higher than or equal $1\times10^{16}$ atoms/cm$^3$ and lower than or equal $5\times10^{19}$ atoms/cm$^3$, more preferably higher than or equal $1\times10^{16}$ atoms/cm$^3$ and lower than or equal $1\times10^{19}$ atoms/cm$^3$, still more preferably higher than or equal $1\times10^{16}$ atoms/cm$^3$ and lower than or equal $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal $1\times10^{16}$ atoms/cm$^3$ and lower than $5\times10^{19}$ atoms/cm$^3$. The concentration of nitrogen is preferably higher than or equal $1\times10^{16}$ atoms/cm$^3$ and lower than or equal $5\times10^{18}$ atoms/cm$^3$, more preferably higher than or equal $1\times10^{16}$ atoms/cm$^3$ and lower than or equal $1\times10^{18}$ atoms/cm$^3$, still more preferably higher than or equal $1\times10^{16}$ atoms/cm$^3$ and lower than or equal $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal 250° C. and lower than or equal 650° C., preferably higher than or equal 450° C. and lower than or equal 600° C., further preferably higher than or equal 520° C. and lower than or equal 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, any one of the semiconductors given as examples of the metal oxides 1431 to 1433 may be provided over or below the metal oxide 1431 or over or below the metal oxide 1433, i.e., a four-layer structure may be employed. Alternatively, an n-layer structure (n is an integer of 5 or more) in which any one of the semiconductors given as examples of the metal oxides 1431 to 1433 is provided at two or more of the following positions may be employed: over the metal oxide 1431, below the metal oxide 1431, over the metal oxide 1433, and below the metal oxide 1433.

[Substrate]

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal 5 μm and less than or equal to 700 μm, preferably greater than or equal 10 μm and less than or equal 500 μm, more preferably greater than or equal 15 μm and less than or equal 300 μm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, a metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal $1 \times 10^{-3}$/K, lower than or equal $5 \times 10^{-5}$/K, or lower than or equal $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

[Base Insulating Film]

The insulating film 1401 has a function of electrically isolating the substrate 1450 from the conductive film 1414.

The insulating film 1401 or 1402 is formed using an insulating film having a single-layer structure or a layered structure. Examples of the material of the insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, an oxynitride refers to a compound that contains more oxygen than nitrogen, and a nitride oxide refers to a compound that contains more nitrogen than oxygen.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal $1.0 \times 10^{18}$ atoms/cm$^3$, preferably greater than or equal $3.0 \times 10^{20}$ atoms/cm$^3$ in thermal desorption spectroscopy (TDS) analysis. Note that the temperature of the film surface in the TDS analysis is preferably higher than or equal 100° C. and lower than or equal 700° C., or higher than or equal to 100° C. and lower than or equal 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

[Gate Electrode]

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

[Source Electrode and Drain Electrode]

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

[Low-Resistance Region]

The regions 1441 and 1442 are formed when, for example, the conductive films 1421 and 1423 extract oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier density in the regions 1441 and 1442. As a result, the resistance of the regions 1441 and 1442 is reduced.

[Gate Insulating Film]

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, a combination of silicon oxide or silicon oxynitride with an insulator with a high relative dielectric constant allows the layered structure to be thermally stable and have a high relative dielectric constant. For example, when aluminum oxide, gallium oxide, or hafnium oxide is on the metal oxide 1433 side, entry of silicon from silicon oxide or silicon oxynitride into the metal oxide 1432 can be suppressed.

When silicon oxide or silicon oxynitride is on the metal oxide 1433 side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

[Interlayer Insulating Film and Protective Insulating Film]

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing permeation of both oxygen and impurities such as hydrogen and moisture.

When the insulating film 1407 is formed using plasma containing oxygen by a sputtering method, a CVD method, or the like, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused through the insulating films to reach the metal oxide 1430, whereby oxygen vacancies in the metal oxide 1430 can be reduced.

Figure 17A:
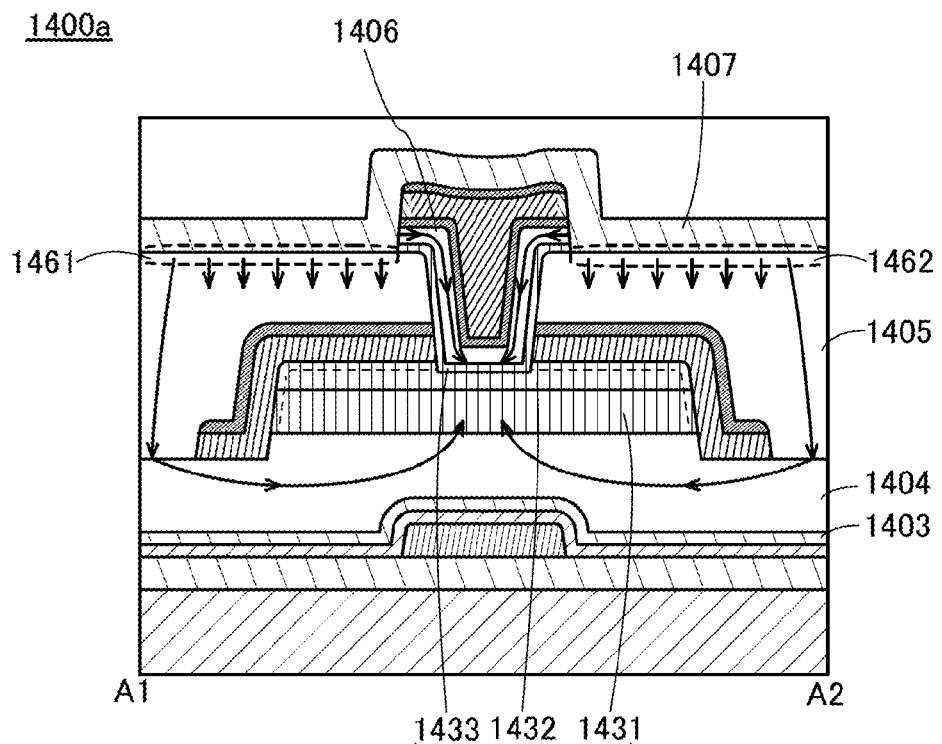
FIGS. 17A and 17B are cross-sectional views illustrating oxygen diffusion paths.
Figure 17B:
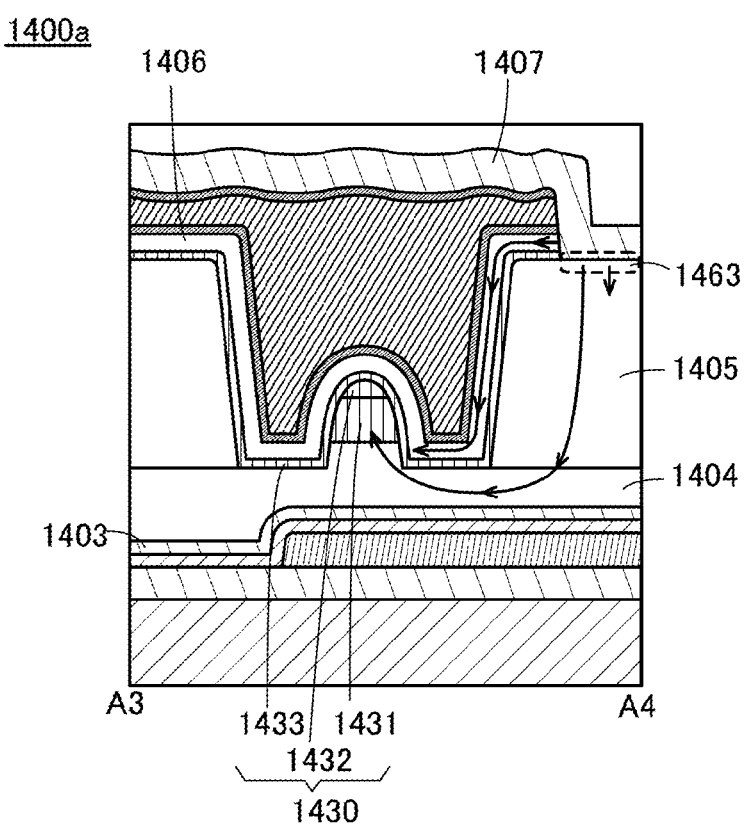

In schematic views of FIGS. 17A and 17B, oxygen added to the insulating films 1405 and 1406 in the formation of the insulating film 1407 is diffused through the insulating films by the second heat treatment and reaches the metal oxide 1430. In FIG. 17A, oxygen diffusion in the cross-sectional view of FIG. 15B is indicated by arrows. In FIG. 17B, oxygen diffusion in the cross-sectional view of FIG. 15C is indicated by arrows.

As illustrated in FIGS. 17A and 17B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused upward across the insulating film 1407. The insulating film 1403 also has a function of blocking oxygen and prevents oxygen from being diffused downward across the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal 20° C. and lower than or equal 150° C., preferably higher than or equal 40° C. and lower than or equal 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below by the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Configuration Example 2 of Transistor>

The conductive film 1414 and the insulating films 1402 and 1403 can be omitted in the transistor 1400a illustrated in FIGS. 15A to 15C. An example of such a structure is illustrated in FIGS. 18A to 18C.

Figure 18A:
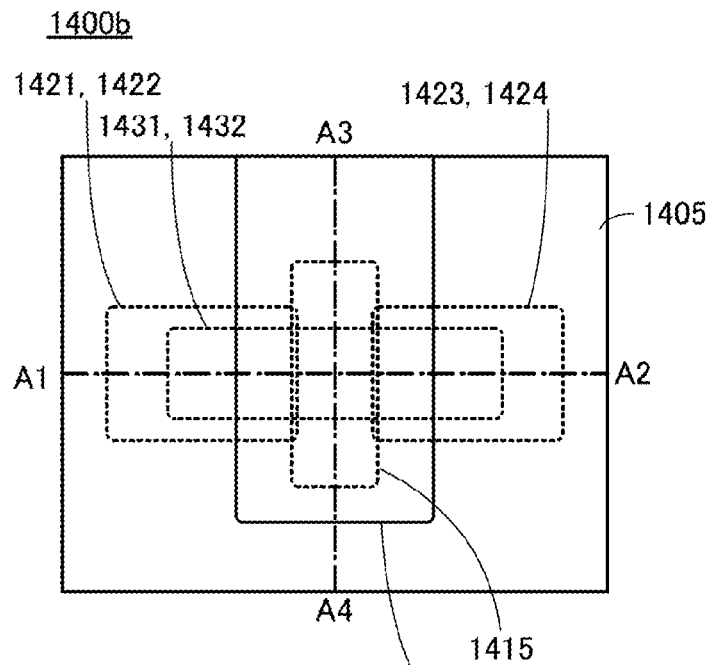
FIGS. 18A to 18C illustrate a configuration example of a transistor.
Figure 18B:
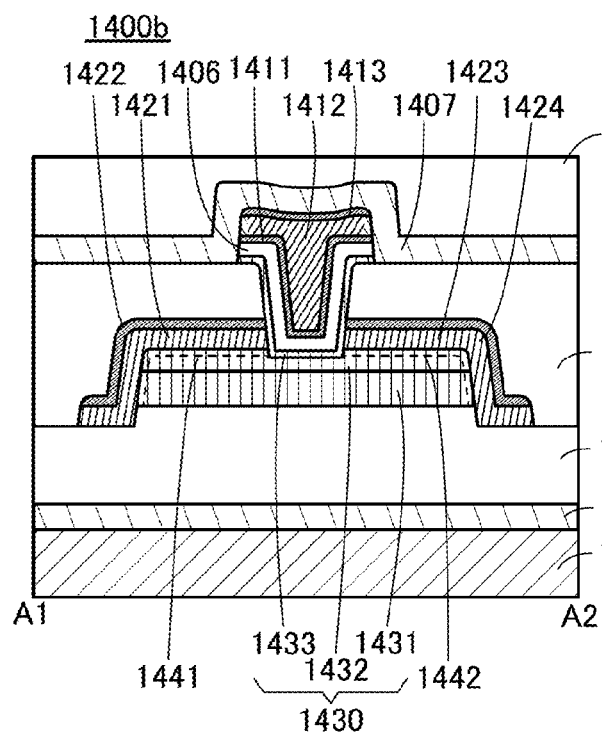
Figure 18C:
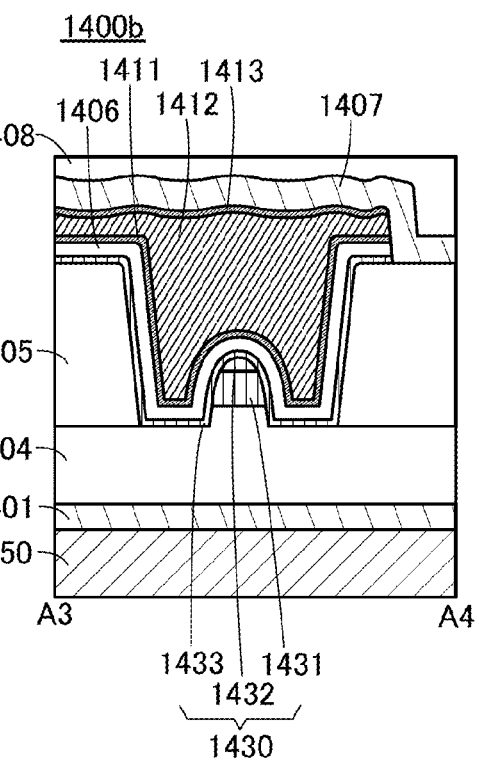

FIGS. 18A to 18C are a top view and cross-sectional views of a transistor 1400b. FIG. 18A is a top view. FIG. 18B is a cross-sectional view taken along dashed-dotted line A1-A2 in FIG. 18A, and FIG. 18C is a cross-sectional view taken along dashed-dotted line A3-A4 in FIG. 18A. Note that for simplification of the drawing, some components are not illustrated in the top view in FIG. 18A. Note that the dashed-dotted line A1-A2 and the dashed-dotted line A3-A4 are sometimes referred to as a channel length direction of the transistor 1400b and a channel width direction of the transistor 1400b, respectively.

In the transistor 1400a illustrated in FIGS. 15A to 15C, parts of the conductive films 1421 and 1423 that overlap with the gate electrode (the conductive films 1411 to 1413) can be reduced in thickness. An example of such a structure is illustrated in FIGS. 19A to 19C.

Figure 19A:
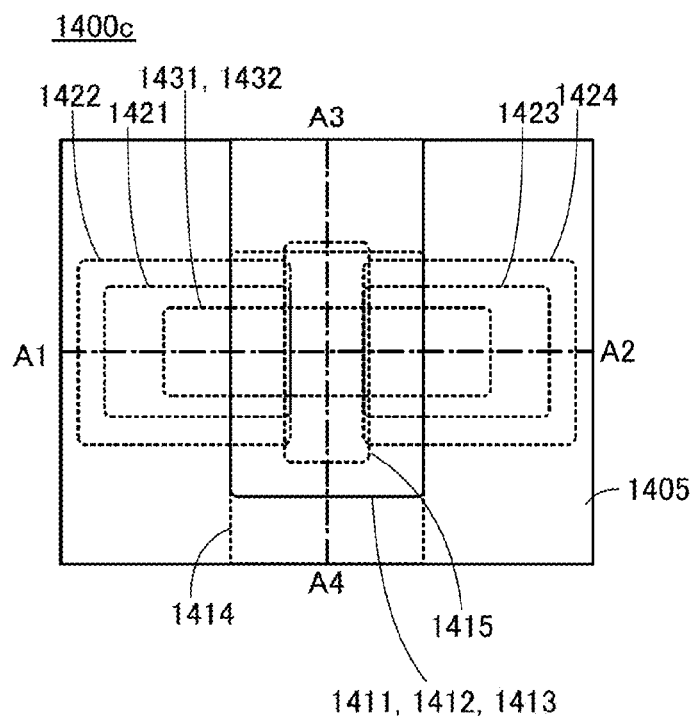
FIGS. 19A to 19C illustrate a configuration example of a transistor.
Figure 19B:
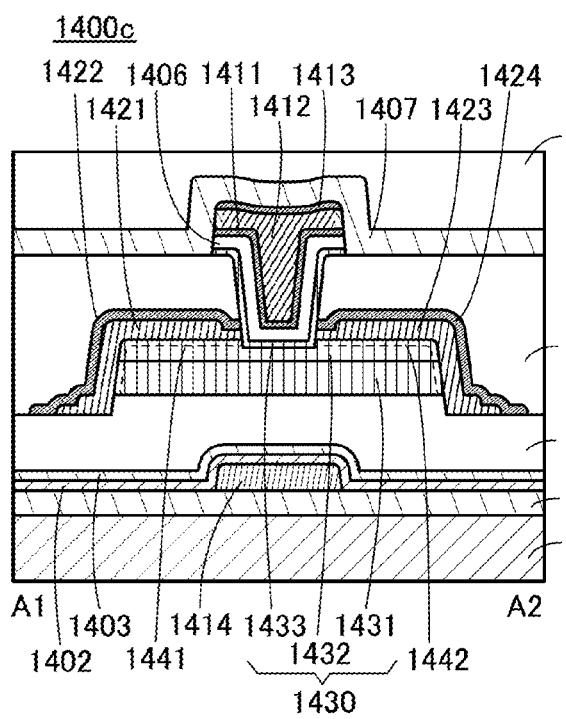
Figure 19C:
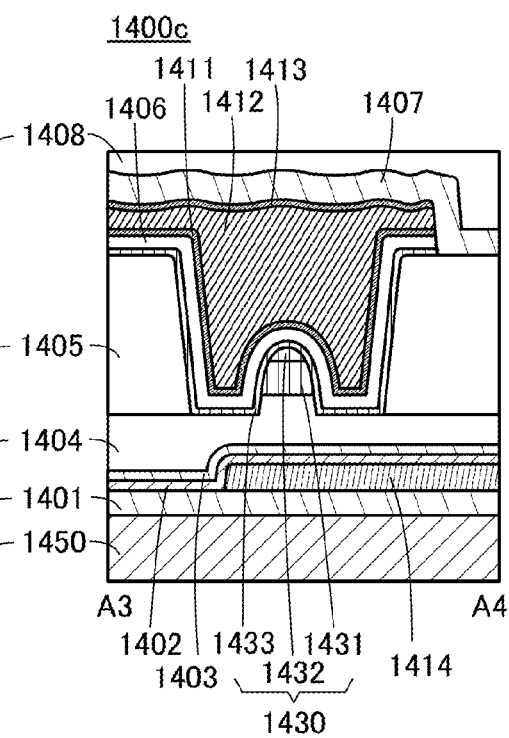

FIGS. 19A to 19C are a top view and cross-sectional views of a transistor 1400c. FIG. 19A is a top view. FIG. 19B is a cross-sectional view taken along dashed-dotted line A1-A2 in FIG. 19A, and FIG. 19C is a cross-sectional view taken along dashed-dotted line A3-A4 in FIG. 19A. Note that for simplification of the drawing, some components are not illustrated in the top view in FIG. 19A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c illustrated in FIG. 19B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure illustrated in FIG. 19B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Configuration Example 3 of Transistor>

In the transistor 1400c illustrated in FIGS. 19A to 19C, the width of the metal oxides 1431 and 1432 can be increased in the A3-A4 direction. An example of such a structure is illustrated in FIGS. 20A to 20C.

Figure 20A:
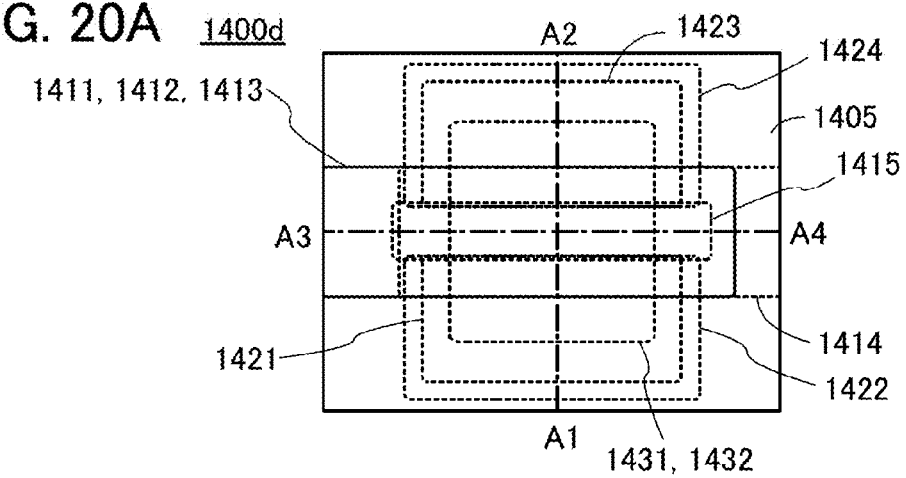
FIGS. 20A to 20C illustrate a configuration example of a transistor.
Figure 20B:
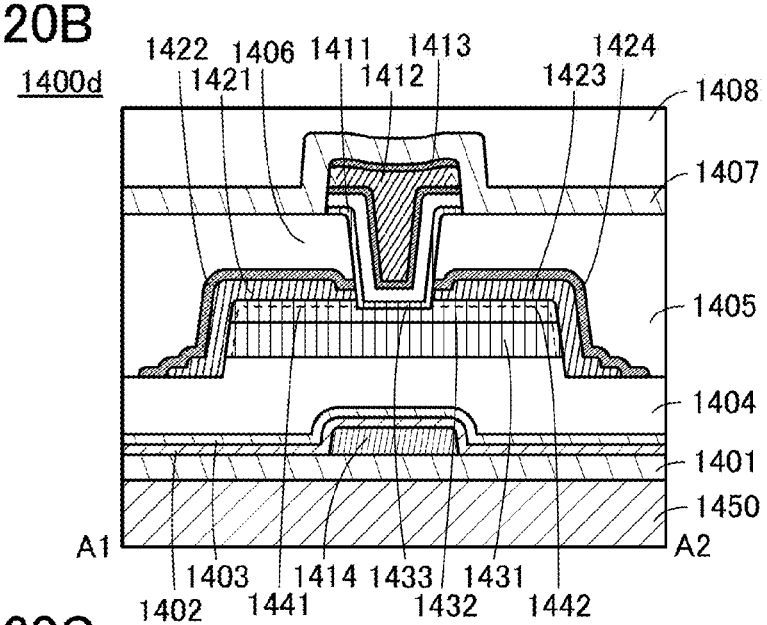
Figure 20C:
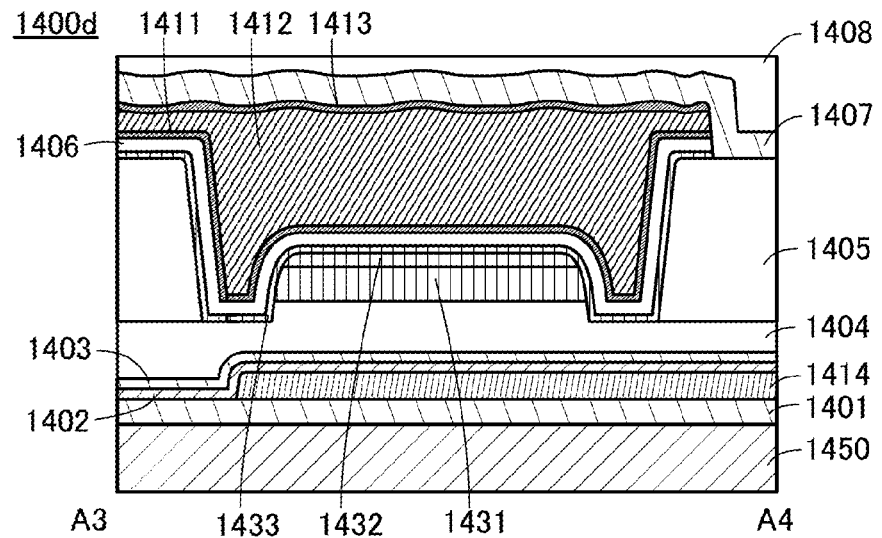

FIGS. 20A to 20C are a top view and cross-sectional views of a transistor 1400d. FIG. 20A is a top view. FIG. 20B is a cross-sectional view taken along dashed-dotted line A1-A2 in FIG. 20A, and FIG. 20C is a cross-sectional view taken along dashed-dotted line A3-A4 in FIG. 20A. Note that for simplification of the drawing, some components are not illustrated in the top view in FIG. 20A. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure illustrated in FIGS. 20A to 20C, can have an increased on-state current.

<Configuration Example 4 of Transistor>

In the transistor 1400c illustrated in FIGS. 19A to 19C, a plurality of regions (hereinafter referred to as fins) consisting of the metal oxides 1431 and 1432 may be provided in the A3-A4 direction. An example of such a structure is illustrated in FIGS. 21A to 21C.

FIGS. 21A to 21C are a top view and cross-sectional views of a transistor 1400e. FIG. 21A is a top view. FIG. 21B is a cross-sectional view taken along dashed-dotted line A1-A2 in FIG. 21A, and FIG. 21C is a cross-sectional view taken along dashed-dotted line A3-A4 in FIG. 21A. Note that for simplification of the drawing, some components are not illustrated in the top view in FIG. 21A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

<Configuration Example 5 of Transistor>

Figure 22A:
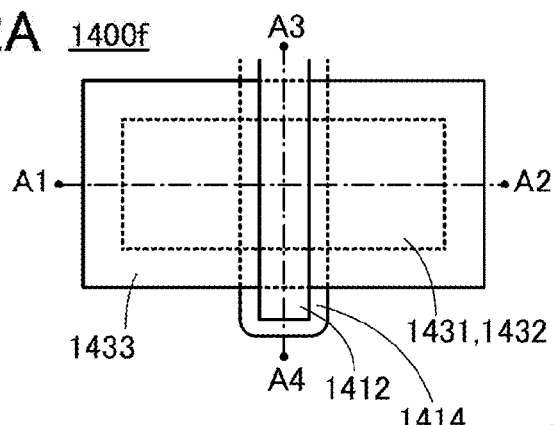
FIGS. 22A to 22D illustrate a configuration example of a transistor.
Figure 22B:
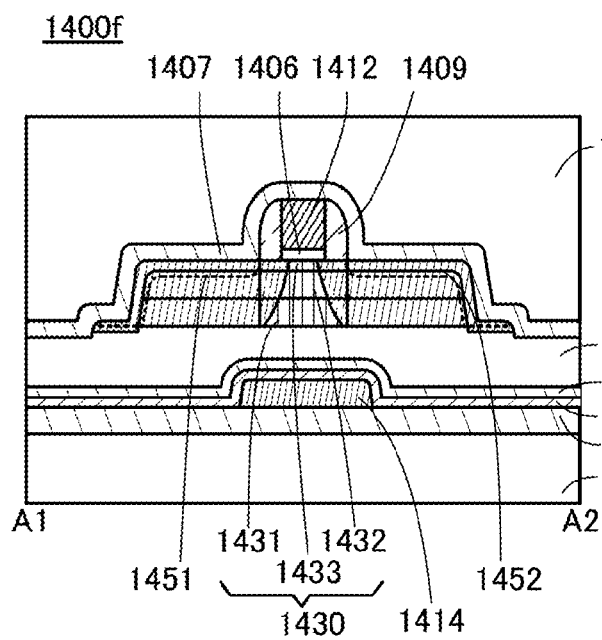
Figure 22C:
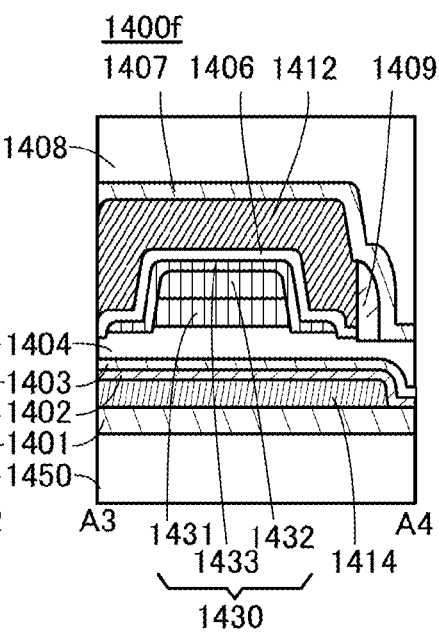

FIGS. 22A to 22D are a top view and cross-sectional views of a transistor 1400f. FIG. 22A is a top view of the transistor 1400f. FIG. 22B is a cross-sectional view taken along dashed-dotted line A1-A2 in FIG. 22A, and FIG. 22C is a cross-sectional view taken along dashed-dotted line A3-A4 in FIG. 22A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1407. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, the conductive film 1412 serves as a gate electrode of the transistor 1400f, and the insulating film 1409 serves as a sidewall insulating film of the transistor 1400f.

The metal oxide 1432 has a region where it overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this example is not limited to the one in which the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

Figure 22D:
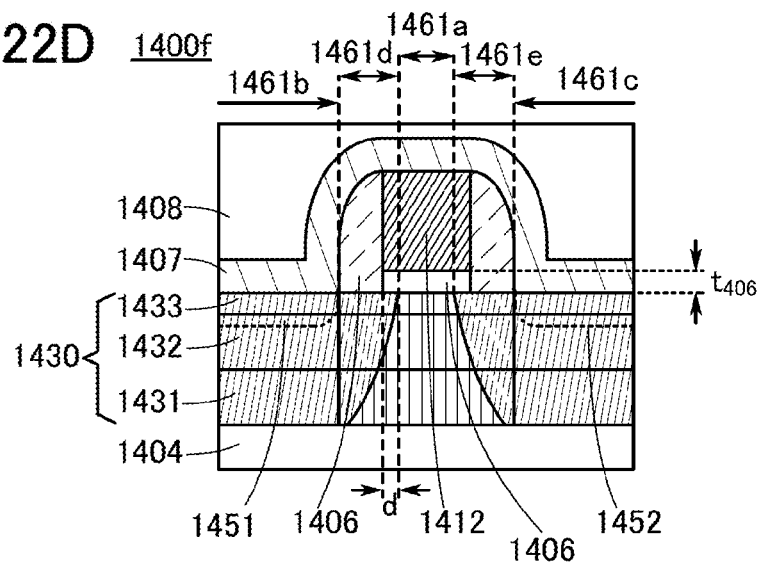

FIG. 22D is an enlarged view of part of FIG. 22B. As illustrated in FIG. 22D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal 5%, less than or equal 2%, or less than or equal 1% of the maximum concentration of a dopant in the region 1461b or 1461c. Instead of the term "dopant," the term "donor," "acceptor," "impurity," or "element" may be used.

As illustrated in FIG. 22D, the region 1461a is a region substantially overlapping with the conductive film 1412, and the region 1461b, the region 1461c, the region 1461d, and the region 1461e are regions except the region 1461a in the metal oxide 1430. In the regions 1461b and 1461c, the top surface of the metal oxide 1433 is in contact with the insulating film 1407. In the regions 1461d and 1461e, the top surface of the metal oxide 1433 is in contact with the insulating film 1409 or the insulating film 1406. Thus, as illustrated in FIG. 22D, the boundary between the region 1461b and the region 1461d overlaps with the boundary between the insulating film 1407 and the side edge of the insulating film 1409. The same applies to the boundary between the regions 1461c and 1461e. It is preferable that the region 1461d and the region 1461e partly overlap with a region (channel formation region) in which the metal oxide 1432 overlaps with the conductive film 1412. For example, the side edges of the region 1461d and the region 1461e in the channel length direction are preferably positioned inward from the side edge of the conductive film 1412 by a distance d. In that case, the thickness $t_{406}$ of the insulating film 1406 and the distance d preferably satisfy $0.25t_{406} < d < t_{406}$.

As described above, the region 1461d and the region 1461e are partly formed in a region in which the metal oxide 1430 overlaps with the conductive film 1412. Accordingly, the channel formation region of the transistor 1400f is in contact with the regions 1461d and 1461e having low resistance, and thus, high-resistance offset regions are not formed between the region 1461a and the regions 1461d and 1461e. As a result, the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conductive.

The region 1461b, the region 1461c, the region 1461d, and the region 1461e are formed by ion doping treatment such as an ion implantation method. Therefore, as illustrated in FIG. 22D, the positions of the side edges of the regions 1461d and 1461e in the channel length direction are sometimes shifted to the side edge of the metal oxide 1430 in the channel length direction in a deeper area from the top surface of the metal oxide 1433. The distance d in that case is the distance between the side edge of the conductive film 1412 in the channel length direction and each of the side edges of the regions 1461d and 1461e that are closest to the inner part of the conductive film 1412.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. It is preferable that the low-resistance region 1451 and the low-resistance region 1452 be partly and substantially in contact with a region (channel formation region) of the metal oxide 1432 overlapping with the conductive film 1412 or partly overlap with the region.

Since a large region of the metal oxide 1433 is in contact with the insulating film 1407, the low-resistance region 1451 and the low-resistance region 1452 are likely to be formed in the metal oxide 1433. The concentration of the element contained in the insulating film 1407 is higher in the low-resistance region 1451 and the low-resistance region 1452 included in the metal oxide 1433 than in a region of the metal oxide 1433 other than the low-resistance region 1451 and the low-resistance region 1452 (e.g., a region of the metal oxide 1433 overlapping with the conductive film 1412).

The low-resistance region 1451 is formed in the region 1461b, and the low-resistance region 1452 is formed in the region 1461c. Ideally, the metal oxide 1430 has a structure in which the concentration of an added element is the highest in the low-resistance regions 1451 and 1452, the second highest in the regions 1461b and 1461c to 1461e other than the low-resistance regions 1451 and 1452, and the lowest in the region 1461a. The added element refers to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 are not necessarily formed in the case where the regions 1461b and 1461c have a sufficiently low resistance.

<Configuration Example 6 of Transistor>

Figure 23A:
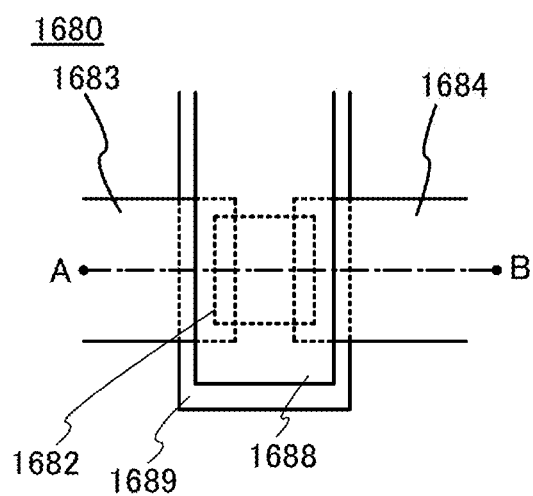
FIGS. 23A and 23B illustrate a configuration example of a transistor.
Figure 23B:
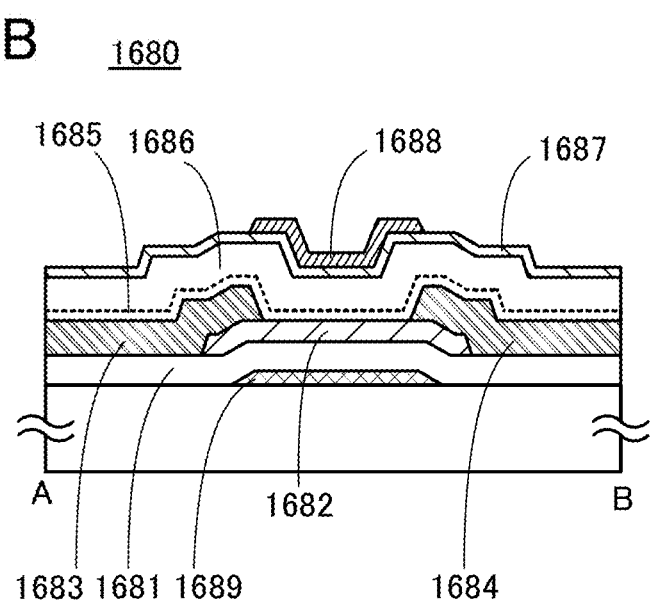

FIGS. 23A and 23B are a top view and a cross-sectional view of a transistor 1680. FIG. 23A is a top view, and FIG. 23B is a cross-sectional view taken along dashed-dotted line A-B in FIG. 23A. Note that for simplification of the drawings, some components are increased or reduced in size, or omitted in FIGS. 23A and 23B. Note that the direction of the dashed-dotted line A-B is sometimes referred to as a channel length direction.

The transistor 1680 illustrated in FIG. 23B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 15A to 15C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of threshold voltage. Note that the conductive film 1688 is unnecessary in some cases.

The description of the metal oxide 1432 in FIGS. 15A to 15C can be referred to for the details of the semiconductor 1682. The semiconductor 1682 may be a single layer or a stack including a plurality of semiconductor layers.

The description of the conductive films 1421 to 1424 in FIGS. 15A to 15C can be referred to for the details of the conductive films 1683 and 1684.

The description of the insulating film 1406 in FIGS. 15A to 15C can be referred to for the details of the insulating film 1681.

The insulating films 1685 to 1687 are sequentially stacked over the semiconductor 1682 and the conductive films 1683 and 1684 in FIG. 23B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as illustrated in FIG. 23B. The insulating film 1685 preferably allows oxygen to pass therethrough, and causes little damage to the semiconductor 1682 when the insulating film 1685 is formed compared with the case of the insulating film 1686. If damage to the semiconductor 1682 can be reduced and the insulating film 1686 can be formed directly on the semiconductor 1682, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has a blocking effect of preventing diffusion of oxygen, hydrogen, and water. Alternatively, the insulating film 1687 preferably has a blocking effect of preventing diffusion of hydrogen and water.

As an insulating film has higher density and becomes denser or has a fewer dangling bonds and becomes more chemically stable, the insulating film has a more excellent blocking effect. An insulating film that has a blocking effect of preventing diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has a blocking effect of preventing diffusion of hydrogen and water can be formed using, for example, silicon nitride or silicon nitride oxide.

In the case where the insulating film 1687 has a blocking effect of preventing diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has a blocking effect of preventing diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

This embodiment can be combined with any of the other embodiments as appropriate.

Embodiment 5

In this embodiment, configuration examples of a transistor or the like that can be applied to the semiconductor device 10 described in the above embodiment will be described with reference to FIGS. 24A and 24B, FIGS. 25A and 25B, FIGS. 26A and 26B, and FIGS. 27A and 27B.
<Cross-Sectional View 1>

FIGS. 24A and 24B are partial cross-sectional views of the semiconductor device 10. FIG. 24A illustrates a cross section in a channel length direction of the transistor included in the semiconductor device 10. FIG. 24B illustrates a cross section in a channel width direction of the transistor included in the semiconductor device 10.

A transistor TrA can correspond to the transistor 101 in each of FIG. 2 and FIG. 8 or the transistor 111 in each of FIG. 9 and FIG. 10. A transistor TrB and a transistor TrC can correspond to the transistor 102 and the transistor 103 in each of FIG. 2 and FIG. 8 or the transistor 112 and the transistor 113 in each of FIG. 9 and FIG. 10, for example. However, the transistors TrA, TrB, and TrC are not limited to the above transistors and can be used as the transistors described in the above embodiments.

The semiconductor device 10 illustrated in FIGS. 24A and 24B includes layers L1, L2, L3, L4, L5, L6, L7, L8, L9, L10, L11, and L12 in order from the bottom.

The layer L1 includes a substrate 1700, a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not illustrated).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not illustrated).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulator 1753.

The layer L12 includes a plurality of wirings such as a wiring 1737.

The OS transistor described in Embodiment 4 is preferably used as the transistors TrB and TrC. In FIGS. 24A and 24B, the transistor 1400c illustrated in FIGS. 19A to 19C is used as the transistors TrB and TrC.

The transistor TrA is preferably formed using a semiconductor material different from that for the transistors TrB and TrC. In FIGS. 24A and 24B, a Si transistor is used as the transistor TrA.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate. In FIGS. 24A and 24B, as an example, a single crystal silicon wafer is used as the substrate 1700.

Figure 26A:
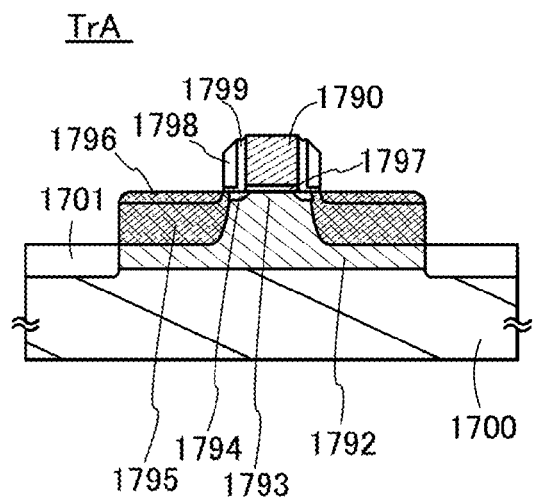
FIGS. 26A and 26B each illustrate a configuration example of a transistor.
Figure 26B:
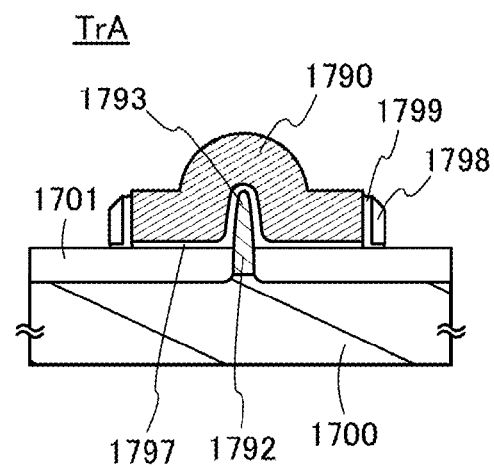

The transistor TrA is described in detail with reference to FIGS. 26A and 26B. FIG. 26A is a cross-sectional view of the transistor TrA in the channel length direction, and FIG. 26B is a cross-sectional view of the transistor TrA in the channel width direction. The transistor TrA includes a channel formation region 1793 formed in a well 1792, low-concentration impurity regions 1794 and high-concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like.

In the transistor TrA in FIG. 26B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 27A:
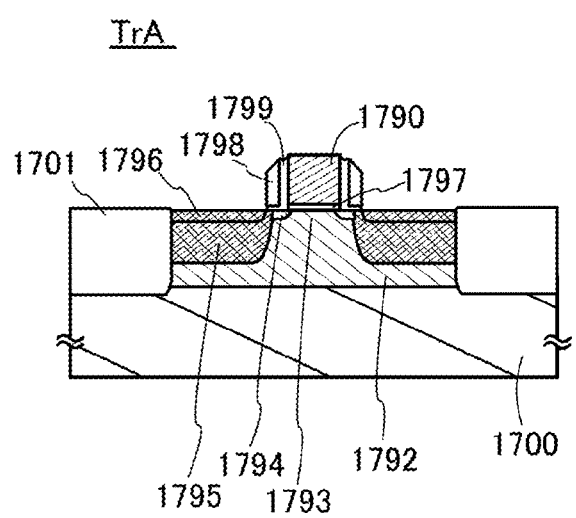
FIGS. 27A and 27B each illustrate a configuration example of a transistor.
Figure 27B:
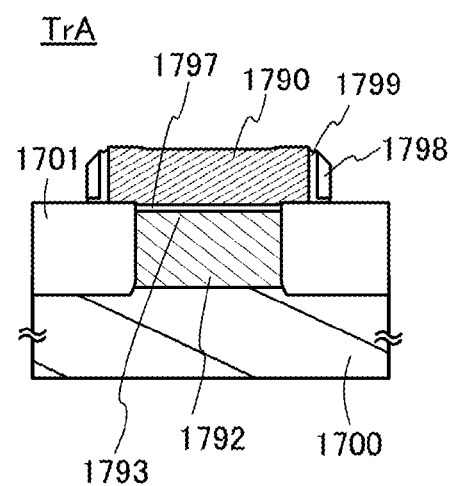

Note that the transistor TrA is not limited to the FIN-type transistor, and may be a planar-type transistor illustrated in FIGS. 27A and 27B. FIG. 27A is a cross-sectional view of the transistor TrA in the channel length direction, and FIG. 27B is a cross-sectional view of the transistor TrA in the channel width direction. The reference numerals in FIGS. 27A and 27B are the same as those shown in FIGS. 26A and 26B.

In FIGS. 24A and 24B, the insulators 1702 to 1706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors TrB and TrC. Examples of insulators having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

In FIGS. 24A and 24B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used.

In the case where an OS transistor is used as the transistor 101 shown in the above embodiment, the transistor 101 is preferably formed in the layer L4 or L7. In the case where memory cells 21 are stacked as illustrated in FIG. 8, the transistor 101 of one memory cell 21 may be formed in the layer L4 and the transistor 101 of another memory cell 21 may be formed in the layer L7.

With the structure illustrated in FIGS. 24A and 24B, the area occupied by the semiconductor device 10 can be reduced, leading to a higher level of integration of the memory cells.

<Cross-Sectional View 2>

All the OS transistors in the semiconductor device 10 may be formed in the same layer. FIGS. 25A and 25B illustrate an example in that case. Like FIGS. 24A and 24B, FIG. 25A illustrates a cross section in a channel length direction of the transistor included in the memory cell 21 of the semiconductor device 10, and FIG. 25B illustrates a cross section in a channel width direction of the transistor included in the memory cell 21 of the semiconductor device 10.

The cross-sectional views of FIGS. 25A and 25B are different from those of FIGS. 24A and 24B in that the layers L6 to L8 are omitted and the layer L9 is formed on the layer L5. For the other details in FIGS. 25A and 25B, the description of FIGS. 24A and 24B can be referred to.

With the structure illustrated in FIGS. 25A and 25B, the production process of the semiconductor device 10 can be simplified.

Note that although one transistor TrA is illustrated in each of FIG. 24 and FIG. 25, the plurality of transistors TrA may be provided in a layer L1. For example, in FIG. 25, two transistors TrA can be provided in the layer L1, and one transistor TrB can be provided in a layer L4. In this case, the two transistors TrA can correspond to the transistors 101 and 102 in each of FIG. 2 and FIG. 8 or the transistors 111 and 112 in each of FIG. 9 and FIG. 10, for example. The transistor TrB can correspond to the transistor 103 in each of FIG. 2 and FIG. 8 or the transistor 113 in each of FIG. 9 and FIG. 10, for example.

This embodiment can be combined with any of the other embodiments as appropriate.

Embodiment 6

Described in this embodiment are structures of an oxide semiconductor film capable of being used for the OS transistors described in the above embodiments.

In this specification, the term "parallel" indicates that the angle formed between two straight lines is greater than or equal to −10° and less than or equal 10°, and accordingly also includes the case where the angle is greater than or equal to −5° and less than or equal 5°. In addition, the term "substantially parallel" indicates that the angle formed between two straight lines is greater than or equal to −30° and less than or equal 30°. The term "perpendicular" indicates that the angle formed between two straight lines is greater than or equal 80° and less than or equal 100°, and accordingly also includes the case where the angle is greater than or equal 85° and less than or equal 95°. In addition, the term "substantially perpendicular" indicates that the angle formed between two straight lines is greater than or equal 60° and less than or equal 120°. In this specification, trigonal and rhombohedral crystal systems are included in a hexagonal crystal system.

<Structure of Oxide Semiconductor>

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 31A:
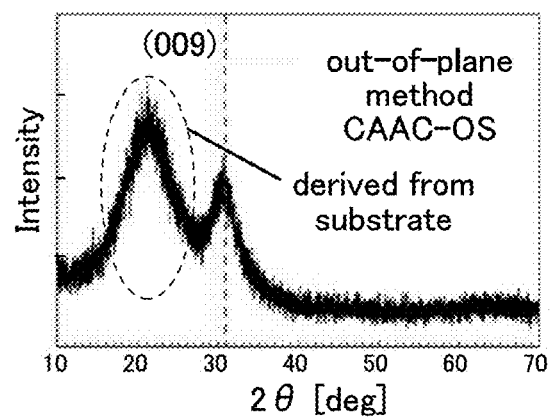
FIGS. 31A to 31E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 31A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 31B:
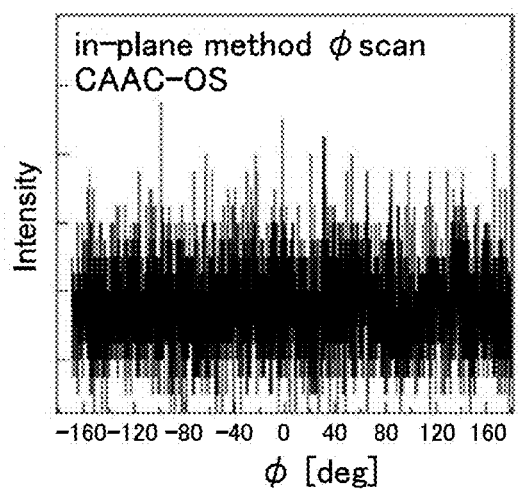
Figure 31C:
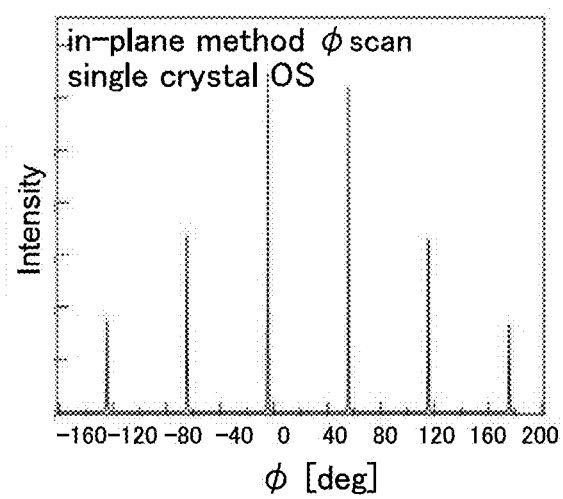

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (ϕ scan) is performed with 2θ fixed at around 56° and with the sample rotated using a normal vector to the sample surface as an axis (ϕ axis), as shown in FIG. 31B, a peak is not clearly observed. In contrast, in the case where single crystal $InGaZnO_4$ is subjected to ϕ scan with 2θ fixed at around 56°, as shown in FIG. 31C, six peaks that are derived from crystal planes equivalent to the (110) plane are observed. Accordingly, the structural analysis using XRD shows that the directions of a-axes and b-axes are irregularly oriented in the CAAC-OS.

Figure 31D:
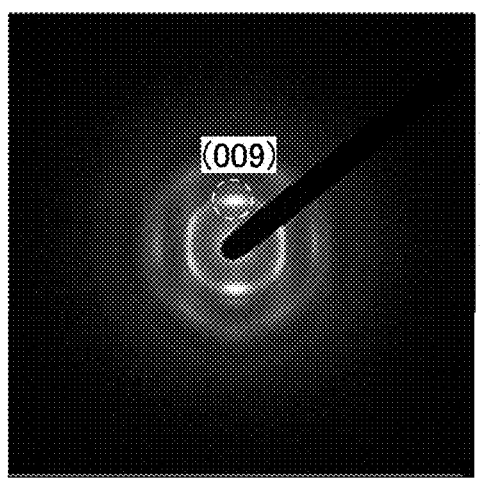
Figure 31E:
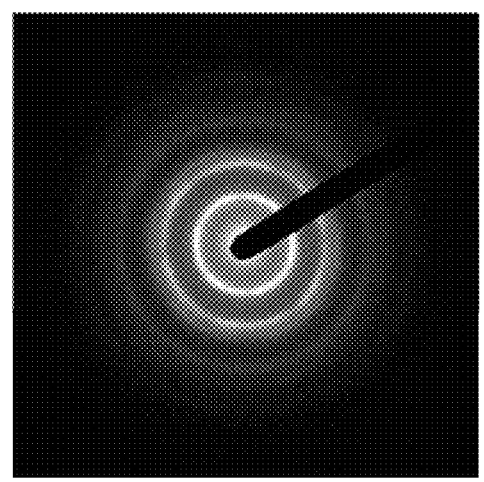

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 31D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 31E shows a diffraction pattern obtained in such a manner that an electron beam with a probe diameter of 300 nm is incident on the same sample in a direction perpendicular to the sample surface. As shown in FIG. 31E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 31E is considered to be derived from the (010) plane, the (100) plane, and the like of the $InGaZnO_4$ crystal. The second ring in FIG. 31E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 32A:
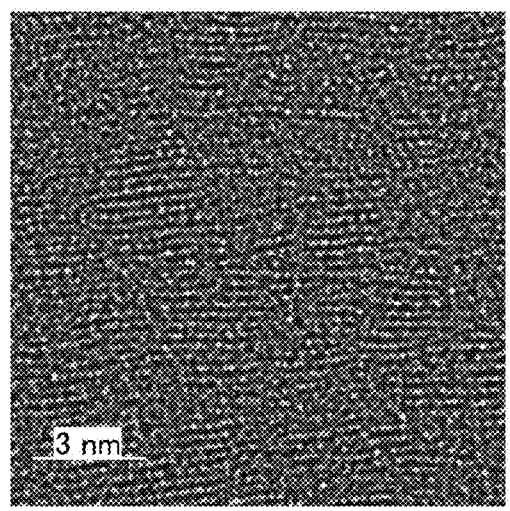
FIGS. 32A to 32E show a cross-sectional TEM image and plan-view TEM images of a CAAC-OS and images obtained through analysis thereof.

FIG. 32A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 32A shows pellets in which metal atoms are arranged in a layered manner. FIG. 32A proves that the size of a pellet is greater than or equal 1 nm or greater than or equal 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 32B:
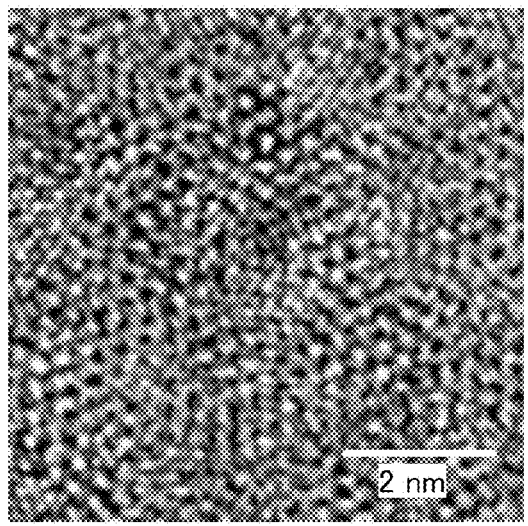
Figure 32C:
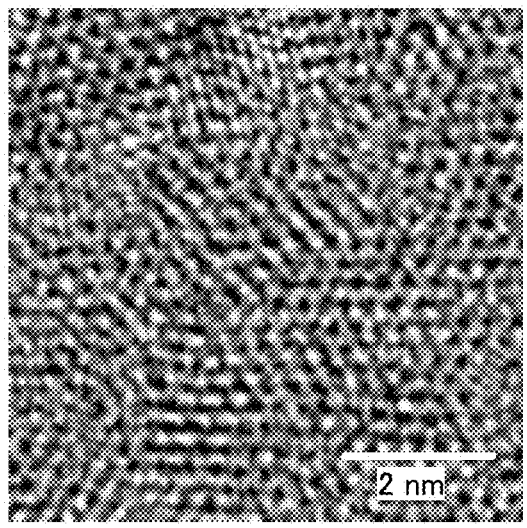
Figure 32D:
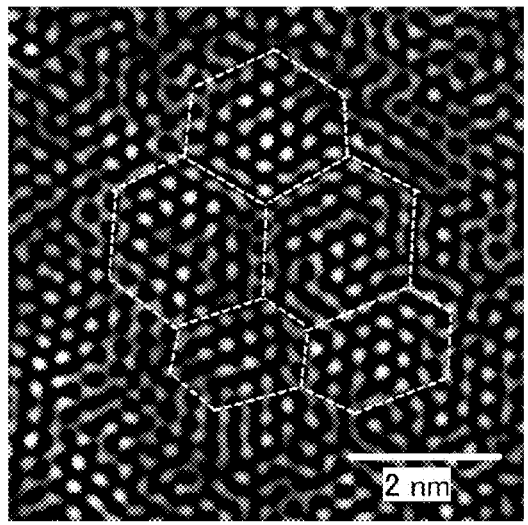
Figure 32E:
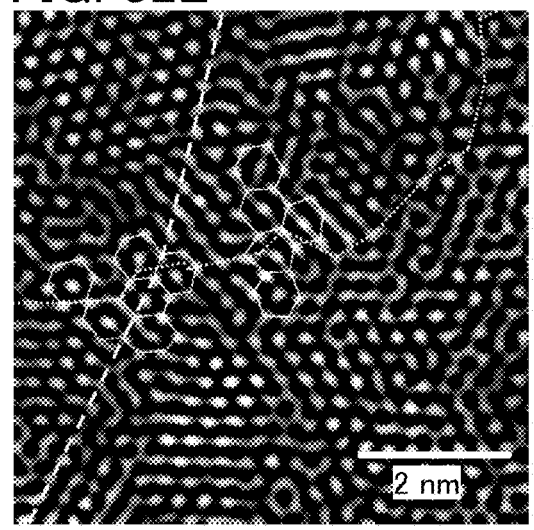

FIGS. 32B and 32C show Cs-corrected high-resolution TEM images of a plane of the CAAC-OS observed from a direction substantially perpendicular to the sample surface. FIGS. 32D and 32E are images obtained through image processing of FIGS. 32B and 32C. The method of image processing is as follows. The images in FIGS. 32B and 32C are subjected to fast Fourier transform (FFT), so that FFT images are obtained. Then, mask processing is performed such that a range of from 2.8 $nm^{-1}$ to 5.0 $nm^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 32D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 32E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor film with a low carrier density (specifically, lower than $8 \times 10^{11}/cm^3$, preferably lower than $1 \times 10^{11}/cm^3$, and further preferably lower than $1 \times 10^{10}/cm^3$ and higher than or equal $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 33A:
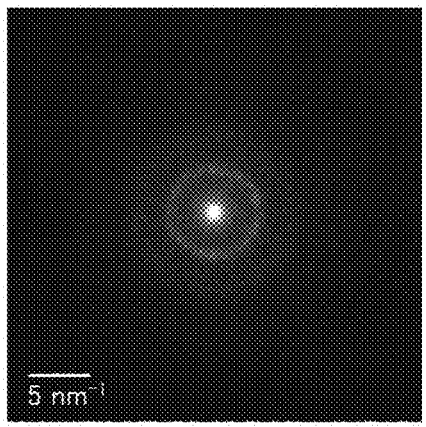
FIGS. 33A to 33D show electron diffraction patterns and a cross-sectional TEM image of an nc-OS.
Figure 33B:
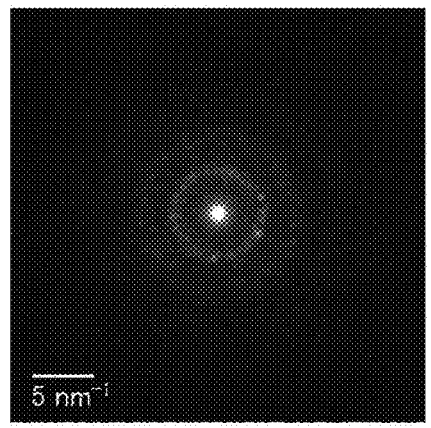

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 33A is observed. FIG. 33B shows a diffraction pattern obtained when an electron beam with a probe diameter of 1 nm is incident on the same sample. As shown in FIG. 33B, a plurality of spots are observed in a ring-like region. In other words, ordering in an nc-OS is not observed with an electron beam with a probe diameter of 50 nm but is observed with an electron beam with a probe diameter of 1 nm.

Figure 33C:
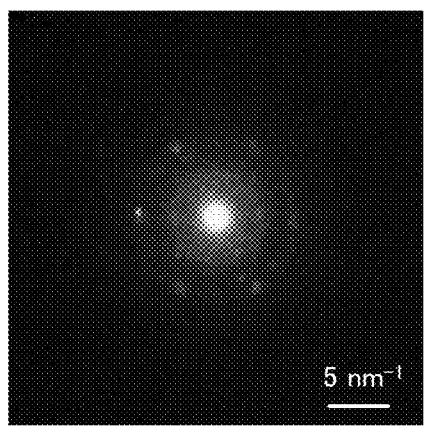

Furthermore, an electron diffraction pattern in which spots are arranged in an approximately regular hexagonal shape is observed in some cases as shown in FIG. 33C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 33D:
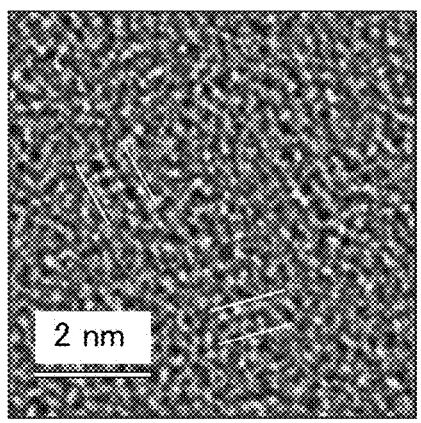

FIG. 33D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 33D, and a region in which a crystal part is not clearly observed. In most cases, the size of a crystal part included in the nc-OS is greater than or equal 1 nm and less than or equal 10 nm, or specifically, greater than or equal 1 nm and less than or equal 3 nm. Note that an oxide semiconductor including a crystal part whose size is greater than 10 nm and less than or equal 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal 1 nm and less than or equal 10 nm, in particular, a region with a size greater than or equal 1 nm and less than or equal 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 34A:
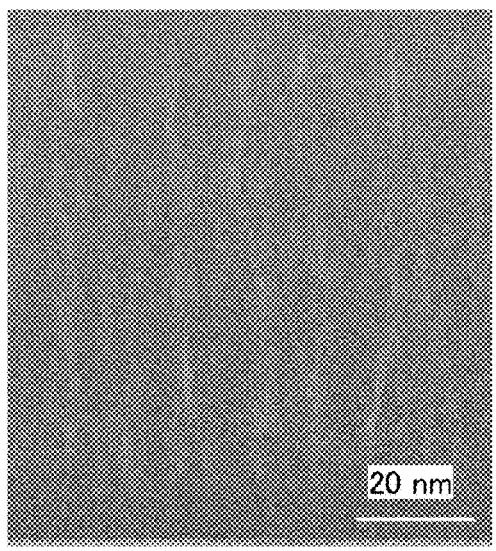
FIGS. 34A and 34B show cross-sectional TEM images of an a-like OS.
Figure 34B:
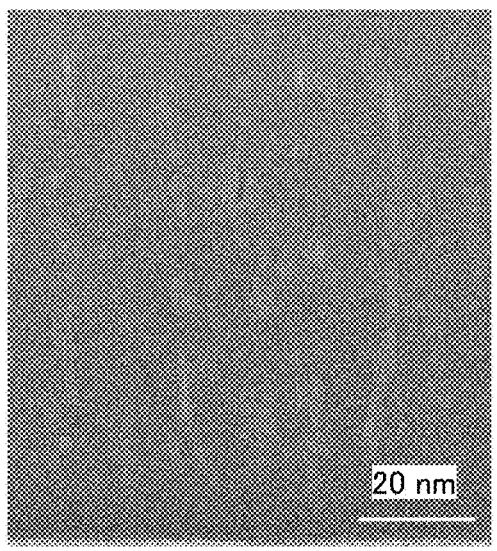

FIGS. 34A and 34B are high-resolution cross-sectional TEM images of an a-like OS. FIG. 34A is the high-resolution cross-sectional TEM image of the a-like OS at the start of the electron irradiation. FIG. 34B is the high-resolution cross-sectional TEM image of a-like OS after the electron (e) irradiation at $4.3 \times 10^8$ $e^-/nm^2$. FIGS. 34A and 34B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In-O layers and six Ga—Zn-O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal 0.28 nm and less than or equal 0.30 nm is regarded as a crystal part of $InGaZnO_4$ in the following description. Each of lattice fringes corresponds to the a-b plane of the $InGaZnO_4$ crystal.

Figure 35:
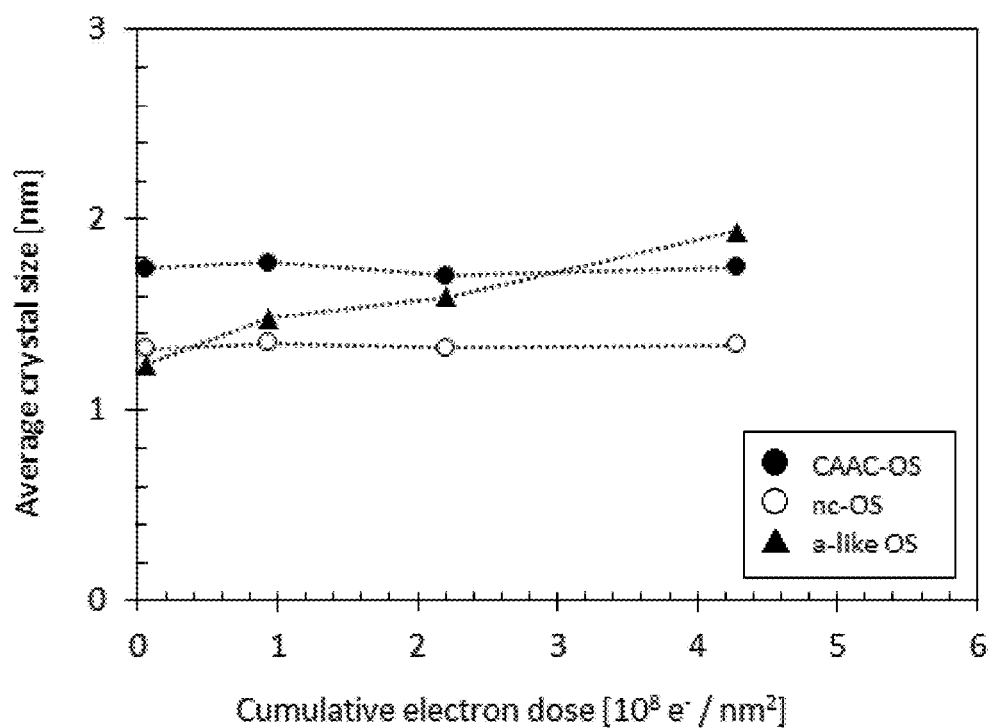
FIG. 35 shows a change in crystal part of an In—Ga—Zn oxide induced by electron irradiation.

FIG. 35 shows a change in the average size of crystal parts (at 22 points to 30 points) in each sample. Note that the crystal part size corresponds to the length of a lattice fringe. FIG. 35 indicates that the crystal part size in the a-like OS increases with an increase in the cumulative electron dose in obtaining TEM images, for example. As shown in FIG. 35, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 35, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

This embodiment can be combined with any of the other embodiments as appropriate.

Embodiment 7

In this embodiment, methods of forming the insulating layers, the conductive layers, the semiconductor layers, and the like included in the semiconductor device 10 described in the above embodiment will be described.

A sputtering method and a plasma CVD method are typical examples of a method of forming an insulating layer, a conductive layer, a semiconductor layer, and the like included in a semiconductor device. These layers can be formed by another method, for example, a thermal CVD method. A metal organic chemical vapor deposition (MOCVD) method or an atomic layer deposition (ALD) method can be employed as a thermal CVD method, for example.

A thermal CVD method has an advantage that no defect due to plasma damage is generated since it does not utilize plasma for forming a film. Deposition by a thermal CVD method may be performed in the following manner: the pressure in a chamber is set to an atmospheric pressure or a reduced pressure, and a source gas and an oxidizer are supplied to the chamber at the same time, react with each other in the vicinity of the substrate or over the substrate, and are deposited on the substrate.

Deposition by an ALD method may be performed in the following manner: the pressure in a chamber is set to an atmospheric pressure or a reduced pressure, source gases for reaction are sequentially introduced into the chamber, and then, the sequence of the gas introduction is repeated. For example, two or more kinds of source gases are sequentially supplied to the chamber by switching respective switching valves (also referred to as high-speed valves). In this case, a first source gas is introduced, an inert gas (e.g., argon or nitrogen) or the like is introduced at the same time as the first source gas or after the first source gas is introduced so that the source gases are not mixed, and then, a second source gas is introduced. In the case where the first source gas and the inert gas are introduced at the same time, the inert gas serves as a carrier gas, and the inert gas may also be introduced at the same time as the second source gas.

Alternatively, the first source gas may be exhausted by vacuum evacuation instead of the introduction of the inert gas, and then, the second source gas may be introduced. The first source gas is adsorbed on the surface of the substrate to form a first single-atomic layer; then, the second source gas is introduced to react with the first single-atomic layer; as a result, a second single-atomic layer is stacked over the first single-atomic layer, so that a thin film is formed. The sequence of the gas introduction is repeated a plurality of times until a desired thickness is obtained, so that a thin film with excellent step coverage can be formed. The thickness of the thin film can be adjusted by the number of times the sequence of the gas introduction is repeated; therefore, an ALD method makes it possible to accurately adjust thickness and thus is suitable for manufacturing a minute FET.

The conductive films and the semiconductor films which are described in the above embodiments can be formed by a thermal CVD method such as an MOCVD method or an ALD method. For example, in the case where an $InGaZnO_X$ (X>0) film is formed, trimethylindium, trimethylgallium, and dimethylzinc can be used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium, and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced a plurality of times to form an initial tungsten film, and then, a $WF_6$ gas and an $H_2$ gas are used to form a tungsten film. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced a plurality of times to form an $InO_2$ layer, a $Ga(CH_3)_3$ gas and an $O_3$ gas are used to form a GaO layer, and then, a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Although an $H_2O$ gas which is obtained by bubbling water with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments as appropriate.

Embodiment 8

In this embodiment, application examples of the semiconductor device or memory device described in the foregoing embodiment to an electronic component and to an electronic device including the electronic component will be described with reference to FIGS. 28A and 28B and FIGS. 29A to 29F.

<Electronic Component>

Figure 28A:
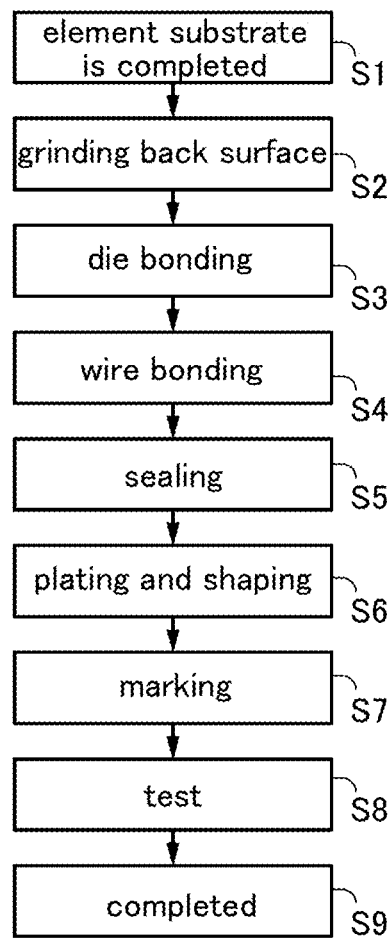
FIG. 28A is a flow chart illustrating an electronic component.

FIG. 28A shows an example where the semiconductor device described in the foregoing embodiment is used to make an electronic component. Note that an electronic component is also referred to as semiconductor package or IC package. This electronic component has various standards and names depending on the direction and the shape of terminals. Therefore, an example of the electronic component will be described in this embodiment.

A semiconductor device including the transistors in the foregoing embodiment is completed by integrating detachable components on a printed circuit board through an assembly process (post-process).

The post-process can be completed through steps shown in FIG. 28A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, the chip may be mounted on and bonded to an interposer.

Note that in this embodiment, when an element is formed on one surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. For wire bonding, ball bonding or wedge bonding can be employed.

A molding step is performed to seal the wire-bonded chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. After being plated, the lead of the lead frame is cut and processed into a predetermined shape (Step S6). The plating process prevents rust of the lead and facilitates soldering at the time of mounting on a printed circuit board in a later step.

Printing (marking) is performed on the package surface (Step S7). After a final testing step (Step S8), the electronic component is completed (Step S9).

Since the electronic component described above includes the semiconductor device of the foregoing embodiment, it is possible to improve the reliability of the electronic component.

Figure 28B:
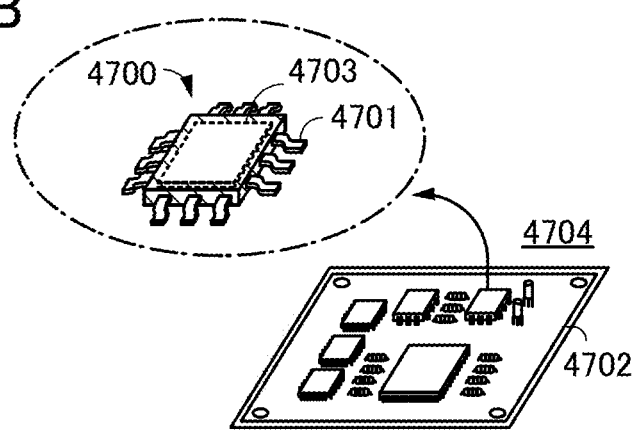
FIG. 28B is a perspective view of the electronic component.

FIG. 28B is a perspective schematic diagram of a completed electronic component. FIG. 28B shows a perspective schematic diagram of a quad flat package (QFP) as an example of the electronic component. An electronic component 4700 in FIG. 28B includes a lead 4701 and a circuit portion 4703. The electronic component 4700 in FIG. 28B is, for example, mounted on a printed circuit board 4702. A plurality of electronic components 4700 which are combined and electrically connected to each other over the printed circuit board 4702 can be mounted on an electronic device. A completed circuit board 4704 is provided in an electronic device or the like.

<Electronic Device>

Described next are electronic devices including the aforementioned electronic component.

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 29A to 29F illustrate specific examples of these electronic devices.

Figure 29A:
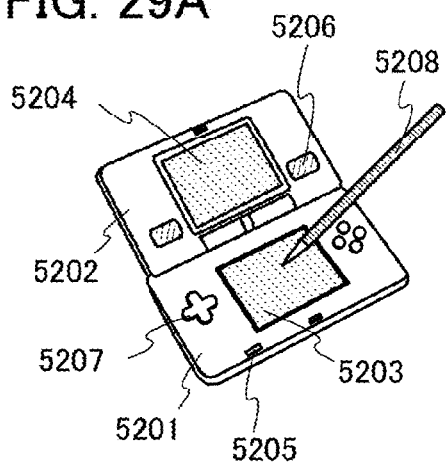
FIGS. 29A to 29F illustrate configuration examples of an electronic device.

FIG. 29A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 29A has the two display portions 5203 and 5204, the number of display portions included in a portable game machine is not limited to this.

Figure 29B:
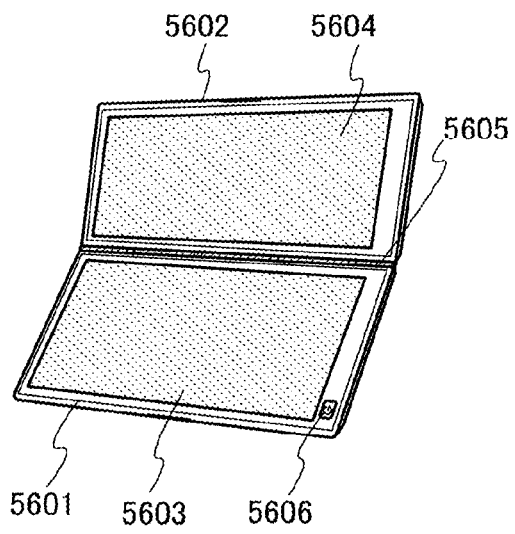

FIG. 29B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 29C:
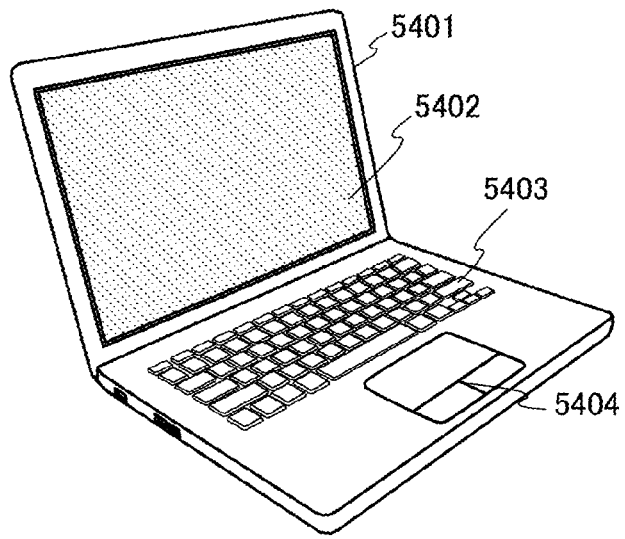

FIG. 29C illustrates a notebook type personal computer, which includes a housing 5401, a display portion 5402, a keyboard 5403, a pointing device 5404, and the like. The semiconductor device of one embodiment of the present invention can be used for a variety of integrated circuits included in notebook type personal computers.

Figure 29D:
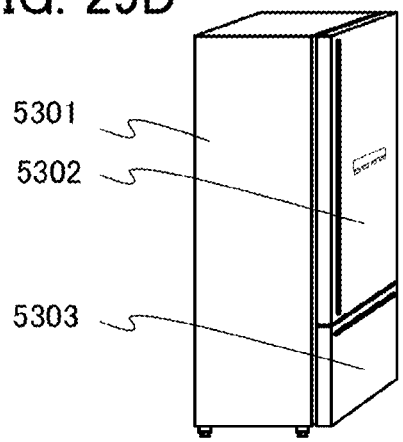

FIG. 29D illustrates an electric refrigerator-freezer, which includes a housing 5301, a refrigerator door 5302, a freezer door 5303, and the like. The semiconductor device of one embodiment of the present invention can be used for a variety of integrated circuits included in electric refrigerator-freezers.

Figure 29E:
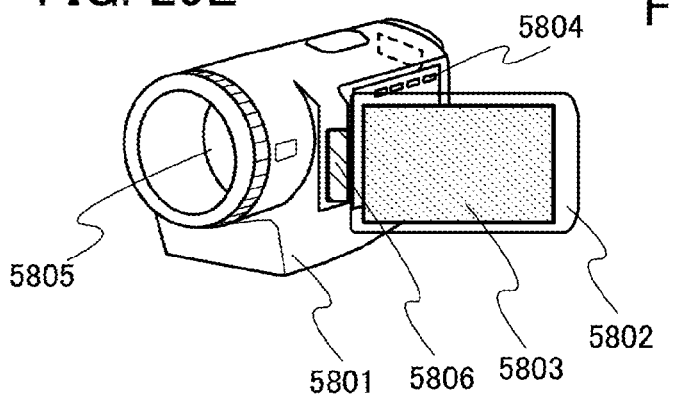

FIG. 29E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 29F:
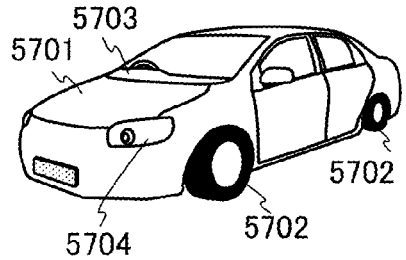
Figure 30A:
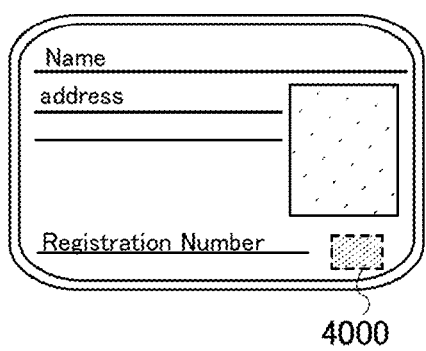
FIGS. 30A to 30F illustrate application examples of an RF tag.
Figure 30B:
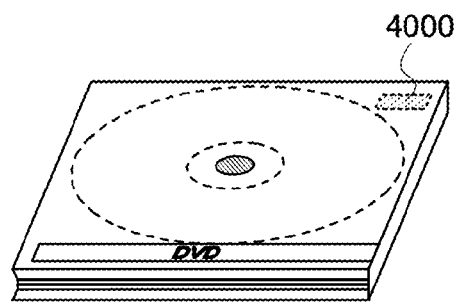
Figure 30C:
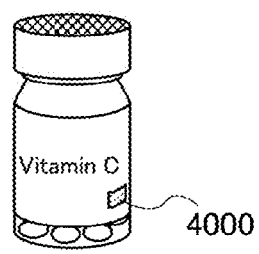
Figure 30D:
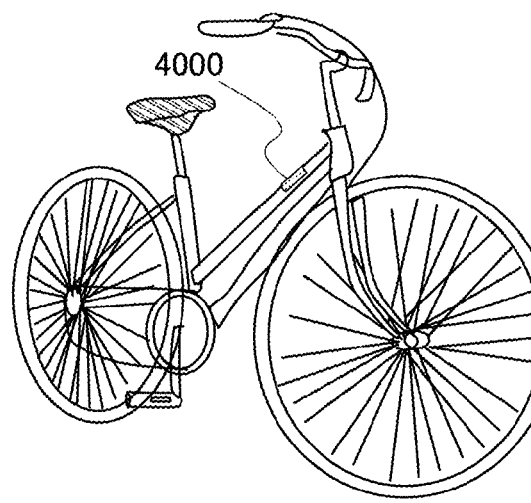
Figure 30E:
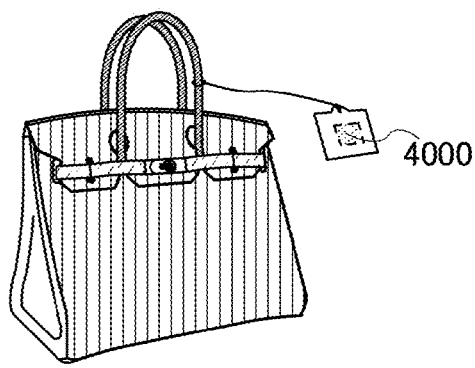
Figure 30F:
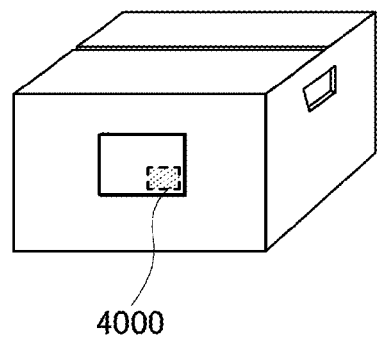

FIG. 29F illustrates a passenger car, which includes a car body 5701, wheels 5702, a dashboard 5703, lights 5704, and the like. The semiconductor device of one embodiment of the present invention can be used for a variety of integrated circuits included in passenger cars.

This embodiment can be combined with any of the other embodiments as appropriate.

Embodiment 9

In this embodiment, application examples of an RF tag which can include the semiconductor device or memory device of one embodiment of the present invention will be described with reference to FIGS. 30A to 30F. The RF tag is widely used and can be provided for, for example, products such as bills, coins, securities, bearer bonds, documents (e.g., driver's licenses or resident cards, see FIG. 30A), recording media (e.g., DVDs or video tapes, see FIG. 30B), packaging containers (e.g., wrapping paper or bottles, see FIG. 30C), vehicles (e.g., bicycles, see FIG. 30D), personal belongings (e.g., bags or glasses), foods, plants, animals, human bodies, clothes, household goods, medical supplies such as medicine and chemicals, and electronic devices (e.g., liquid crystal display devices, EL display devices, television devices, or cellular phones), or tags on products (see FIGS. 30E and 30F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined with any of the other embodiments as appropriate.

This application is based on Japanese Patent Application serial no. 2015-225814 filed with Japan Patent Office on Nov. 18, 2015, the entire contents of which are hereby incorporated by reference.

What is claimed is:

1. A semiconductor device comprising:
   a memory cell;
   a first circuit;
   a second circuit; and
   a wiring,
   wherein the memory cell is configured to store first data,
   wherein the memory cell is configured to supply a first current corresponding to the first data to the wiring,
   wherein the first circuit is configured to supply a second current corresponding to second data to the wiring input from an outside,
   wherein the second circuit is configured to perform correction of a current flowing in the wiring when a value of the first current and a value of the second current are different from each other, and
   wherein the second circuit is configured to generate a signal including information on whether the correction is performed or not.

2. The semiconductor device according to claim 1,
   wherein the correction of the current is performed by generation of a third current supplied from the second circuit to the wiring or a fourth current supplied from the wiring to the second circuit, and
   wherein each of the third current and the fourth current is a current corresponding to a difference between the first current and the second current.

3. The semiconductor device according to claim 1,
   wherein the semiconductor device is configured to write the second data to the memory cell by supply of the second current to the memory cell.

4. The semiconductor device according to claim 1,
   wherein the memory cell includes a first transistor, a second transistor, a third transistor, and a capacitor,
   wherein a gate of the first transistor is electrically connected to a first electrode of the capacitor and one of a source and a drain of the second transistor, and
   wherein one of a source and a drain of the first transistor is electrically connected to a second electrode of the capacitor and one of a source and a drain of the third transistor.

5. The semiconductor device according to claim 4,
   wherein the second transistor comprises an oxide semiconductor in a channel formation region.

6. A computer comprising:
   a cache memory comprising the semiconductor device according to claim 1 and;
   a control circuit,
   wherein the cache memory comprises a memory region including a plurality of memory cells,
   wherein the memory region is configured to store tag data,
   wherein the control circuit is configured to output an address signal to the cache memory,
   wherein the tag data corresponds to a collection of the first data stored in the memory region, and
   wherein the address signal corresponds to a collection of the second data.

7. An electronic device comprising the semiconductor device according to claim 1.

8. An electronic device comprising the computer according to claim 6.

* * * * *